(12) United States Patent
King, III et al.

(10) Patent No.: US 11,049,703 B2
(45) Date of Patent: Jun. 29, 2021

(54) METHODS OF EVALUATING PERFORMANCE OF AN ATMOSPHERIC PRESSURE IONIZATION SYSTEM

(71) Applicant: PHARMACADENCE ANALYTICAL SERVICES, LLC, Hatfield, PA (US)

(72) Inventors: Richard C. King, III, Quakertown, PA (US); William J. Metzler, IV, Doylestown, PA (US)

(73) Assignee: PharmaCadence Analytical Services, LLC, Hatfield, PA (US)

( * ) Notice: Subject to any disclaimer, the term of this patent is extended or adjusted under 35 U.S.C. 154(b) by 35 days.

(21) Appl. No.: 15/753,621

(22) PCT Filed: Aug. 19, 2016

(86) PCT No.: PCT/US2016/047749
§ 371 (c)(1),
(2) Date: Feb. 20, 2018

(87) PCT Pub. No.: WO2017/034972
PCT Pub. Date: Mar. 2, 2017

(65) Prior Publication Data
US 2019/0237314 A1     Aug. 1, 2019

Related U.S. Application Data

(60) Provisional application No. 62/208,119, filed on Aug. 21, 2015, provisional application No. 62/255,105, (Continued)

(51) Int. Cl.
*H01J 49/00*     (2006.01)
*G01N 27/622*     (2021.01)
(Continued)

(52) U.S. Cl.
CPC ........ *H01J 49/0009* (2013.01); *G01N 27/622* (2013.01); *H01J 49/027* (2013.01);
(Continued)

(58) Field of Classification Search
CPC ........ H01J 49/00; H01J 49/02; H01J 49/0009; H01J 49/0027; H01J 49/0031; H01J 49/0036; H01J 49/0025; H01J 49/10
(Continued)

(56) References Cited

U.S. PATENT DOCUMENTS 4,769,540 A    9/1988   Mitsui et al.
5,381,008 A *   1/1995   Tanner .................. H01J 49/044
                                              250/282

(Continued)

OTHER PUBLICATIONS

Tang et al. New MAtrices and Accelerating Voltage Effects in Matrix-Assisted Laser Desorption/Ionization of Synthetic Polymers, 1995, Rapid Communications in Mass Spectrometry, vol. 9, pp. 1141-1147. (Year: 1995).*

(Continued)

*Primary Examiner* — Jason L McCormack
(74) *Attorney, Agent, or Firm* — Saul Ewing Arnstein & Lehr LLP; Domingos J. Silva; Paul A. Leicht

(57) ABSTRACT

The present invention comprises novel methods of continuously monitoring the performance of an atmospheric pressure ionization (API) system. The methods of the invention allow for improved quality monitoring of the processes that leads to the formation of ions at atmospheric pressure. The methods of the invention further allow for continuously monitoring for the quality of the ion formation process in API without the addition of extraneous material (such as labelled compounds or control known compounds) to the system being monitored.

9 Claims, 49 Drawing Sheets

Related U.S. Application Data filed on Nov. 13, 2015, provisional application No. 62/293,634, filed on Feb. 10, 2016.

(51) Int. Cl.
*H01J 49/02* (2006.01)
*H01J 49/16* (2006.01)
*H01J 49/30* (2006.01)
*G01R 19/00* (2006.01)
*H01J 49/10* (2006.01)

(52) U.S. Cl.
CPC .......... *H01J 49/165* (2013.01); *H01J 49/168* (2013.01); *H01J 49/30* (2013.01); *G01R 19/0061* (2013.01); *H01J 49/10* (2013.01)

(58) Field of Classification Search
USPC ........................................ 250/281, 282, 288
See application file for complete search history.

(56) References Cited

U.S. PATENT DOCUMENTS

| | | | |
|---|---|---|---|
| 5,432,343 A | 7/1995 | Gulcicek et al. | |
| 5,468,452 A | 11/1995 | Hagiwara et al. | |
| 5,886,345 A | 3/1999 | Koster et al. | |
| 6,639,214 B1 | 10/2003 | Ketkar et al. | |
| 2004/0046118 A1 | 3/2004 | Apffel, Jr. et al. | |
| 2004/0063113 A1* | 4/2004 | Agnes | H01J 49/04 435/6.12 |
| 2005/0029442 A1* | 2/2005 | Takats | H01J 49/167 250/281 |
| 2007/0158546 A1 | 7/2007 | Lock et al. | |
| 2008/0169417 A1 | 7/2008 | Cohn et al. | |
| 2008/0277578 A1* | 11/2008 | Ferrari | B01D 15/08 250/288 |
| 2009/0095899 A1 | 4/2009 | Wh Itehouse et al. | |
| 2009/0283674 A1* | 11/2009 | Pesch | H01J 49/062 250/288 |
| 2011/0101215 A1 | 5/2011 | Hirabayashi et al. | |
| 2011/0174964 A1* | 7/2011 | Brunelli | G01N 27/624 250/282 |
| 2011/0272571 A1 | 11/2011 | Kenttämaa et al. | |
| 2012/0056085 A1 | 3/2012 | Giles et al. | |
| 2014/0306106 A1 | 10/2014 | Olney et al. | |
| 2014/0319338 A1* | 10/2014 | Thomson | H01J 49/044 250/288 |
| 2015/0332907 A1* | 11/2015 | Valaskovic | H01J 49/0431 250/282 |
| 2016/0211125 A1* | 7/2016 | Knochenmuss | H01J 49/0009 |

OTHER PUBLICATIONS

PCT International Search Report & Written Opinion for corresponding International Patent Application PCT/US2016/047749 dated Dec. 30, 2016.

* cited by examiner

Fig. 31

Selected neutrals, salts, and contaminant ions

| Neutrals | | Positive | | Negative | |
|---|---|---|---|---|---|
| ACN | 41.05 | $Na^+$ | 22.989 | $CHO_2^-$ | 45 |
| MeOH | 32.04 | $K^+$ | 39.0 | $Cl^-$ | 35.45 |
| $H_2O$ | 18.01 | $H_4PO_4^+$ | 98.99 | $CH_3CO_2^-$ | 59.04 |
| EtOH | 46.07 | $C_6H_5^+$ | 77.10 | $NO_2^-$ | 46 |
| | | | | $OH^-$ | 17.01 |

Selected clusters and their possible identities

| M/Z | Polarity | Organic Solvent | Identity |
|---|---|---|---|
| 89.8 | Negative | ACN/MeOH | $ACN+MeOH+OH^-$ |
| 91.2 | Negative | ACN/MeOH | $CH_3CO_2^-+MeOH$ or $2EtOH-H^+$ or $Cl^-+K^++OH^-$ |
| 81.9 | Negative | MeOH | $NO_2^-+2H_2O$ |
| 107.3 | Negative | ACN | $4H_2O+Cl^-$ or $5H_2O+OH^-$ |
| 298.6 | Negative | ACN | $6ACN+2H_2O+OH^-$ |
| 117.2 | Positive | MeOH | $H_4PO_4^++H_2O$ |
| 214.2 | Positive | MeOH | $C_6H_5^++2MeOH$ |
| 83.1 | Positive | ACN | $2ACN+H^+$ |
| 102.1 | Positive | ACN | $H_2O+84.1$ |

METHODS OF EVALUATING PERFORMANCE OF AN ATMOSPHERIC PRESSURE IONIZATION SYSTEM

CROSS-REFERENCE TO RELATED APPLICATIONS

The present application is a 35 U.S.C. § 371 national phase application of, and claims priority to, International Application No. PCT/US2016/047749, filed Aug. 19, 2016, which claims priority under 35 U.S.C. § 119(e) to U.S. Provisional Application No. 62/208,119, filed Aug. 21, 2015, U.S. Provisional Application No. 62/255,105, filed Nov. 13, 2015, and U.S. Provisional Application No. 62/293,634, filed Feb. 10, 2016, all of which applications are hereby incorporated herein by reference in their entireties.

BACKGROUND OF THE INVENTION

Mass spectrometry (MS) is widely used in analyses of inorganic, organic and biological samples. The use of liquid chromatography-tandem mass spectrometry (LC-MS/MS) has now become the standard technique throughout the pharmaceutical industry for qualitative and quantitative analysis of drug compounds and related materials. LC-MS/MS combines selectivity and sensitivity, and can be used in quantitative analytical protocols. Routine analysis of samples from studies relating to safety, efficacy, and pharmacokinetic and pharmacodynamic properties of new drugs can be performed using atmospheric pressure ionization (API) LC-MS/MS sample analysis. However, the widespread use of API LC-MS/MS in quantitative analysis is hampered by experimental problems that remain unaddressed.

One such experimental problem is ion suppression or ion enhancement, which is observed in electrospray ionization (ESI), atmospheric pressure chemical ionization (APCI), and other ambient ionization techniques. Such ion suppression or ion enhancement, which is often referred to as "matrix effect," is caused by a number of conditions including the presence of high concentrations of non-volatile compounds (including, for example, salts, ion-pairing agents, endogenous compounds, and co-eluting compounds) that are present in samples being evaluated by mass spectrometry. The matrix effect causes changes in the efficiency of droplet formation or evaporation during the ionization process, and ultimately results in an altered amount of charged analytes that reach the detector of the mass spectrometer. In an attempt to correct for matrix effects, stable isotope labeled internal standards that co-elute with the analyte of interest may be added to the sample, thus compensating for any ion suppression or enhancement.

Another method that might be used to account for matrix effects is the standard addition method (SAM). The SAM method works by measuring the analyte of interest in a sample with, and without, spiking of known amounts of the analyte. Using this method, a standard curve, which can be extrapolated to determine the original analyte concentration, is generated. Despite SAM's widespread use for targeted measurements of specific compounds, it cannot be easily applied to proteomics or high-throughput experiments because investigators often lack a priori knowledge of what they wish to measure, purchasing standards for all the peptides of interest is prohibitively expensive, sample volumes are not sufficient, or the requirement of doing multiple measurements using the SAM is too costly. Yet another method that might be used to evaluate matrix effects is post-column infusion of standards. In this procedure, a single standard is continuously added to the effluent of an LC column immediately prior to the MS ionization source. This technique permits the assessment of analyte signal suppression or enhancement by different co-eluting matrix components during an entire chromatographic separation. However, post-column infusion has the drawback of requiring additional pumps or gradient formers and potential contamination of the LC-MS, producing an artificial interference in highly sensitive quantitative analysis.

There are currently no methods for evaluating matrix effects in every sample analyzed and/or for continuous monitoring of the performance of API sources. Without the addition of a tracer compound that may interfere with the analysis, it is not possible to detect changes in the ability of the spray to generate ions at a consistent abundance for each sample run.

There is thus a need in the art to develop novel methods of continuously assessing or evaluating performance of an atmospheric pressure ionization system. In certain embodiments, such methods should be time- and cost-effective and require no addition of chemical components. The present invention addresses this need.

SUMMARY OF THE INVENTION

In one aspect, the present invention provides novel methods of evaluating the matrix effect in samples analyzed and/or continuously assessing the performance of an atmospheric pressure ionization (API) system. In certain embodiments, the API system comprises electrospray ionization (ESI), atmospheric pressure chemical ionization (APCI) and/or atmospheric pressure photoionization ionization (APPI).

In another aspect, the invention provides a method of evaluating performance of an API system. In certain embodiments, the method comprises monitoring the ion current for a charged species related to an ion-molecule cluster ion formed in the API system.

In certain embodiments, the charged species comprises the cluster ion, a fragment thereof, or an aggregate comprising the cluster ion. In other embodiments, the nature of the cluster ion is changed by varying at least one parameter selected from the group consisting of ionization electrical potential of the API system, electric field strength of the API system, pressure in the API system, gas and vapor in the API system, and solvent presented to the API system. In yet other embodiments, the monitoring comprises measuring the ion current using at least one selected from the group consisting of an ion mobility spectrometer, a mass spectrometer, and a charged aerosol detector. In yet other embodiments, the ion mobility spectrometer comprises at least one selected from the group consisting of a differential ion mobility spectrometer, a high field asymmetric ion mobility spectrometer, and a conventional ion mobility spectrometer. In yet other embodiments, the ion source for the mass spectrometer comprises at least one selected from the group consisting of an electrospray ionization mass spectrometer ion source, atmospheric pressure chemical ionization mass spectrometer ion source, and an atmospheric pressure photoionization ionization mass spectrometer ion source. In yet other embodiments, the API system is the vaporizing unit of at least one selected from the group consisting of a liquid chromatography mass spectrometer-mass spectrometer (LC-MS/MS) system, a single stage MS LC-MS, and a capillary electrophoresis apparatus.

In certain embodiments, a reference ion current value for the charged species related to the cluster ion is determined under conditions wherein no matrix effect is observed. In other embodiments, if the measured ion current deviates more than about 5% from the reference ion current value, the operating parameters of the API system are changed, such that the ion current for the charged species related to the cluster ion is within about 5% of the reference ion current value. In yet other embodiments, if the measured ion current deviates more than about 1% from the reference ion current value, the operating parameters of the API system are changed, such that the ion current for the charged species related to the cluster ion is within about 1% of the reference ion current value.

In yet another aspect, the invention provides a method of analyzing a sample comprising an analyte using API mass spectrometry, wherein the ion current reading by the mass spectrometer is continuously monitored for matrix effects. In certain embodiments, the method comprises any or more of the steps of vaporizing the sample using the API system, measuring the ion current for a charged species related to the analyte using the mass spectrometer, and continuously measuring the ion current for a charged species related to an ion-molecule cluster ion formed in the API system using the mass spectrometer.

In certain embodiments, the mass spectrometer is set up such that the monitoring of the ion current for the charged species related to the cluster ion is alternated with the monitoring of the ion current for the charged species related to the analyte. In other embodiments, the mass spectrometer is set up such that the monitoring of the ion current for the charged species related to the cluster ion is run at preselected intervals during the analysis of the sample. In yet other embodiments, a reference ion current value for the charged species related to the cluster ion is determined under conditions wherein no matrix effect is observed. In yet other embodiments, if the measured ion current for the charged species related to cluster ion deviates more than about 5% from the reference ion current value, the operating parameters of the API system are manipulated such that the ion current for the species related to the cluster ion is within 5% of the reference ion current value. In yet other embodiments, if the measured ion current for the charged species related to cluster ion deviates more than about 1% from the reference ion current value, the operating parameters of the API system are manipulated such that the ion current for the species related to the cluster ion is within 1% of the reference ion current value. In yet other embodiments, the sample is not pre-treated with a labeled derivative of the analyte or a known amount of the analyte before the analysis takes place.

In yet another aspect, the invention provides an apparatus that allows for continuously evaluating performance of an API system. In certain embodiments, the apparatus comprises (i) a charge or current detection device, and (ii) a means of at least partially separating at least one solvent cluster ion from at least one selected from the group consisting of pseudomolecular and molecular ions, uncharged gas, vapor, liquid and solid material.

In yet another aspect, the invention provides a computer implemented method for discretely or continuously evaluating performance of an API system. In certain embodiments, the method comprises at least one of the following: (a) comparing the abundance as predicted by a control measurement or modeling experiment, and the abundance as indicated by an instrument readout, for at least one cluster ion generated during operation of the API system; and (b) comparing the presence or absence as predicted by a control measurement or modeling experiment, and the presence or absence as indicated by an instrument readout for at least one cluster ion species that may be generated during operation of the API system.

In certain embodiments, the operation of the API system comprises quantitative or qualitative analysis. In other embodiments, the abundance of the at least one cluster ion in (a), and/or the presence or absence of at least one cluster ion in (b), indicates that the performance of the API system is within the desired operational levels. In yet other embodiments, the abundance of the at least one cluster ion in (a), and/or the presence or absence of at least one cluster ion in (b), indicates that the performance of the API system is not within the desired operational levels. In certain embodiments, the method further comprises changing one or more operating parameters of the API system to bring the performance of the API system within the desired operational levels.

In yet another aspect, the invention further provides a computer implemented method for discretely or continuously evaluating an API dependent process for matrix effects. In certain embodiments, the method comprises at least one of the following: (a) comparing the abundance as predicted by a control measurement or modeling experiment, and the abundance as indicated by an instrument readout, for at least one cluster ion generated during operation of the API system; (b) comparing the presence or absence as predicted by a control measurement or modeling experiment, and the presence or absence as indicated by an instrument readout, for at least one cluster ion species that can be generated during operation of the API system; (c) comparing the abundance, presence and/or absence of cluster ion patterns comprised of time, m/z, intensity, ion mobility, charge state, or any subset thereof, as predicted by a control measurement or modeling experiment, and the abundance, presence and/or absence of cluster ion patterns as indicated by an instrument readout.

In certain embodiments, the operation of the API system comprises quantitative or qualitative analysis. In other embodiments, the abundance of the at least one cluster ion in (a), and/or the presence or absence of at least one cluster ion in (b), indicates that matrix effects do not significantly affect the API dependent process. In yet other embodiments, the abundance of the at least one cluster ion in (a), and/or the presence or absence of at least one cluster ion in (b), indicates that matrix effects significantly affect the API dependent process. In certain embodiments, the method further comprises changing one or more operating parameters of the API system so that matrix effects do not significantly affect the API dependent process.

Other features and advantages of the invention will be apparent from the detailed description, and from the claims.

BRIEF DESCRIPTION OF THE DRAWINGS

The following detailed description of specific embodiments of the invention will be better understood when read in conjunction with the appended drawings. For the purpose of illustrating the invention, there are shown in the drawings specific embodiments. It should be understood, however, that the invention is not limited to the precise arrangements and instrumentalities of the embodiments shown in the drawings.

FIG. 25A illustrates an infusion chromatogram for a control water injection. FIG. 25B illustrates the infusion chromatogram from a 10 µl injection of 50 µM PBS. FIG. 25C illustrates the infusion chromatogram for a 10 µL injection of PEG 1000 at 5 µg/mL, and FIG. 25D illustrates an infusion chromatogram for a 10 µL injection of BSA at 10 µg/mL. In each of FIGS. 25A-25D, red traces (middle trace) are the SRM chromatograms for post-column infusion of 10 µg/mL acetaminophen, green traces (bottom trace) are the SRM chromatograms for post-column infusion of 10 µg/mL labetalol, and black traces (top trace) are for the cluster ion at m/z 83. Each chromatogram was generated by running a linear gradient from 5% to 95% acetonitrile containing 0.1% formic acid. All chromatograms were generated on a Supelco Discovery C8, 2.1×50 mm column at a flow rate of 500 µL/min. FIG. 25B shows the expected ionization suppression at 0.3 min caused by the unretained salts from the 50 µM PBS injection. In FIG. 25C, the suppression caused by the PEG oligomers was evident for the post-column infused drugs as well as the cluster ion at m/z 83 from 1.5 minutes to 3.5 minutes. The suppression profile caused by the elution of BSA is observed in panel d between 3.2 and 4 minutes. As with the other model ionization suppression agents, the cluster at m/z 83 shows a similar suppression profile to the post-column infused labetalol and acetaminophen.

FIG. 26A shows the expected ion suppression profile for a protein precipitation sample. There is a large area, centered at 0.3 min, of unretained material that causes loss of response and there are several later eluting suppression valleys from the elution of high concentrations of lipids (lysoPCs). FIG. 26B lacks any major areas of ionization suppression as is expected from an injection of 10 μL of an MtBE LLE plasma extract. The data demonstrate that cluster ion monitoring produces similar suppression profiles to the labetalol and acetaminophen post-column infusion chromatograms following injection of prepared plasma samples.

FIG. 27A represents a quality control sample (QC) and FIG. 27B represents a study subject at a single time-point. The samples were chosen from a large batch run of more than 300 samples. A suppression valley near the retention time of SIL-angiotensin I is present in the subject sample (FIG. 27B) but not present in the quality control sample (FIG. 27A). While SIL-angiotensin I is used as an internal standard and, in this case, corrects for changes in ionization efficiency, this example demonstrates the use of cluster ion signals to monitor ionization suppression throughout each chromatogram in a run.

FIG. 31 illustrates a set of tables assigning mass identity to cluster ions (including selected common neutral losses, positive charge nuclei, and negative charge nuclei and their mass-to-charge ratios).

FIG. 38A=faulty probe, no voltage applied to solvent. FIG. 38B=correctly functioning probe. With an probe that failed to apply a voltage (left) to the mobile phase not only was there low abundance of cluster ions (in some parts of the gradient with high aqueous content ions were not even formed) but also the analyte peak was significantly suppressed (approximately ten-fold) due to poor ionization. Replacing the probe with another having new gold contacts resolved the issue of applied voltage and generated the chromatogram at right.

FIG. 40A: PBS Injection (High Salt, No Protein). FIG. 40B: BSA Injection (High Salt, High Protein). Early eluting salts from PBS change the formation of offspring droplets decreasing the number of cluster ions formed. Abundant protein likely removes excess charge from the spray, and as a mon-volatile material may also change colligative properties of the sprayed solution leading to reduction in offspring droplet formation. Also note that in the BSA injection at right one can see the same suppression artifact created by early eluting salts from PBS showing a "superposition" of ionization suppression, indicating that spray suppression from a given compound is discrete and independent.

FIG. 41A: BSA Injection (High Salt, High Protein, Low Polymer). FIG. 41B: PEG 1000 Injection (Low Salt, No Protein, High Polymer). Under charge-limited conditions such as electrospray, the greater the amount of charge acceptors the fewer cluster ions formed due to the dearth of available free charge.

FIG. 42A, prepared by a methyl tert-butyl ether and water liquid-liquid extraction (dried down and then reconstituted in 50% methanol), is comparatively "cleaner" from an ionization perspective as shown in the lack of suppression valleys due to salts and proteins/peptides. FIG. 42B, prepared by protein precipitation via two volumes of acetonitrile, shows the characteristic suppression by salts at 0.6 minutes into the gradient and by what is likely lysoPCs near 3.0 minutes and 3.3 minutes of the gradient.

FIG. 45A is the XIC for two cluster ions (red and blue traces) and for tributylamine (green) of a typical sample injection. FIG. 45B is the same sample injected but with gaseous TBA introduced in the bath gas by way of placing a small boat with 20 μL of liquid TBA directly into the source so that enters the bath gas as it evaporates. As with TBA bleeding off a contaminated column, cluster intensity is decreased over one hundred-fold. By monitoring cluster ions one can easily see ionization effects of a gaseous contaminant.

FIG. 48A: Injection of 2 μg/mL acetaminophen. FIG. 48B: Injection of 200 μg/mL acetaminophen. M+2 isotope was followed to avoid MS detector saturation and reveal ionization suppression due to electrospray saturation. The blue trace in both is the M+2 isotope of acetaminophen to eliminate confounding effects from detector saturation. Note that in the 200 μg/mL injection there is a distinct, directly-related suppression "valley" of cluster ions at the retention time of the acetaminophen.

FIG. 49A illustrates the unadjusted curves, while FIG. 49B illustrates those same curves normalized by dividing each point in the curve by the total counts in the entire curve. These curves not only demonstrate the quantitative nature of cluster ion suppression but also indicate a direct, reproducible relationship between amount of analyte in the spray and suppression of cluster ions.

DETAILED DESCRIPTION OF THE INVENTION

Figure 1:
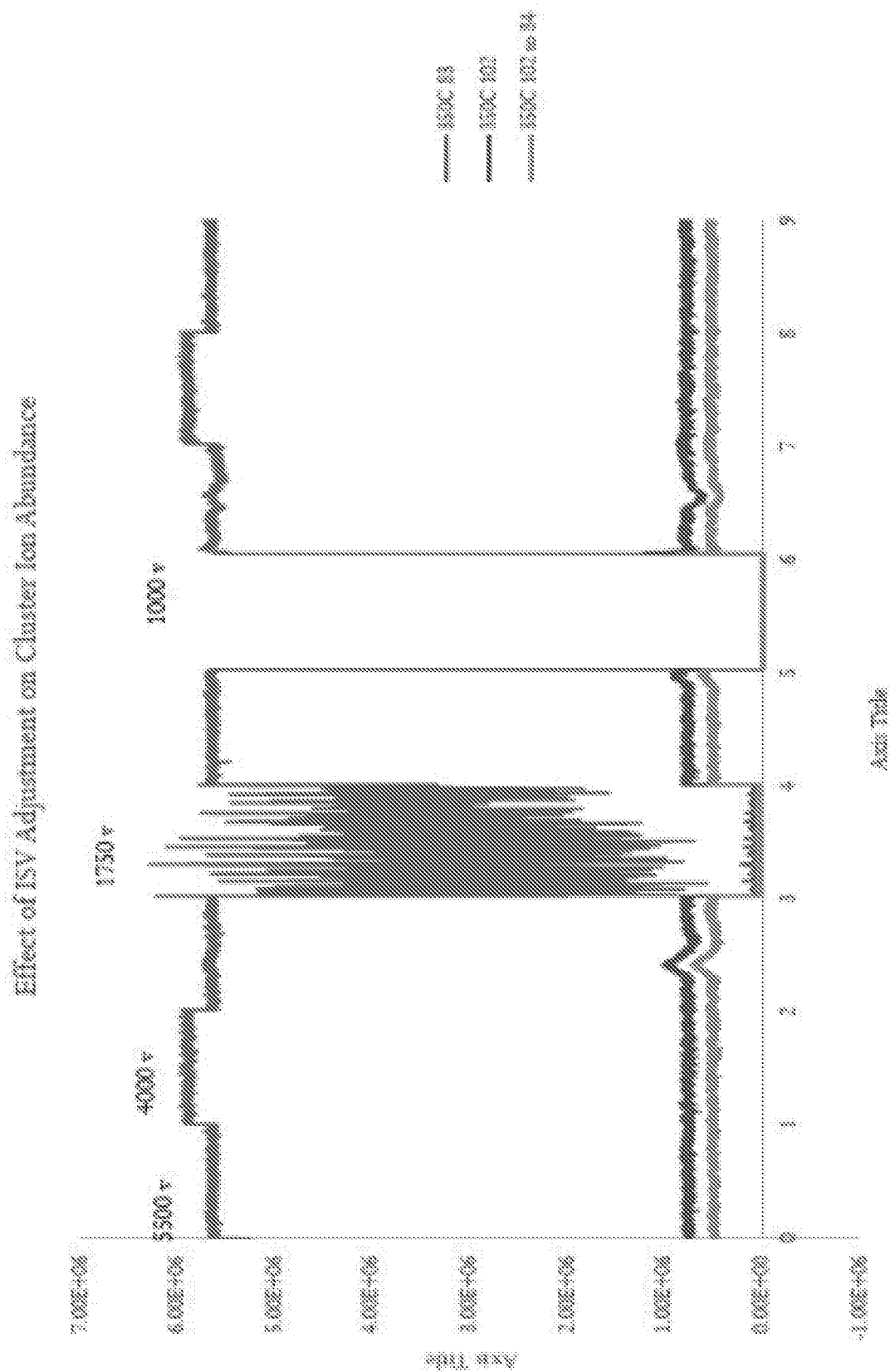
FIG. 1 is a graph illustrating the effect of spray voltage on cluster ion abundance.
Figure 2:
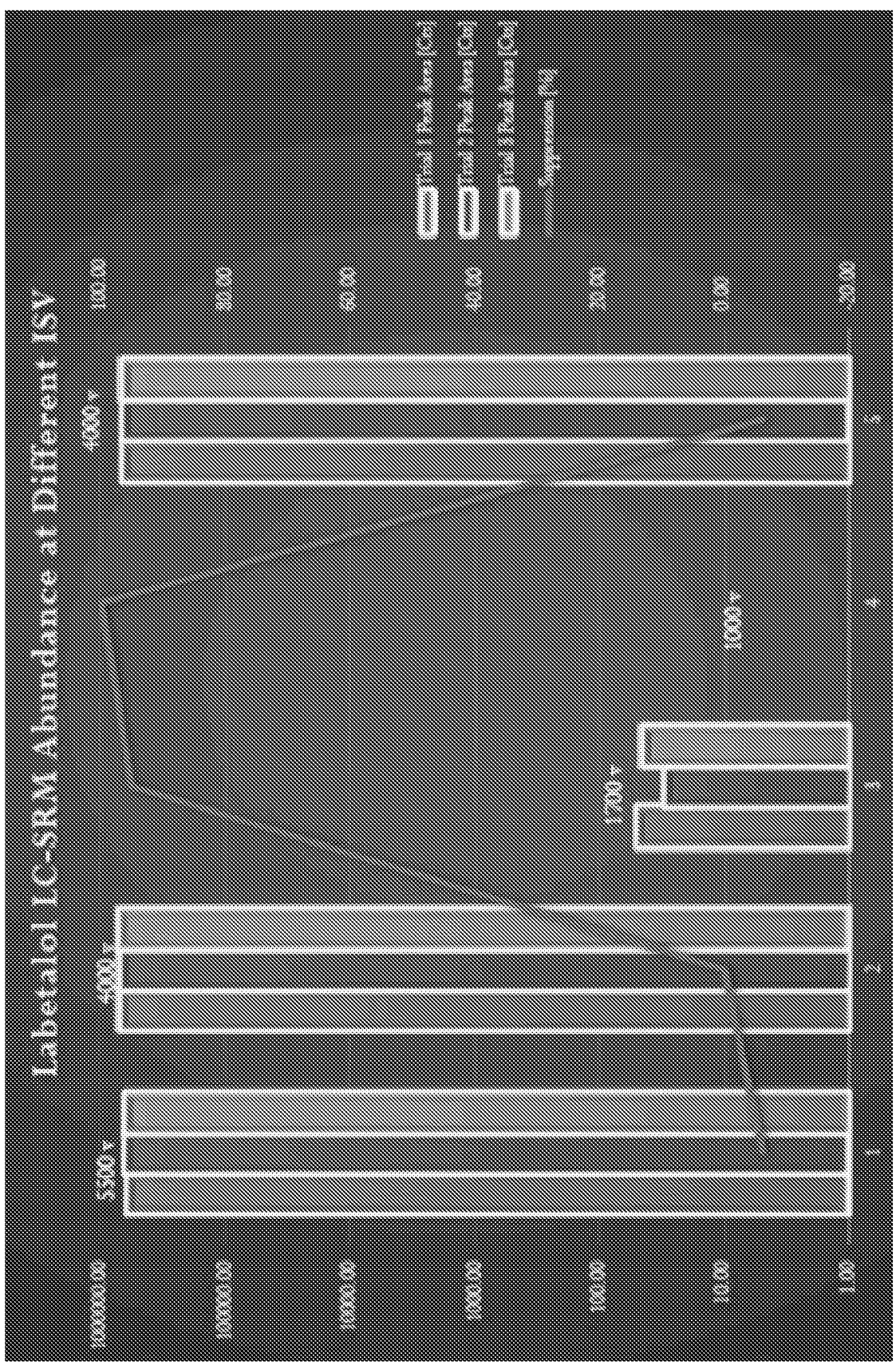
FIG. 2 is a bar graph illustrating the LC-SRM abundance of labetalol ((RS)-2-hydroxy-5-{1-hydroxy-2-[(4-phenylbutan-2-yl)amino]ethyl}benzamide) at various spray voltages.

The present invention relates in one aspect to the unexpected discovery of novel methods of continuously monitoring the performance of an atmospheric pressure ionization system. The methods of the invention thus allow for improved quality monitoring of the processes that leads to the formation of ions at atmospheric pressure. The methods of the invention further allow for continuous monitoring of the quality of the ion formation process in API without the addition of extraneous material (such as, for example, labelled compounds or control known compounds) to the system being monitored.

In certain embodiments, the methods of the invention detect a significant change in the ion forming ability/efficiency of an API system. In other embodiments, the methods of the invention detect ionization suppression or matrix effect during operation of an API system.

The response factor of an analyte for an instrument is the slope of the best fit line for a data set comprised of instrument response versus analyte concentration. The response factor is a critical value when instrumental analysis is being used to quantify the analyte, because it defines the relationship between the instrument response and analyte concentration/amount. Response factors are calculated by running instrumental measurements for samples of known concentrations. Once established, the response factors of an analyte for an instrument are used to back-calculate analyte concentration from a measured instrument response. Should the response factor change for any reason during analysis, the accuracy of the back-calculation of analyte concentration is affected.

When the matrix effect or ionization suppression takes place in a API system being used for analyzing a given analyte, the response factor for the analyte changes. Matrix effects can be caused by one or more factors that modify the ability of the sample to produce ions. These factors include, but are not limited to, high concentration of charged material, high concentration of non-volatile material, high concentration of surface-active charged material, changes in liquid sample flow rate, changes in instrument parameters that provide energy for the evaporation of solvent, and formation of excess charge.

Analytical problems caused by changes in ion formation rate as a result of changes in sample composition (particularly between analyte samples and calibration samples) have resulted in guidelines and regulations that address validation of analytical methods reliant upon API techniques. In these guidelines and regulations, matrix effect is assessed by postcolumn infusion of the target analyte (which provides a continuous measure of ion formation rate throughout the course of a LC separation detected by MS) or recovery experiments that measures analyte response in solutions relevant to the analysis under study. Neither of these methods is suitable for the continuous monitoring of the API system performance. Quantitative matrix effect measurements cannot by definition give information about each and every sample analyzed. The post-column infusion technique can provide continuous monitoring of the rate of ion formation, but requires addition of target analyte, an analog or a stable isotopomer, all of which may potentially compromise the quantitative integrity of the analytical system.

The creation of charged clusters is fundamental to the generation of charged particles at atmospheric pressure and nearly room temperature thermal energies. Low mass/charge ("m/z") cluster ions are formed in all API processes. In certain aspects, charges present in the atmosphere attract solvent molecules to create non-covalent charged complexes described as "cluster ions," which are held together by a combination of static charge, hydrogen bonds and van der Waals forces. Clusters may also be the result of the disintegration of larger original charged droplets, as is the case for droplets formed by electrospray and nebulized electrospray. The fundamental theory of ion formation at atmospheric pressure results in the generation of cluster ions in great abundance. Many of the clusters have a core charged molecule that can be liberated by declustering. This is widely employed in the use of API and mass spectrometry to deliver a relevant ion species to the mass analyzer. In fact, ion-molecule cluster ions are formed under the same conditions that give rise to analytically useful pseudomolecular and molecular ions characteristic of modern mass spectrometry.

As described herein, when an API source operates under conditions whereby it forms ions of various kinds, cluster ions are observed at a relatively constant abundance. On the other hand, when the parameters of operation of the API are voluntarily or involuntarily changed whereby its ability to form ions drifts, cluster ion abundance is also disturbed. Since ions at atmospheric pressure and thermal energies tolerated by complex organic molecules always result in the formation of charged solvent and vapor clusters, the abundance of such cluster ions is an indicator of how well the API system is functioning. The use of the ion current for cluster ions comprised of components already part of the sample thus allows for continuous monitoring of any API system and its ability to form ions.

In certain embodiments, monitoring a particular cluster ion abundance using an API system allows for evaluation of the API's ability to form any type of ion, including target analyte ions. In other embodiments, monitoring a particular cluster ion abundance using an API system allows for the evaluation of overall performance of the API system and identification of matrix effects present in the analysis.

The methods of the invention, which in certain aspects comprise measuring ion currents generated by ion-molecule clusters formed in the API process, are a simple and convenient means of identifying any changes in overall ionization system performance. The methods of the present invention allow for monitoring performance of an API system on a continuous basis without the need for sample spiking or infusion. Since the methods of the invention require no specific additives, the quantitative integrity of the analytical system is maintained.

Methods

In certain embodiments, the methods of the invention comprise continuously monitoring the performance of an atmospheric pressure ionization system, such as those used in mass spectrometers. In other embodiments, the methods of the invention comprise monitoring the formation and/or amount of one or more cluster ions during the MS analysis of a particular analyte using an API system.

The cluster ions contemplated within the invention are formed during vaporization of the sample to be analyzed. The chemical nature of the cluster ions may be modified by varying specific experimental conditions, such as instrumental variables including but not limited to: voltage and current used to generate ions by API, overall ion source gas pressure, identity of gases and vapors present during the ionization process, composition of the solvent system being vaporized, and the like. Any cluster ion of specific size and charge is contemplated within the invention. In certain embodiments, the cluster ion is selected by modifying and/or circumventing parameters built into commercial mass spectrometers designed specifically to remove cluster ions. In general, cluster ions are considered only as a source of chemical noise in API-MS, and as such great effort is given to reducing or removing signals from cluster ions. By circumventing the controls that limit detection of cluster ions, the presence and abundance of detected cluster ions can be manipulated. Such parameters include, but are not limited to, curtain gas, declustering potential, low mass filters, differential pumping, molecular beam skimmers, heated capillary temperature, size and construction material, entrance potential and other sources of energy that are applied to the clusters to break them apart, such as, but not limited to, low energy electrons from various sources, IR radiation, microwave radiation and laser light. In certain embodiments of the invention, the curtain gas and declustering potential are set to their lowest feasible values to permit low m/z cluster ions into the mass spectrometer. Further adjustment of collision cell voltages and collision gas thickness allows for selected reaction monitoring of some cluster ions. Other cluster ions can be monitored using other modes of mass spectrometry, such as but not limited to selected ion monitoring and others. The characteristic abundance and behavior of the signal generated for the cluster ion depends on the specific set of API conditions and the fluid delivery system. The abundance and behavior of the ion current for the cluster ion may be determined using the API system. For an LC-MS analysis, this may comprise injecting a solvent blank followed by gradient elution from an HPLC column. This control experiment may help establish the cluster ion pattern to be expected for all subsequent analyses done with that API system.

Once the identity of the at least one cluster ion is determined, the ion current for the at least one cluster ion is monitored using a commercially available mass spectrometer and/or ion mobility spectrometer that is tuned to maximize the formation, transmission and detection of the selected ion-molecule cluster ion(s). Comparison of the ion current for the cluster ion(s) and the ion current for the analyte(s) of interest, as a function of time, allows one to determine if there is a time-dependent change of sensitivity of the instrument to the analyte(s) and the ion-molecule cluster ion(s).

In certain embodiments, the instrument parameters are set up such that monitoring of the ion current for the cluster ions is alternated with monitoring of the ion current for the analyte. The frequency of the switching depends on the specific mass spectrometer used and the scan mode being used but typically ranges from 1 millisecond to several seconds. Such set-up allows monitoring and identifying any time-dependent variation in ion current for the cluster ion and the analyte, thus allowing the determination of whether matrix effects or instrumental driftings are taking place. In other embodiments, the instrument parameters are set up such that monitoring of the ion current for cluster ions is run at preselected time points, whereas at other times the instrument is set up to monitor the ion current for the analyte. These set-ups allow monitoring and identifying any time-dependent variation in ion current for the cluster ion and the analyte, thus determining whether matrix effects or instrumental driftings are taking place.

In certain embodiments, ion-molecule cluster ions formed during the API process are monitored, measured and/or recorded using a mass spectrometer, and the corresponding results are used as an indication of the ability of the API system to form ions of any type. Monitoring, measuring and/or recording the rate or extent of ion formation by API processes may be accomplished using any of the available mass spectrometry means based on the separation and detection of the m/z ratio of an ionized species related to the cluster ion. The ionized species related to the cluster ion include fragment ions, smaller and larger cluster ions, or any other charged chemical species derived from the original cluster ion formed in the API process. In certain embodiments, the ionized species related to the cluster ion does not include the desolvated ions typically detected by mass spectrometry and ion mobility, such as molecular ions, pseudomolecular ions, and fragments thereof.

According to the methods of the invention, a deviation from the expected instrumental response for a specific cluster ion under specific experimental conditions indicates a change in the performance of the API process, and this change may also affect processes and measurements reliant upon the API system, such as but not limited to LC-MS detection of samples for qualitative or quantitative analytical purposes. The change in instrumental response for the cluster ions can then be used as an indicator of systemic changes in the API process that affect the response of analyte ions. In certain embodiments, the time and degree of change relative to the elution time of the analyte and the expected response at that time is used to establish one of the following results: (a) the API system is working as expected and no action is required, (b) a change or drift has occurred in the API system that may impact the accuracy or precision of the analytical results, and (c) a change or drift has occurred in the API system that impacts the response for the target analyte and action must be taken, such as troubleshooting the analytical system, recalibrating the API system and/or reanalyzing the sample containing the analyte.

In certain embodiments, ion-molecule cluster ions formed during the API process are monitored, measured and/or recorded by ion mobility spectrometry, such as, but not limited to, differential ion mobility (DMS) and high field asymmetric ion mobility spectrometry (FAIMS), and used as an indication of the ability of the API system to form ions of any type. Monitoring, measuring and/or recording the rate or extent of ion formation by API processes may be accomplished using any of the available means based on the separation and detection of ionized species related in any fashion to the cluster ion. This includes fragment ions, smaller and larger cluster ions or any other charged chemical species derived from the original cluster ion formed in the API process.

In certain embodiments, the measurement of the ion current associated with charged cluster ions is used to monitor an API-based continuous process. For example, paints and coating are often applied using API processes to assure thin and even coverage. In other embodiments, changes in the abundance and overall pattern of the cluster ions observed indicate a change or drift in the API process that may affect the quality of the overall process. The information about change in the API-based process may be used in real time to make adjustments to the parameters associated with the API system, such as, but not limited to, current, voltage, flow rate, and the like, with the objective of ensuring that the process is run under uniform and stable conditions. The information might also be used to stop an uncontrolled and/or unstable process and troubleshoot causes for the cluster ion abundance change.

The invention further comprises apparatus that are adapted to implement the methods of the invention. These apparatus allow for monitoring the ion currents of a cluster ion as a function of time, and may be generated by modifying preexistent part(s) of commercially available MS instruments. Alternatively, the apparatus may be attached to commercially available MS instruments and/or replace specific part(s) of commercially available MS instruments. In addition to mass spectrometry and ion mobility, charged aerosol detection might be used in conjunction with API as a means of measuring cluster ion current. Gas dynamics might also be the basis for separation of clusters from the remainder of the gas jet with detection by any available charge or current detection device such as a Faraday cup, charge coupled device, image current device, ionization gauge or any other detector of ionized species.

The invention further comprises software that is adapted to implement the methods of the invention in a commercially available MS instrument. Such software may include: software that monitors cluster response and then adjusts instrumental parameters to maintain cluster response at a fixed level; software that evaluates cluster response as a function of time compared to an expected function of response over time and reports response differences in the overall pattern, specific time windows, response levels over various time segments, and/or response levels over various time ranges (seconds, minutes, hours, days, weeks, months, years); software that calculates statistical parameters of the cluster response over time, samples, and scans; software that calculates process integrity over time, between methods, functions, and procedures based on cluster ion abundance monitoring; software that evaluates binary results based on cluster ion measurements such as good/bad; software that evaluates cluster ion abundance monitoring data and relates it to quantitative measurements of other ions detected by the same API process giving rise to the analyte ions; software that provides troubleshooting guidance for methods and procedures and processes based on cluster ion abundance measurements; software that detects the presence of sample components based on the change in the cluster ion response; software that quantifies sample components based on the cluster ion response; software that remotely monitors hardware performance and system operation based on cluster ion abundance and species; software for method development and validation based on cluster ion response; software for system cleaning based on cluster ion species and response compared to a known clean system specification; and/or software for system optimization based on general cluster ion species and response rather than specific analyte response.

The methods of the invention can be used to evaluate and monitor the quality of an atmospheric pressure ionization and/or the performance of a system running atmospheric pressure ionization. The methods of the invention can be further used to develop methods that use atmospheric pressure ionization. The methods of the invention can be further used to perform quality control of processes reliant upon atmospheric pressure ionization and/or analyses dependent upon atmospheric pressure ionization. The methods of the invention can be further used as a means of identifying changes in the atmospheric pressure ionization performance; measuring and evaluating the effect of system tuning and optimization; correcting response changes found in measurements reliant upon atmospheric pressure ionization; and/or evaluating the magnitude of changes observed with the use of atmospheric pressure ionization.

The invention further includes software programs that evaluate results generated through the use of the methods of the invention; and/or predict the shape and completion of an event or process reliant upon the methods of the invention.

The invention further allows for creating and applying information derived from the methods of the invention as applied to non-cluster ions, generated by atmospheric pressure ionization. The invention further allows for a means of universal detection based on the methods of the invention, as well as extending the useful concentration dynamic range of analyses performed using the methods of the invention. The invention further allows for evaluating the overall system production or release of substances that might potentially interfere with ion production by API.

Definitions

Unless defined otherwise, all technical and scientific terms used herein generally have the same meaning as commonly understood by one of ordinary skill in the art to which this invention belongs. The following references provide one of skill with a general definition of many of the terms used in this invention: Singleton et al., Dictionary of Microbiology and Molecular Biology ($2^{nd}$ ed. 1994); The Cambridge Dictionary of Science and Technology (Walker ed., 1988); The Glossary of Genetics, 5th Ed., R. Rieger et al. (eds.), Springer Verlag (1991); and Hale & Marham, The Harper Collins Dictionary of Biology (1991). Generally, the nomenclature used herein and the laboratory procedures in analytical chemistry, inorganic chemistry, and organic chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

As used herein, the term "accuracy" refers to the degree of closeness of the determined value to the nominal or known true value under prescribed conditions. This is sometimes termed trueness.

As used herein, the term "analyte" refers to a specific chemical moiety being measured. In certain embodiments, the analyte is an intact drug, a biomolecule or any derivative thereof, a metabolite, and/or a degradation product in a biologic matrix.

As used herein, the term "analytical run" refers to a set of analytical and study samples, which may be analyzed along with standards and/or quality control procedures as to validate the run. In certain embodiments, one or more analytical runs are completed in one day. In other embodiments, an analytical run may take one or more days to complete.

As used herein, the term "APCI" refers to atmospheric pressure chemical ionization.

As used herein, the term "API" refers to atmospheric pressure ionization. Atmospheric pressure ionization refers to all systems capable of producing charged molecules or ions at gas pressures between about 200 kPa and about 46.6 kPa. Techniques that are classified as atmospheric pressure ionization include, but are not limited to, electrospray ionization, nebulizer assisted electrospray ionization, direct electrospray ionization, atmospheric pressure chemical ionization, atmospheric pressure photoionization, direct analysis in real time, and atmospheric pressure laser desorption ionization, thermospray ionization, atmospheric pressure matrix assisted laser desorption ionization, atmospheric pressure laser ionization, sonic spray ionization, and extractive spray ionization.

As used herein, the term "APPI" refers to atmospheric pressure photoionization ionization.

As used herein, the term "blank" refers to a sample of a biological matrix to which no analytes have been added, that is used to assess the specificity of the detection method.

As used herein, the term "calibration standard" refers to a biological matrix to which a known amount of analyte has been added. Calibration standards are used to construct calibration curves from which the concentrations of analytes in quality control samples and in unknown study samples are determined.

As used herein, the term "ESI" refers to electrospray ionization.

As used herein, the term "instructional material" includes a publication, a recording, a diagram, or any other medium of expression that may be used to communicate the usefulness of the compositions and methods of the invention. In some instances, the instructional material may be part of a kit useful for evaluating performance of an atmospheric pressure ionization system in a mass spectrometer. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions and/or methods cooperatively. For example, the instructional material is for use of a kit; instructions for use of the compositions; or instructions for use of the methods.

As used herein, the term "internal standard" or "IS" refers to a test compound, or a combination thereof (e.g., structurally similar analog, stable labeled compound and so forth) added to both calibration standards and samples at known and constant concentration to facilitate quantification of the target analyte(s).

As used herein, the term "ion mobility spectrometer" refers to a spectrometer that separates charged species based on their hydrodynamic radius and collision cross-section, which in certain embodiments are related to the physical size and shape of the charged species and the specific chemistry of process used to form the charged species.

As used herein, the term "LC" refers to liquid chromatography.

As used herein, the term "LC-MS/MS" refers to liquid chromatography-tandem mass spectrometry.

As used herein, the term "MALDI" refers to matrix assisted laser desorption ionization.

As used herein, the term "mass spectrometry" refers to an analytical technique wherein charged species are separated based on their mass-to-charge ratios.

As used herein, the term "matrix" refers to a discrete material that can be sampled and processed in a reproducible manner. In certain embodiments, the matrix comprises biological material and is referred to as a "biological matrix." Non-limiting examples of biological matrices comprise blood, serum, plasma, urine, feces, cerebrospinal fluid, saliva, sputum, and other biological tissues.

As used herein, the term "matrix effect" refers to a direct or indirect alteration or interference in response due to the presence of unintended analytes (for analysis) or other interfering substances in the sample.

As used herein, the term "method" refers to a description of procedures used in sample analysis.

As used herein, the term "MS" refers to mass spectrometry.

As used herein, the term "m/z" refers to mass-to-charge ratio.

As used herein, the term "quality control sample" refers to a sample with a known quantity of analyte that is used to monitor the performance of an analytical method and to assess the integrity and validity of the results of the unknown samples analyzed in an individual run.

As used herein, the terms "response" and "abundance" refer to absolute and/or relative measurements. The "response" and/or "abundance" of a given cluster may include ratios of that cluster with other clusters and/or with analyte ions. The "response" and/or "abundance" of a given cluster may also include ratios or other calculated relationships with measurable variables such as, but as limited to, total ion current, liquid flow rate, and gas flow rate.

As used herein, the term "SAM" refers to standard addition method.

As used herein, the term "sample" refers to a generic term encompassing controls, blanks, unknowns, and processed samples.

As used herein, the term "SRM" refers to selected reaction monitoring.

As used herein, the term "standard curve" or "calibration curve" refers to a relationship between the experimental response values and the analytical concentrations.

As used herein, the term "unknown" refers to a sample that is the subject of the analysis.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

It is to be understood that wherever values and ranges are provided herein, all values and ranges encompassed by these values and ranges, are meant to be encompassed within the scope of the present invention. Moreover, all values that fall within these ranges, as well as the upper or lower limits of a range of values, are also contemplated by the present application.

Those skilled in the art will recognize, or be able to ascertain using no more than routine experimentation, numerous equivalents to the specific procedures, embodiments, claims, and examples described herein. Such equivalents were considered to be within the scope of this invention and covered by the claims appended hereto. For example, it should be understood, that modifications in reaction conditions, including but not limited to reaction times, reaction size/volume, and experimental reagents, such as solvents, catalysts, pressures, atmospheric conditions, e.g., nitrogen atmosphere, and reducing/oxidizing agents, with art-recognized alternatives and using no more than routine experimentation, are within the scope of the present application.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Example 1: Detection of Ionization Suppression

Post-column infusion of analyte has been used in the art to identify regions within LC-API-MS chromatograms subject to ionization interferences that are often called ionization suppression or ionization enhancement. The prior art method requires the addition of analyte in the form of the post-column infusion.

FIGS. 3-6 show the use of the methods of the invention to detect ionization interference along with the traditional approach of analyte infusion. The figures demonstrate the utility of the methods of the invention to detect regions of atmospheric pressure ionization interference, similar to post-column infusion. FIGS. 8-12 provide examples of the use of the methods of the invention to detect problems in atmospheric pressure ionization under various conditions where post-column infusion is not practical. The data demonstrate the utility of the methods of the invention in detecting, and in some instances correcting, problems with atmospheric pressure ionization often called ionization suppression or matrix effect.

Figure 3:
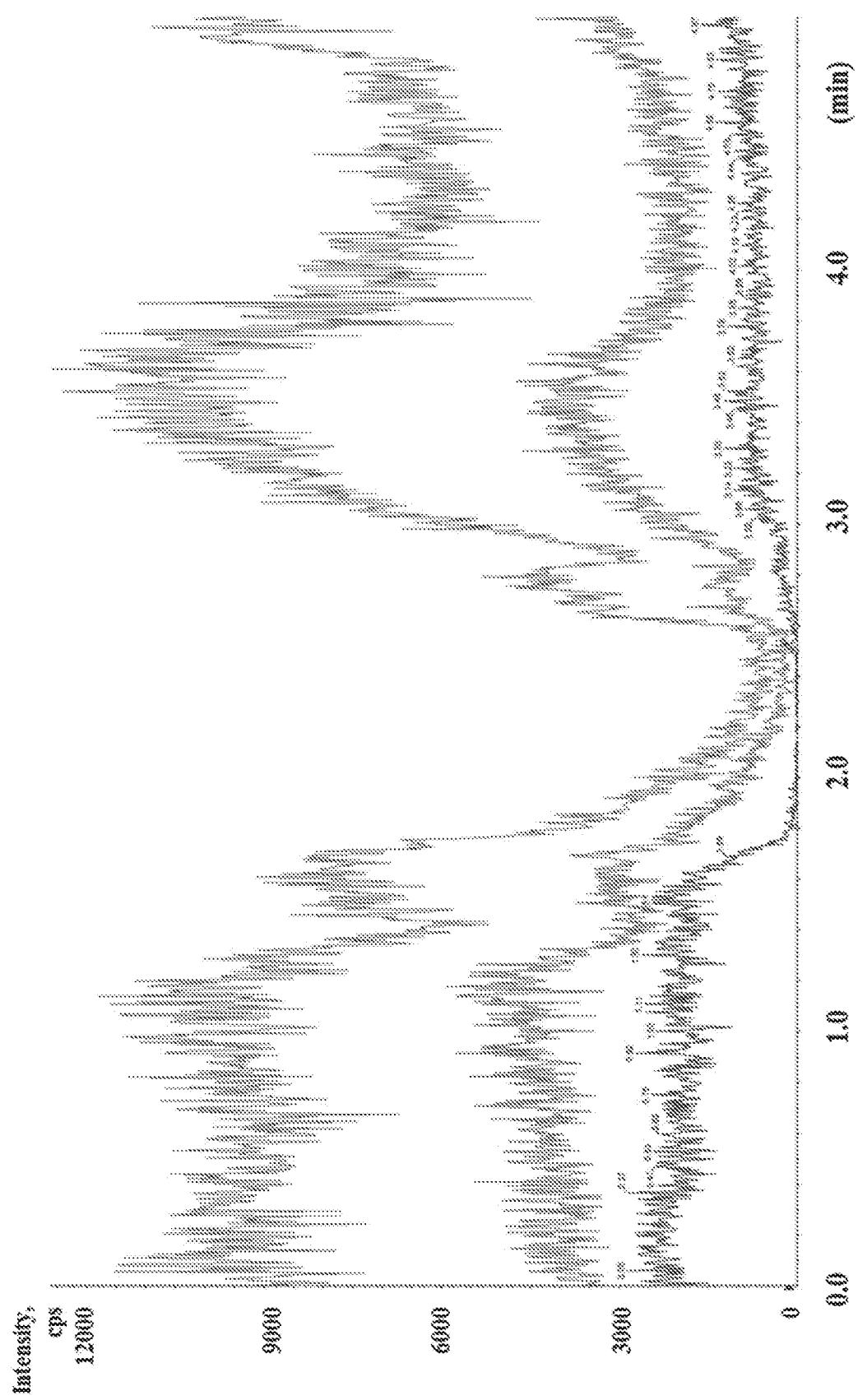
FIG. 3 illustrates post-column infusion chromatograms generated by infusing a mixture of acetaminophen (blue trace—bottom trace at t=0), labetalol (red trace—middle trace at t=0) and reserpine (methyl (3β,16β,17α,18β,20α)-11,17-dimethoxy-18-[(3,4,5-trimethoxybenzoyl)oxy] yohimban-16-carboxylate; green trace—top trace at t=0) through a tee that connects the infusion flow with the column effluent and the mass spectrometer source inlet.

FIG. 3 illustrates the traditional post-column infusion chromatogram generated by infusing a mixture of acetaminophen (blue trace; bottom trace at t=0), labetalol (red trace; middle trace at t=0) and reserpine (green trace; top trace at t=0) through a tee that connects the infusion flow with the column effluent and the mass spectrometer source inlet. The column used was a Phenomenex Luna C8, 1 mm×50 mm, 3 µm particles at a mobile phase flow rate of 50 µl/min. Mobile phase was a simple linear acetonitrile gradient running from 95% A (0.1% formic acid in water); 5% B (0.1% formic acid in acetonitrile) to 5% A; 95% B over 5 minutes. The sample injected on the column was 5 µl of acetonitrile protein precipitated dog plasma. Detection was SRM mode on an API4000 Qtrap mass spectrometer running Analyst 1.6.2. Regions of ionization interference that suppressed the signal for the three analytes were clearly visible over the range of 1.6 to 3 minutes.

Figure 4:
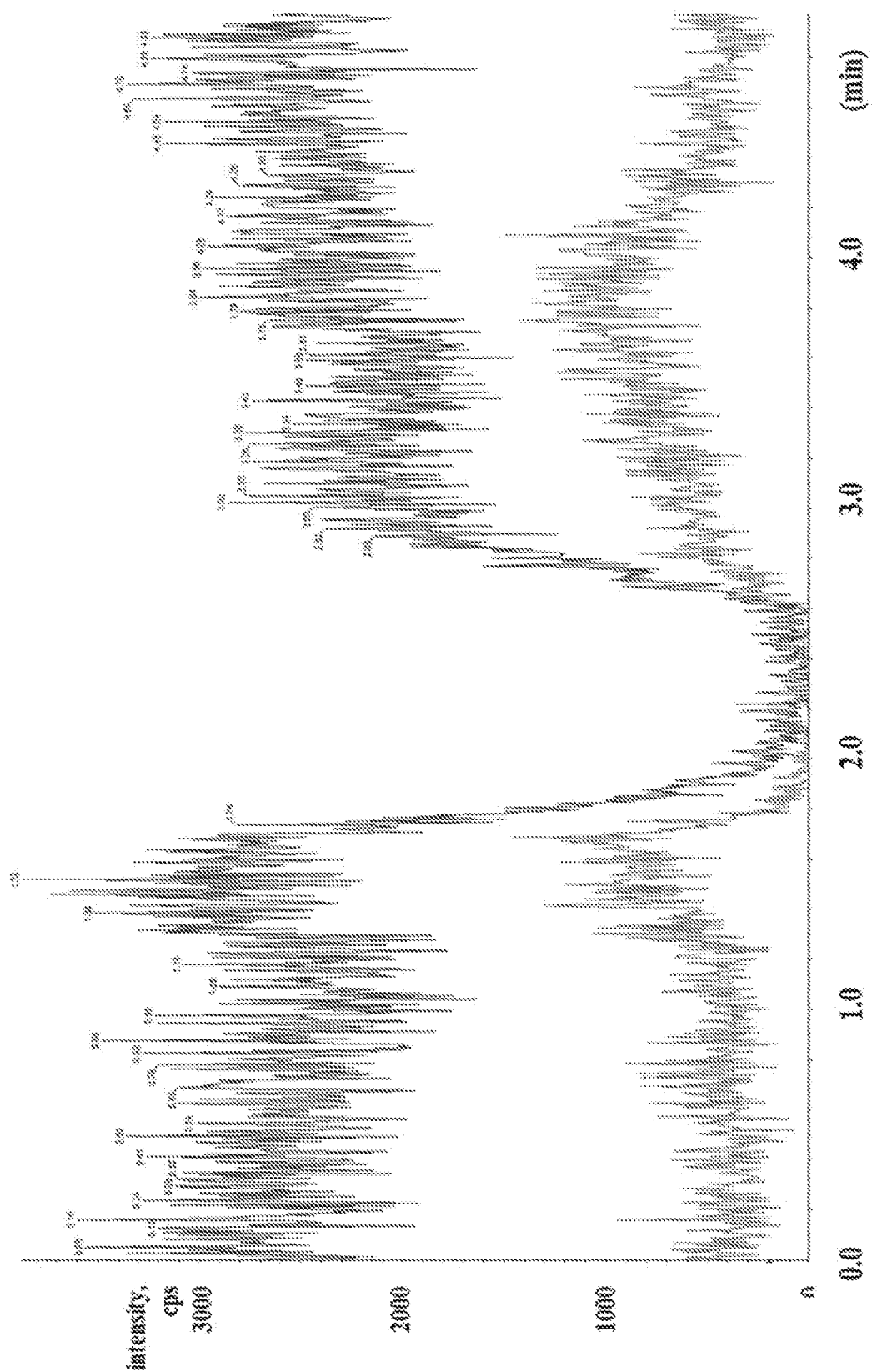
FIG. 4 illustrates chromatograms of two cluster ions selected for monitoring in the mobile phase system described in FIG. 3.

FIG. 4 illustrates the chromatograms of two cluster ions selected for monitoring in the mobile phase system described in FIG. 3. The red trace (bottom trace at t=0) is from a cluster with m/z indicating it is composed of two acetonitrile molecules and one water molecule with a single proton, and the blue trace (top trace at t=0) corresponds to a cluster ion with m/z indicating it is composed of two acetonitrile molecules with a single proton. Injection of protein precipitated dog plasma resulted in the interference in the generation of cluster ions indicated by the depression observed in the signals between 1.6 minutes and 3.0 minutes.

Figure 5:
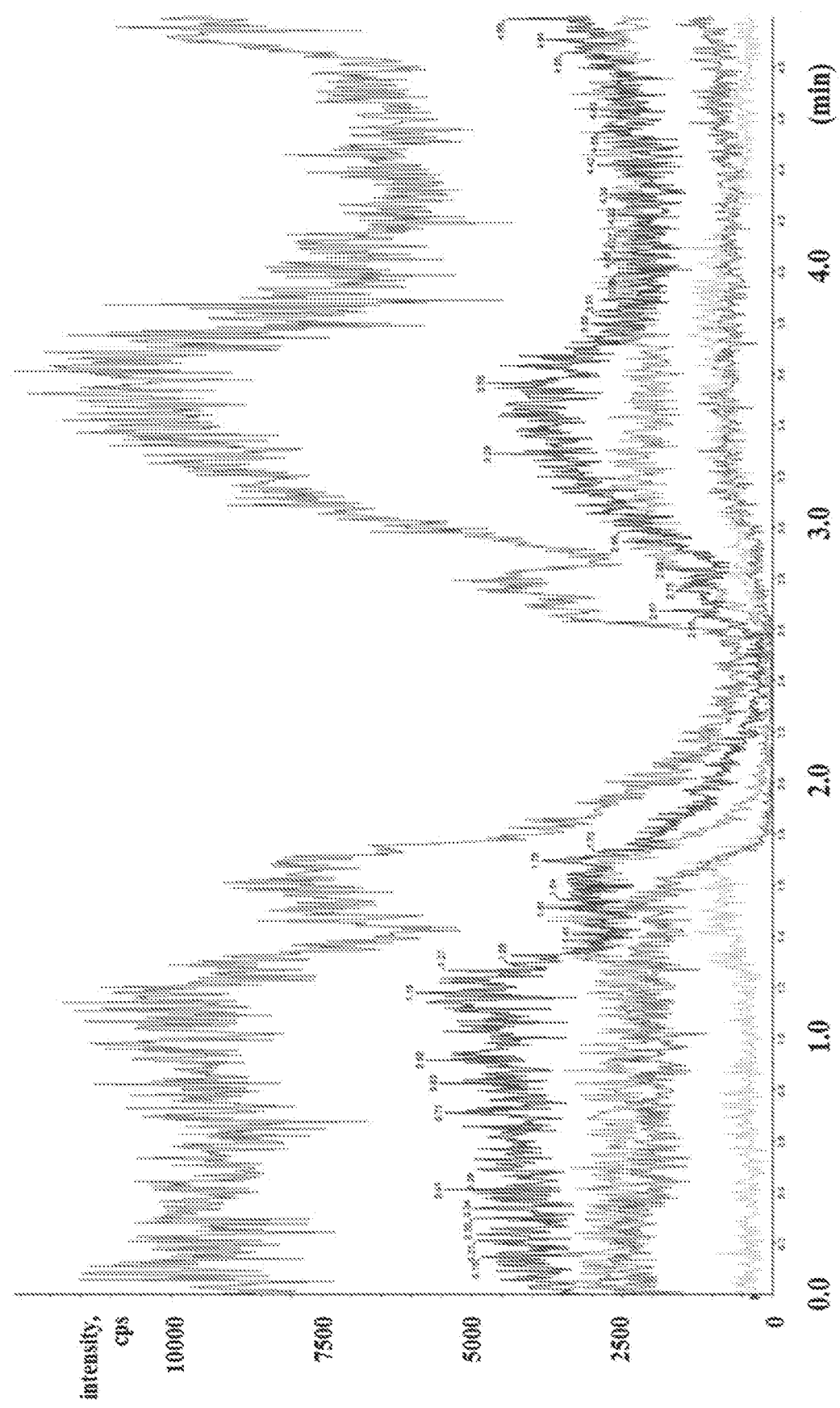
FIG. 5 illustrates chromatograms obtained by monitoring the selected cluster ions from FIG. 4 along with the post-column infused analyte ions from FIG. 3 (at t=0, traces from top to bottom: reserpine; labetalol; top trace from FIG. 4; acetaminophen; bottom trace from FIG. 4).

FIG. 5 illustrates the result of monitoring the selected cluster ions from FIG. 4, along with the post-column infused analyte ions from FIG. 3. The general agreement of the ionization interference patterns between the selected cluster ions and the model analytes demonstrates the utility of the methods of the invention as indicators of ionization interference, similar to that detected using post-column infusion of analyte. The data indicate that post-column infusion of specific analytes might be replaced by the use of the native solvent cluster ions as a means of detecting ionization interferences.

Figure 6:
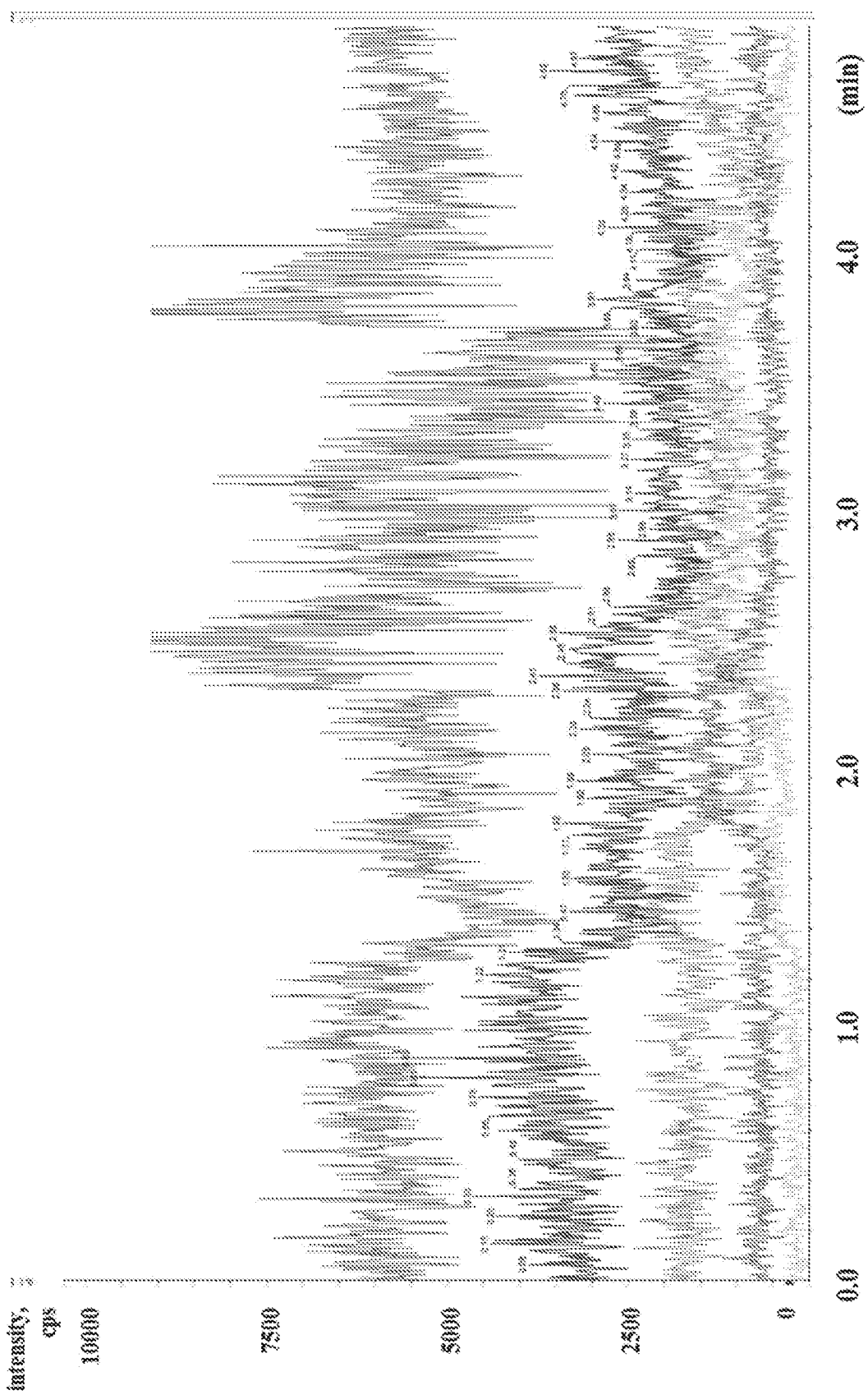
FIG. 6 illustrates chromatograms for the same collection of selected cluster ions and model analyte ions from FIGS. 3-5 when water (rather than sample extract) was injected on the column. At t=0, from top to bottom: reserpine; labetalol; top trace from FIG. 4; acetaminophen; bottom trace from FIG. 4.

FIG. 6 illustrates the chromatograms for the same collection of selected cluster ions and model analyte ions from FIGS. 3-5 when water (rather than sample extract) was injected on the column. This was the control experiment, which showed no significant ionization interference detected in any of the monitored ions. The figure demonstrates the concordance between the infused analyte and the native solvent cluster ion signals lending further evidence that the methods of the invention can replace the infused analyte for the detection of ionization interference.

Figure 7:
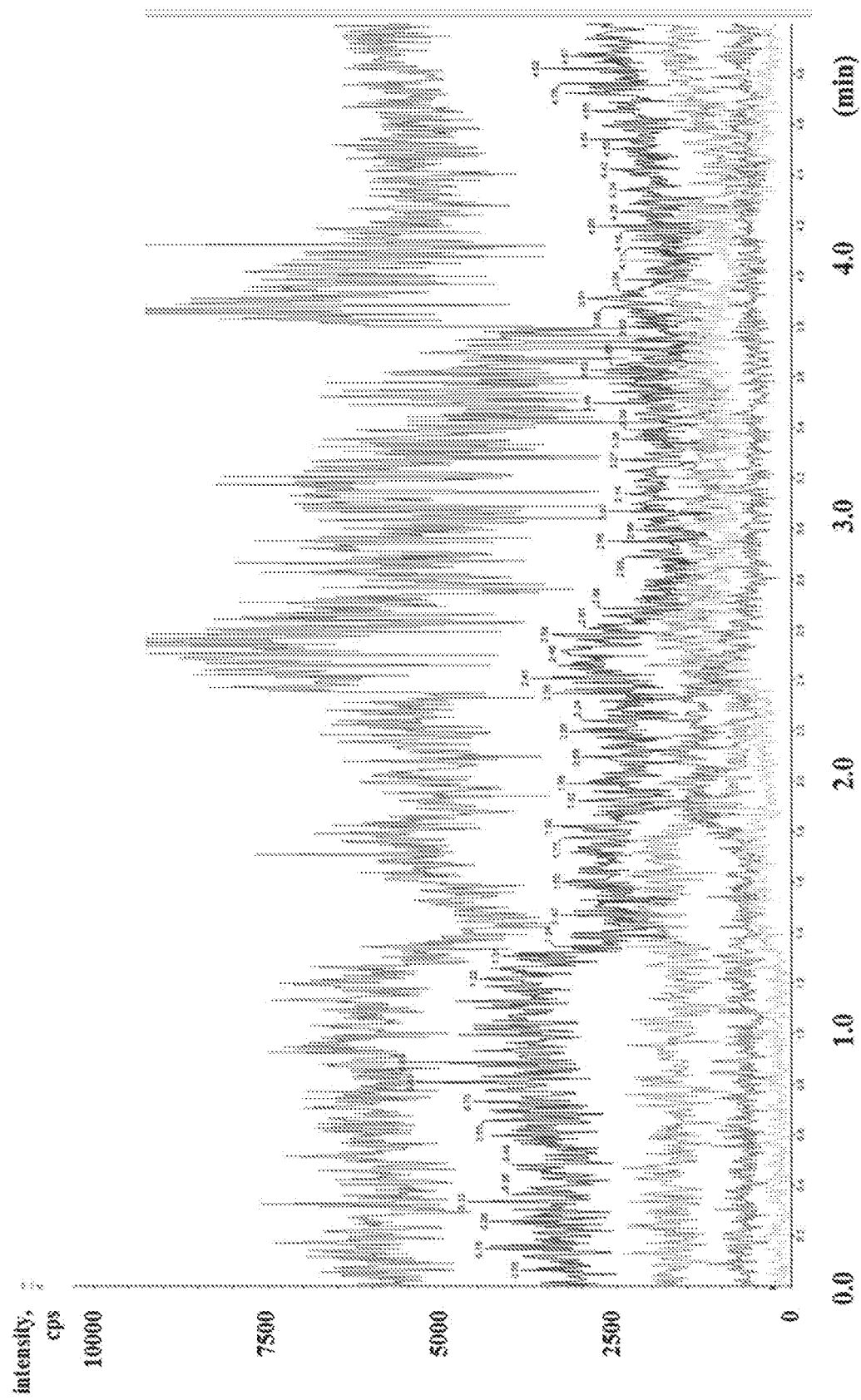
FIG. 7 illustrates chromatograms for the cluster ions for positive ion electrospray (red, and blue) used for the methods of the invention, along with the trace for the traditional SRM detection of Gaboxadol (green—top trace at t=0) from protein precipitation of rat plasma.

FIG. 7 shows the traces for the cluster ions for positive ion electrospray (red and blue) used for the methods of the invention, along with the trace for the traditional SRM detection of gaboxadol (green) from protein precipitation of rat plasma on a 6500Qtrap mass spectrometer coupled to the Eksigent LC200 running a 1 mm×5 cm Phenomenex Luna C8 column at 50 µl/minute, using a simple 5 minute linear gradient from 5% B (acetonitrile with 0.1% formic acid): 95% A (water with 0.1% formic acid) to 90% B. The figure demonstrate the use of the methods of the invention for detecting ionization interference. The loss of cluster ion signal from 0.6 minutes to 1 minute indicates interference with the electrospray ionization process. As the green trace in the figure shows, the gaboxadol elutes within that time window.

Figure 8:
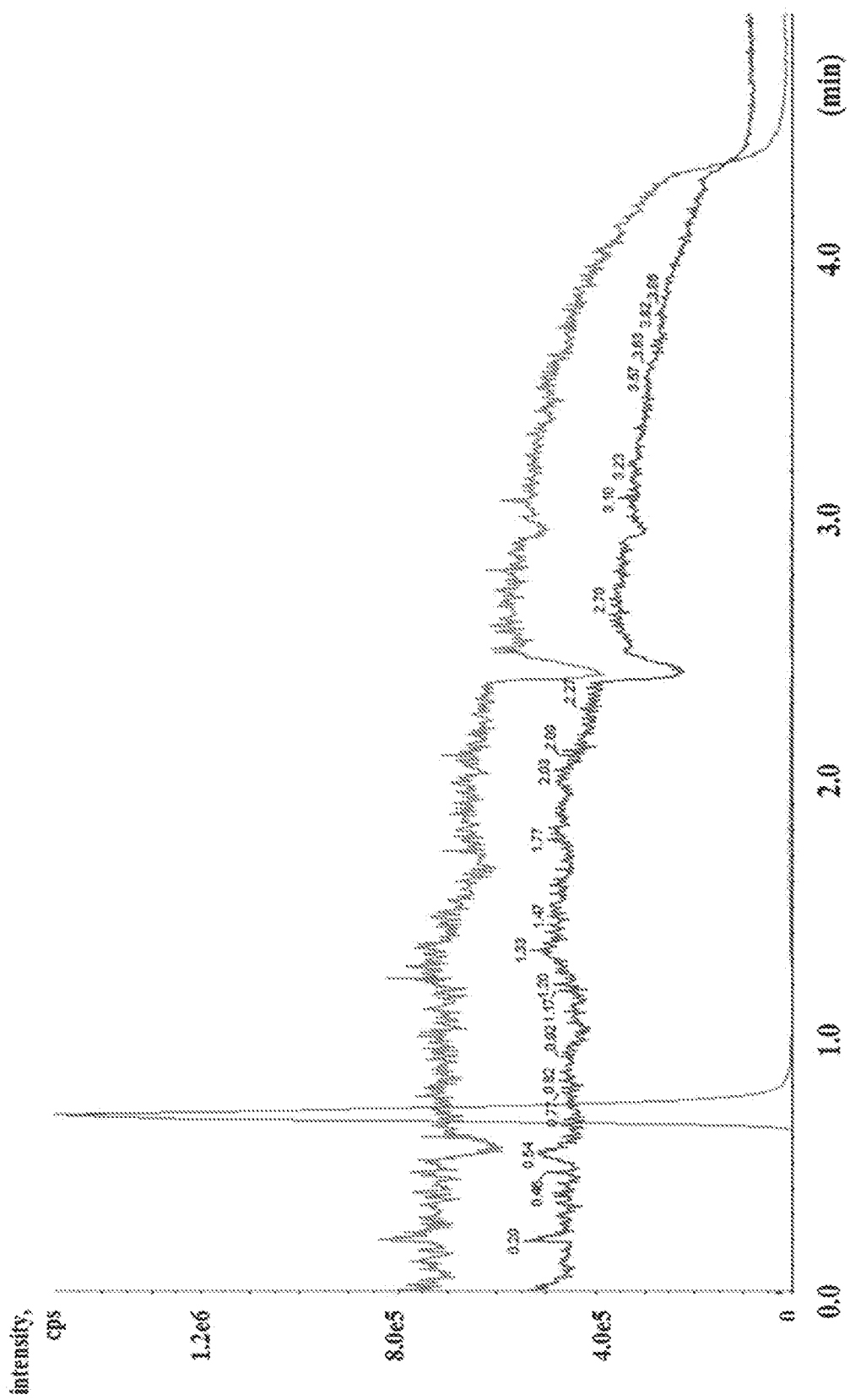
FIG. 8 illustrates chromatograms relating to the injection of a neat solution of Gaboxadol at the same concentration as the injection in FIG. 7.

FIG. 8 illustrates injection of a neat solution of gaboxadol at the same concentration as the injection in FIG. 7. The difference in gaboxadol response between the two chromatograms indicates that the protein precipitation sample contains endogenous materials that are co-eluting with the gaboxadol, thus causing loss of response or ionization suppression. The observed results for gaboxadol are in agreement with experiments reported elsewhere herein.

Figure 9:
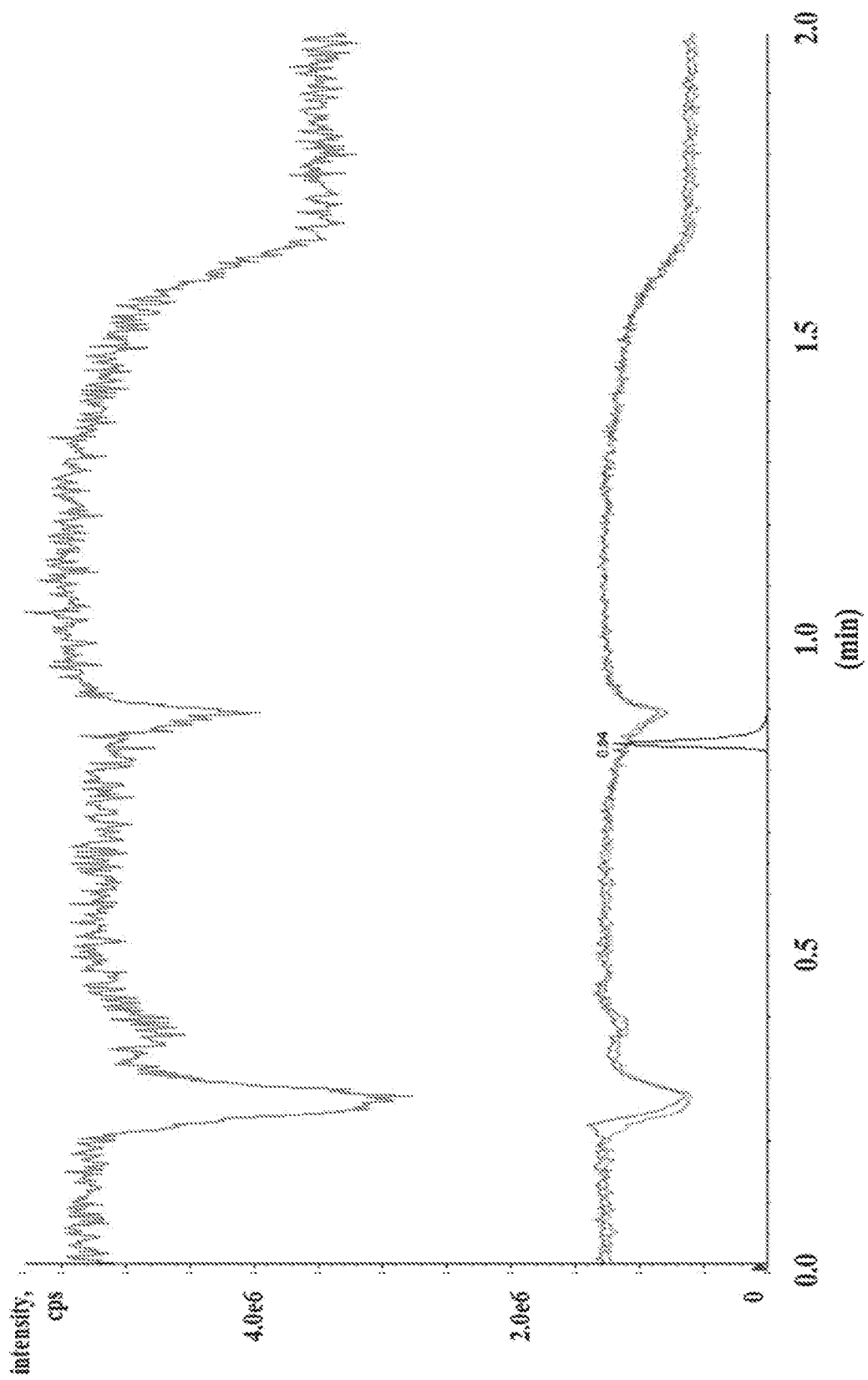
FIG. 9 illustrates chromatograms relating to a typical daily system suitability performance check.

FIG. 9 illustrates a typical daily system suitability performance check. 5 µl of a 10 ng/ml solution of labetalol was injected on a Phenomenex Luna C8, 1 mm×50 mm, 3 µm particles at a mobile phase flow rate of 50 µl/min. Mobile phase was a simple linear acetonitrile gradient running from 95% A (0.1% formic acid in water); 5% B (0.1% formic acid in acetonitrile) to 5% A; 95% B over 5 minutes. An API4000 Qtrap mass spectrometer run in positive ion SRM mode was used to acquire the data. The red and green traces for the solvent cluster ions used for monitoring API performance did not indicate any change in ionization in the region of the labetalol peak. Additionally, the absolute and relative intensities of the cluster ions were typical for the instrument under these conditions.

Figure 10:
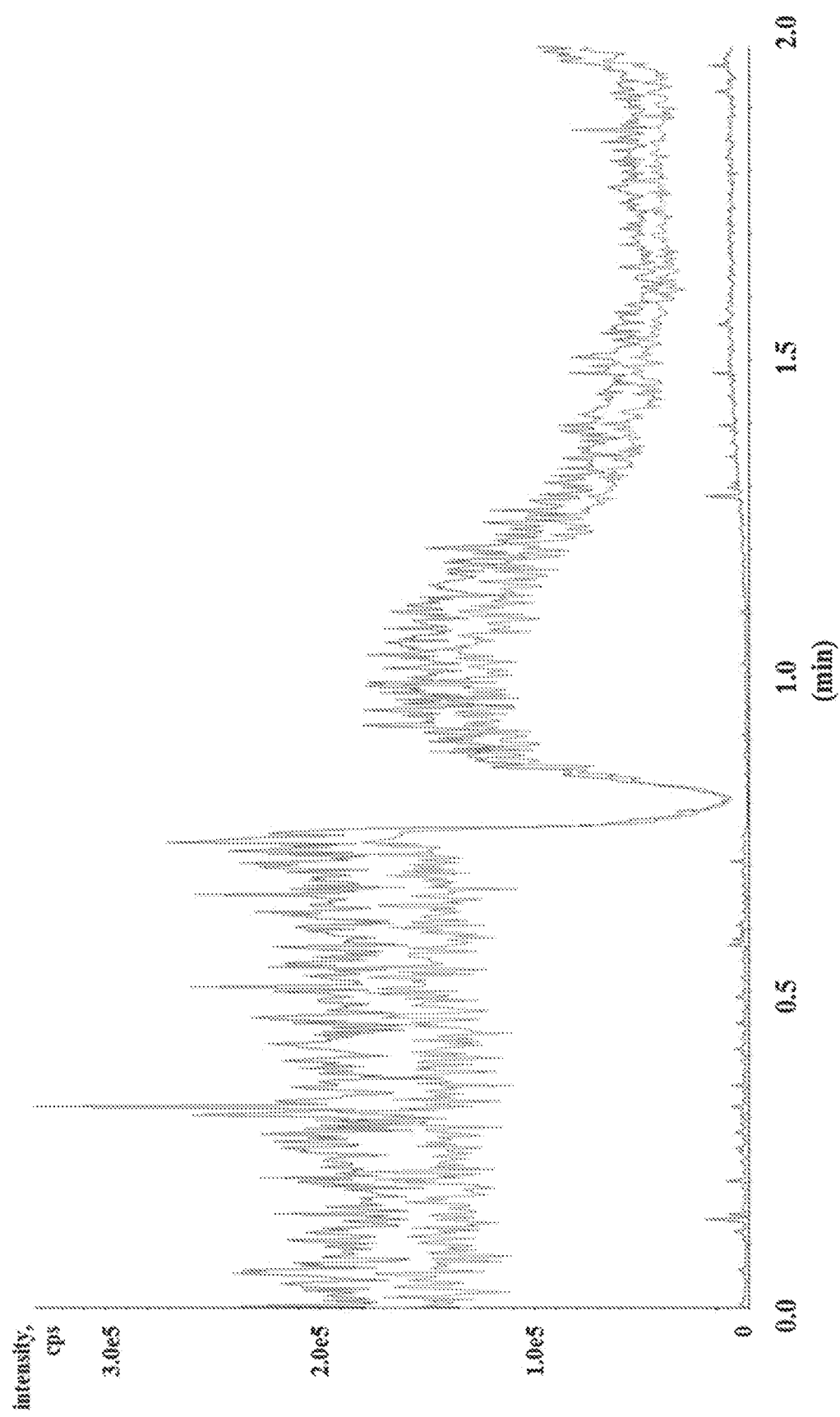
FIG. 10 illustrates chromatograms relating to the same daily system performance check shown in FIG. 9.

FIG. 10 illustrates the same daily system performance check shown in FIG. 9. This chromatogram was acquired soon after running a negative ion, ion-pairing method that used 2 mM concentrations of the strong base tributylamine in the mobile phase. Once the LC system was switched back to positive ion mode with formic acid containing mobile phase and completely washed with the new mobile phase, the system suitability check was run. No peak for labetalol was observed and the relative and absolute abundances for the cluster ions were not what is typically found for this suitability check. The data in the figure indicate that the TBA was still present in the system in concentrations sufficient to cause severe ionization suppression. This is a well-known consequence of running strongly basic ion-pairing reagents just prior to positive ion analysis. The figures demonstrate the utility of the methods of the invention for detecting general loss of ionization capacity in atmospheric pressure ionization, a key component of system suitability monitoring.

Figure 11:
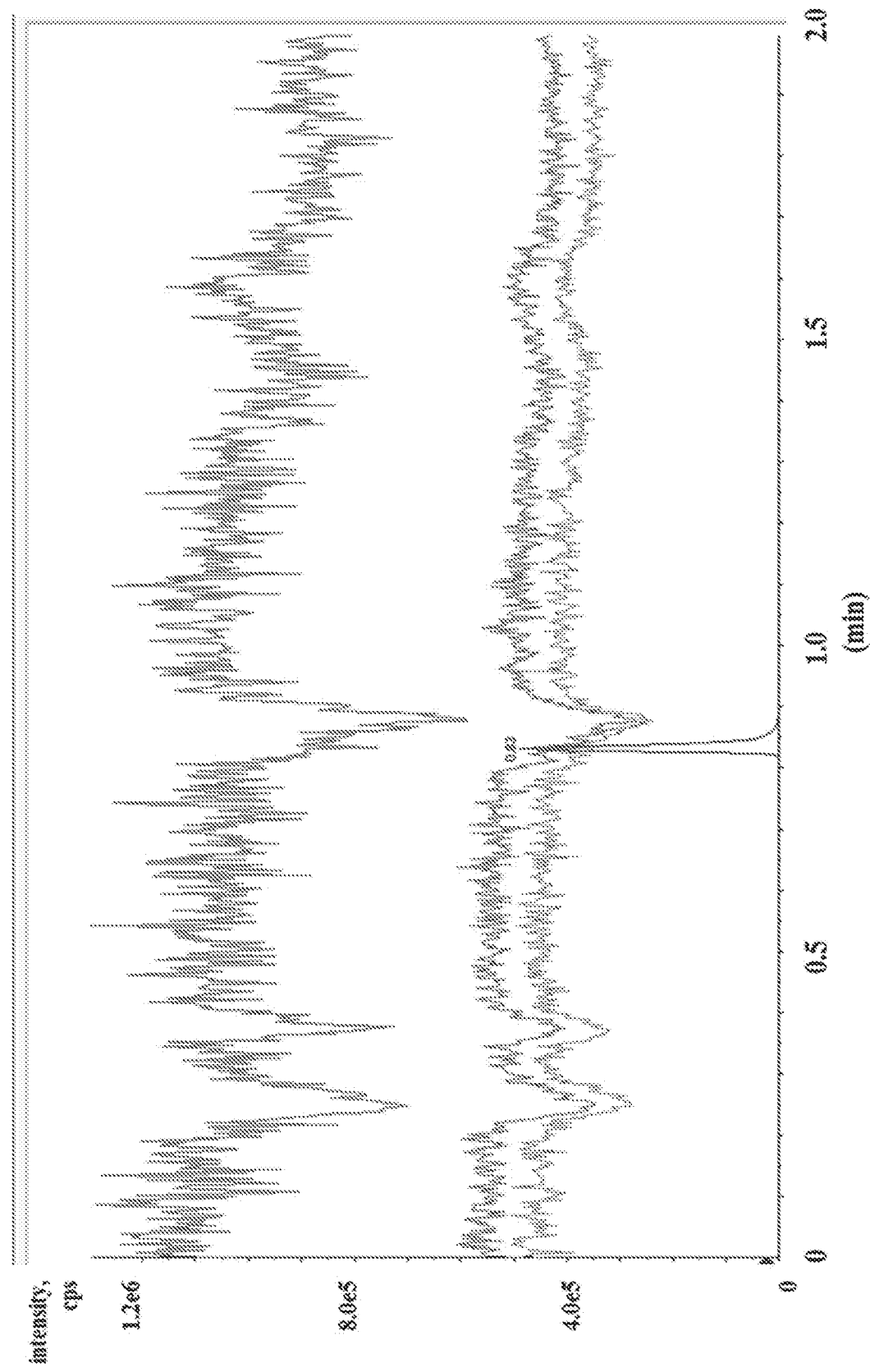
FIG. 11 illustrates chromatograms relating to the system suitability test run after replacing the plastic tubing in the LC pump and flushing the system with isopropyl alcohol.

FIG. 11 illustrates the system suitability test run after replacing the plastic tubing in the LC pump and flushing the system with isopropyl alcohol. Notice that the labetalol peak (blue trace; between 0.8 and 0.9 min) has regained approximately 50% of its normal response. The cluster ion monitoring showed a similar gain in response to approximately 50% of their responses prior to exposure of the system to TBA-containing mobile phase. The data demonstrate the use of the methods of invention for system suitability monitoring (in this case identifying the loss of labetalol response as general loss of ESI response).

Figure 12:
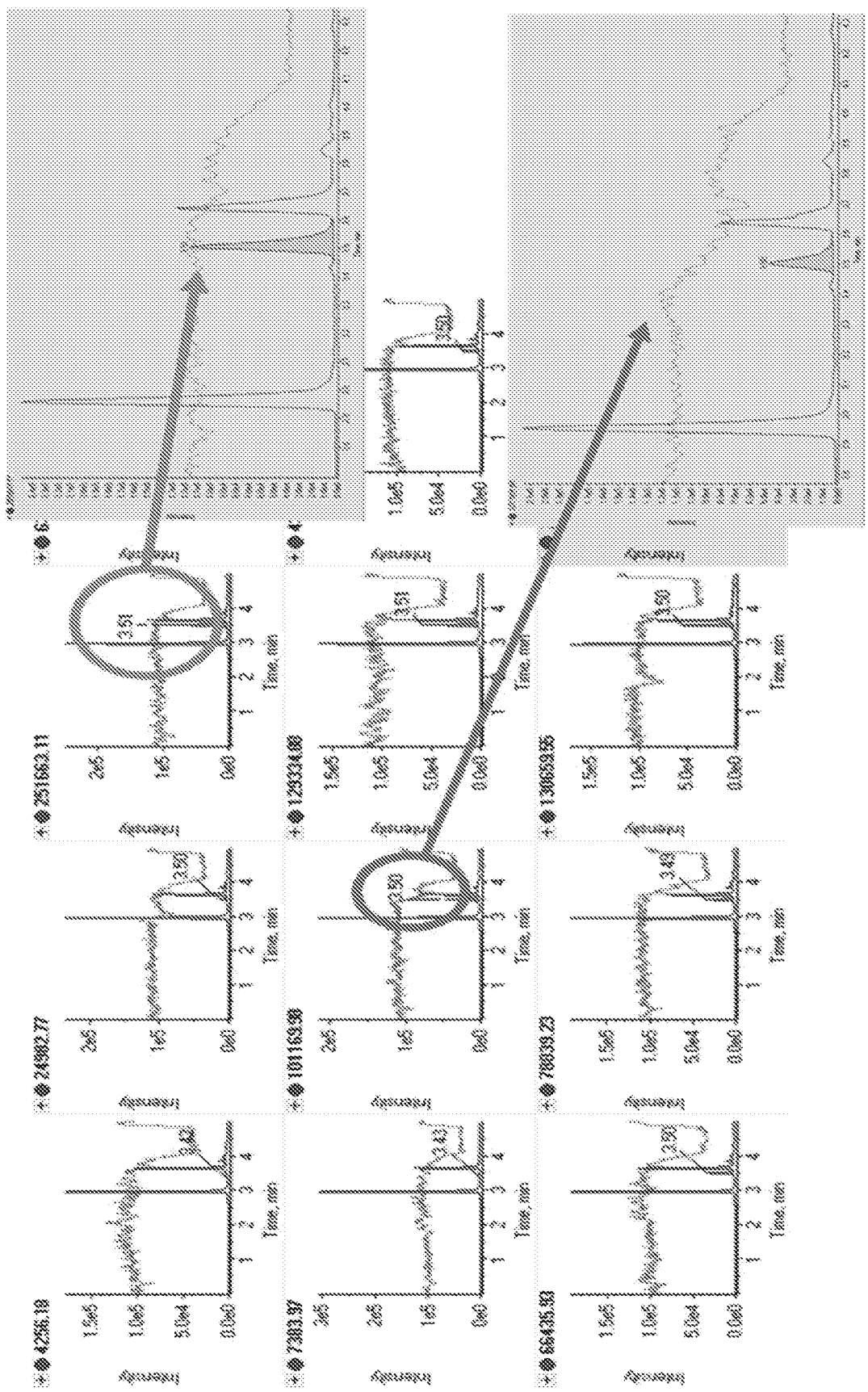
FIG. 12 illustrates chromatograms relating to the ionization suppression monitoring within a batch run of incurred rat plasma samples extracted by MTBE liquid-liquid extraction.

FIG. 12 illustrates the utility of the methods of the invention for monitoring for ionization suppression within a batch run of incurred rat plasma samples extracted by MTBE liquid-liquid extraction. The two chromatograms that are expanded and highlighted show the typical result with no ionization interference in the ion cluster analysis (green; top) and a single sample within the run that showed a slight change in response in the chromatographic region of the analyte peak (red; bottom). The change observed was used as a flag only that triggers investigative action for that sample. This is an example of using the methods of the invention for the continuous monitoring of atmospheric pressure ionization performance as it applies to quantitative bioanalysis.

Example 2: Detection and Resolution of Chromatographic Interference

Chromatographic detection using selected reaction monitoring (SRM) is the most commonly used technique for the analysis of biological samples by LC-MS. The technique is highly selective for the analyte of choice, providing a useful advantage for quantitative analysis. The exquisite selectivity of the technique also means that chromatographic interferences go undetected. Identifying and then fixing chromatography interference problems can be challenging when only SRM is used.

The methods of the invention have the advantage of being non-selective detection methods for compounds that interfere with atmospheric pressure ionization, including high concentration materials often the cause of column overloading and chromatographic interference. This can be a particular challenge for complex biological matrices. This example shows the utility of the methods of the invention for detecting and resolving a problem caused by very high levels of a sample component that affected both ionization and chromatographic peak shape.

Figure 13:
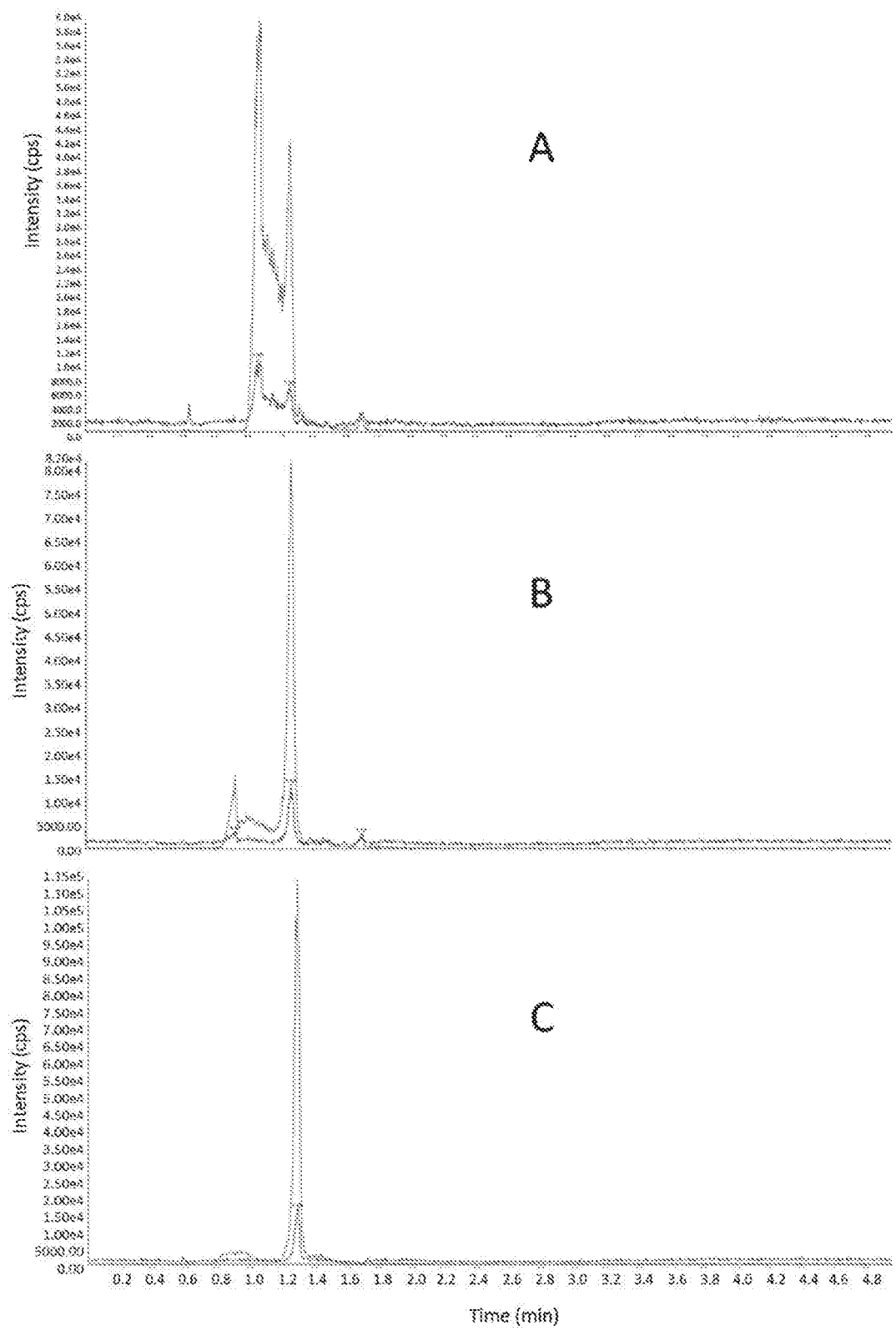
FIG. 13 illustrates SRM chromatograms of creatinine and D3 Creatinine run in positive ion electrospray on an API4000 Qtrap mass spectrometer using a water: acetonitrile gradient from a cell lysate sample.

FIG. 13 shows SRM chromatograms of creatinine and D3 Creatinine run in positive ion electrospray on an API4000 Qtrap mass spectrometer using a water: acetonitrile gradient from a cell lysate sample. Panel A shows chromatograms obtained with the starting gradient conditions. Panel B shows chromatograms using intermediate gradient conditions. Panel C shows the final gradient conditions. No cluster ion information was available for these chromatograms. These chromatograms in the figure represent the best practice result in the absence of cluster ion monitoring.

Figure 14:
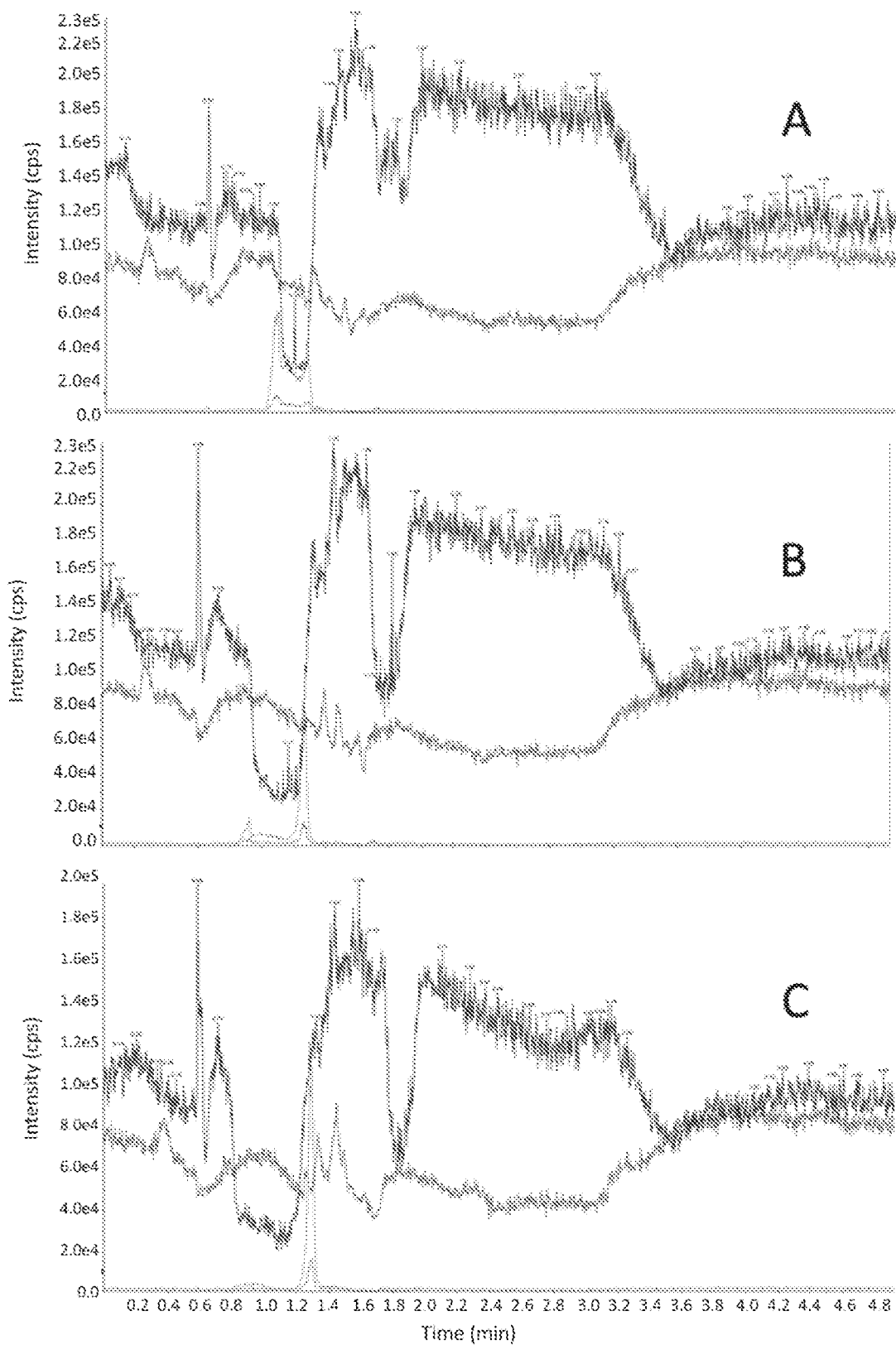
FIG. 14 illustrates experimental results for the samples in FIG. 10 with the solvent cluster ions included with the traditional analyte SRM traces.

FIG. 14 illustrates experimental results for the samples in FIG. 10 with the solvent cluster ions included with the traditional analyte SRM traces. The figure demonstrates the utility of the methods of the invention to identify the presence of interferences normally missed with SRM detection. Not only does the methods of the invention indicate an ionization interference, but the behavior of the cluster ion negative peak and the creatine peaks indicate chromatographic elution interference that was resolved using the data in FIG. 11 to guide development of an appropriate gradient. Without the cluster ion data (FIG. 10) it would not have been possible to determine that there was an interference that should be separated to resolve the problem.

Example 3: Cluster Ions as General Products of Atmospheric Pressure Ionization

The formation of clusters and charged clusters was studied extensively in the 1960's. The "declustering" or removal of the solvent from these charged clusters lead to the modern day utility of atmospheric pressure ionization as an analytical tool. By adding low amounts of energy to the cluster ions produced, the weak forces holding the clusters together were broken, thus allowing for the observation of a core charged molecule. Commercialized API mass spectrometers thus seek ways of removing charged clusters from the ions sampled and detected. The clusters of solvent and a core charge not related to a larger analyte are considered noise and eliminated from analysis. In this sense, it is widely accepted that all forms of atmospheric pressure ionization form charged clusters. The figures below are examples of the formation of charged cluster ions suitable for detecting and monitoring the performance of atmospheric pressure ionization processes, using positive and/or negative ion detection.

Figure 15:
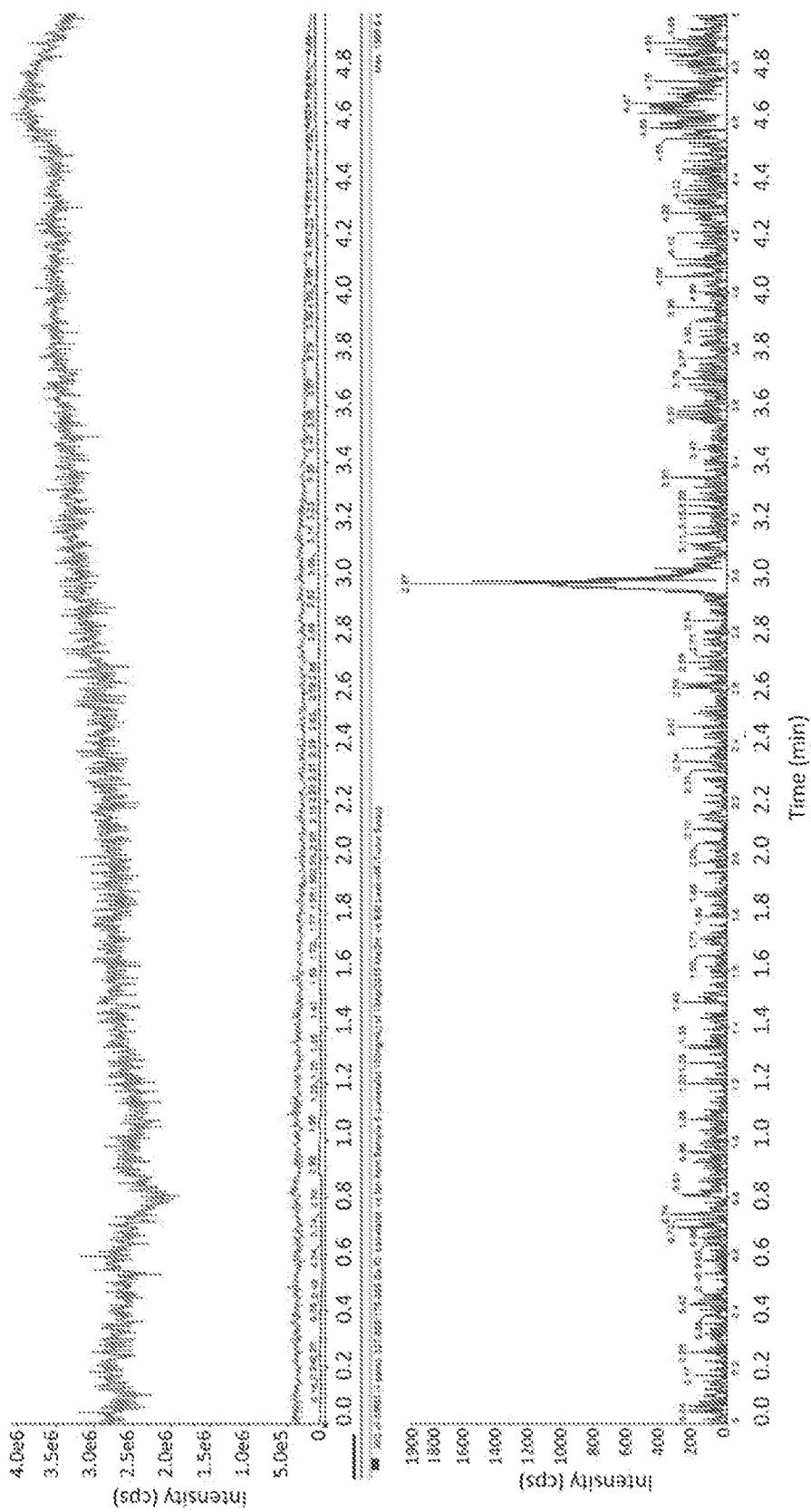
FIG. 15 illustrates a chromatogram obtained from injection of labetalol run in the negative electrospray ionization mode.

FIG. 15 shows the chromatogram from injection of labetalol run in the negative electrospray ionization mode. The column used was a Phenomenex Luna C8, 1 mm×50 mm, 3 μm particles at a mobile phase flow rate of 50 μl/min. Mobile phase was a simple linear methanol:water gradient running from 95% A (water); 5% B (methanol) to 5% A; 95% B over 5 minutes. The sample injected on the column was 5 μl of a 100 ng/ml solution of labetalol in 10% acetonitrile in water. The mass spectrometer used was an API4000 Qtrap. The traces shown in the top panel are from the solvent cluster ions identified under these conditions as suitable for cluster ion detection. The bottom panel is a typical selected reaction monitoring chromatogram for labetalol.

Figure 16:
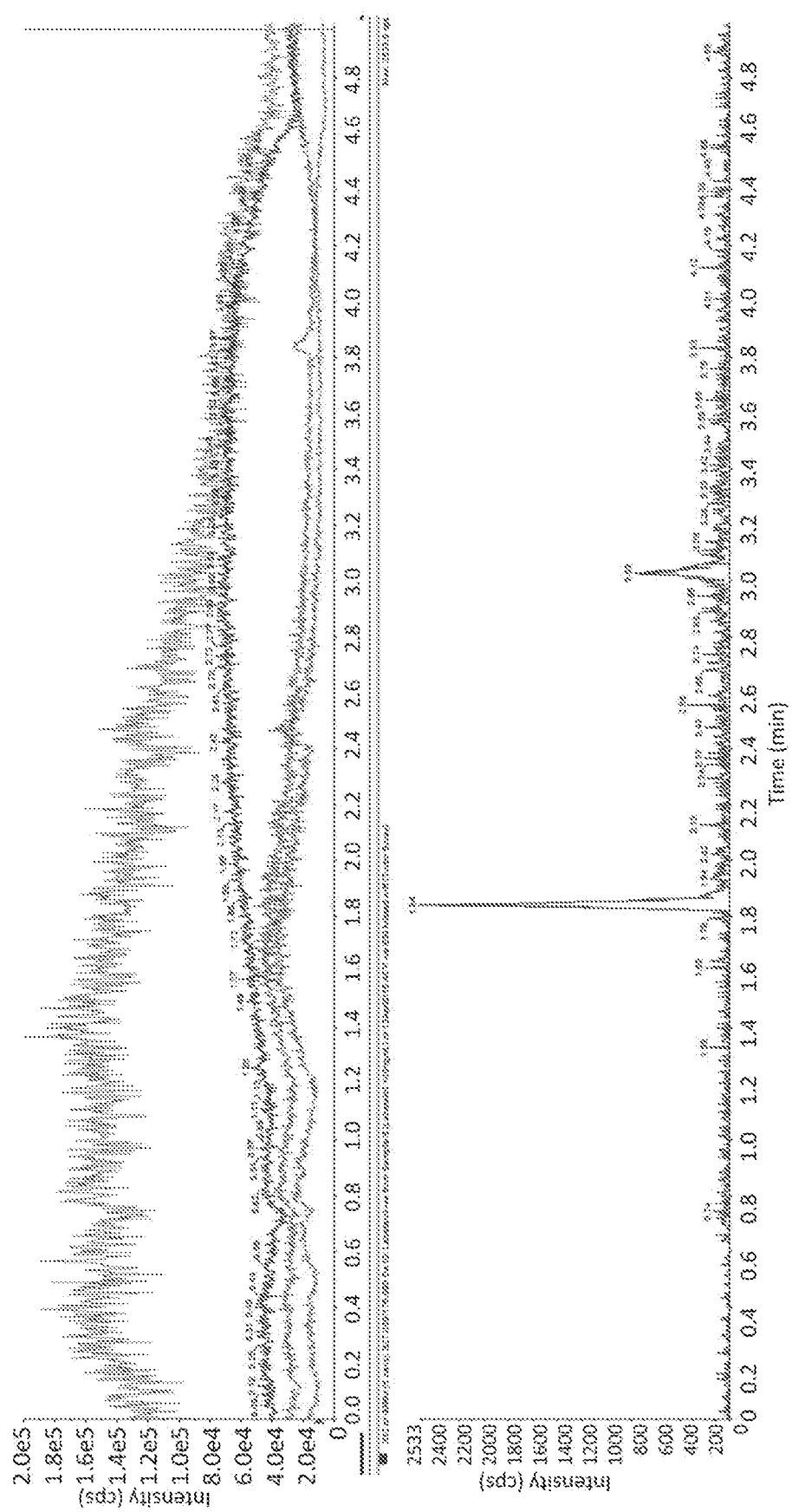
FIG. 16 illustrates chromatograms obtained from injection of labetalol run in the negative electrospray ionization mode.

FIG. 16 shows the chromatogram from injection of labetalol run in the negative electrospray ionization mode. The column used was a Phenomenex Luna C8, 1 mm×50 mm, 3 μm particles at a mobile phase flow rate of 50 μl/min. Mobile phase was a simple linear acetonitrile:water gradient running from 95% A (water); 5% B (acetonitrile) to 5% A; 95% B over 5 minutes. The sample injected on the column was 5 μl of a 100 ng/ml solution of labetalol in 10% acetonitrile in water. The mass spectrometer used was an API4000Qtrap. The traces shown in the top panel are from the solvent cluster ions identified under these conditions as suitable for cluster ion detection. The bottom panel is a typical selected reaction monitoring chromatogram for labetalol.

Figure 17:
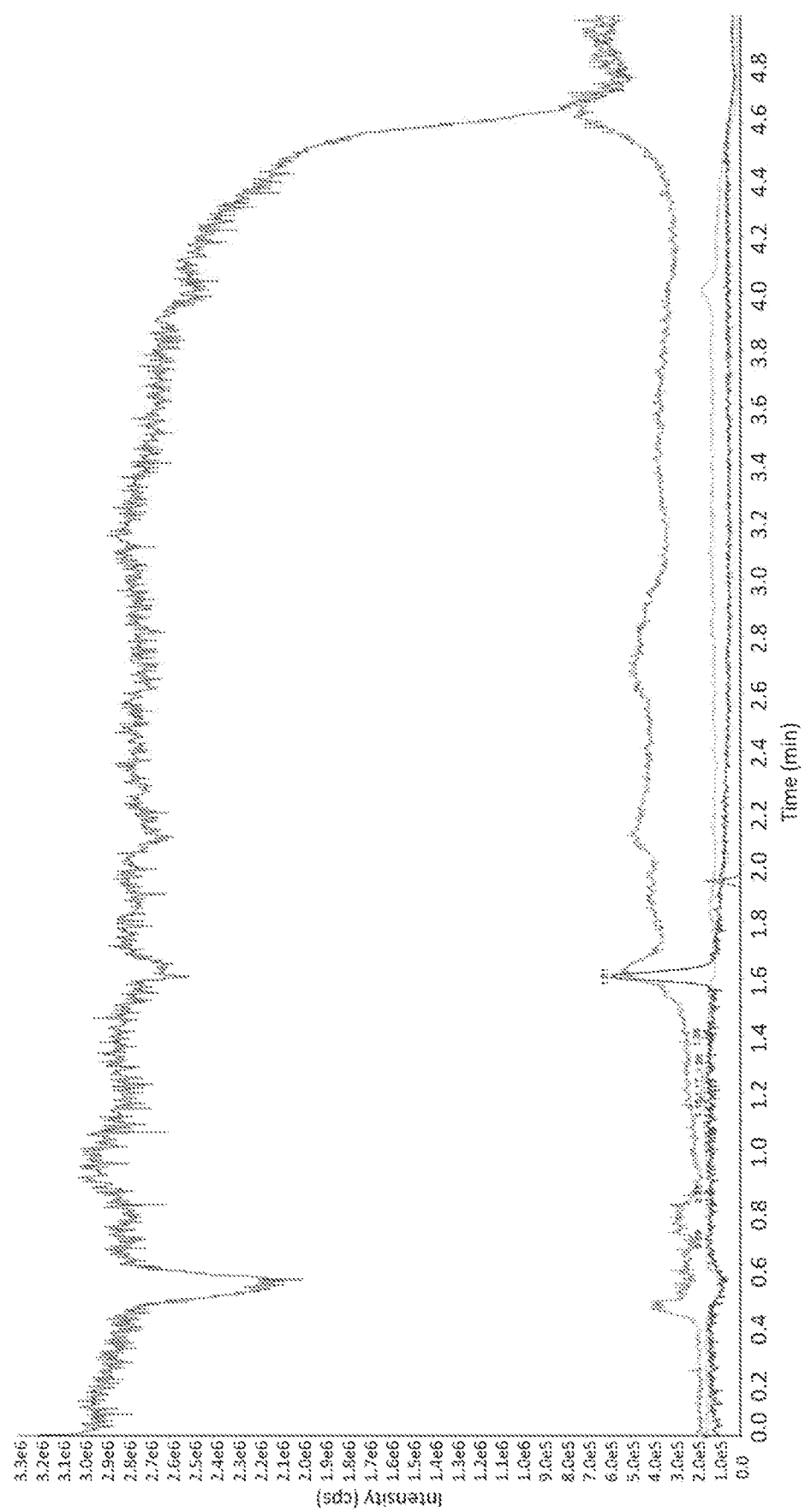
FIG. 17 illustrates chromatograms obtained from injection of labetalol and acetaminophen run in the positive atmospheric pressure ionization mode.

FIG. 17 shows the chromatogram from injection of labetalol and acetaminophen run in the positive atmospheric pressure ionization mode. The column used was a Phenomenex Luna C8, 1 mm×50 mm, 3 μm particles at a mobile phase flow rate of 50 μl/min. Mobile phase was a simple linear acetonitrile:water gradient running from 95% A (water with 0.1% formic acid); 5% B (acetonitrile with 0.1% formic acid) to 5% A; 95% B over 5 minutes. The sample injected on the column was 5 μl of a 100 ng/ml solution of labetalol and acetaminophen in 10% acetonitrile in water. The mass spectrometer used was an API4000 Qtrap. The traces shown are from the solvent cluster ions identified under these conditions (green, gray, and light blue; from top to bottom) and the typical selected reaction monitoring chromatogram for labetalol in blue and acetaminophen in red (peak between 1.8 and 2.0 min).

Example 4: Continuous Monitoring of API System Performance

State of the art API-MS systems offer little in the way of ion source performance monitoring. In some instances, total ion current is measured at the interface of the mass spectrometer. In some cases, the current drawn from the high voltage power supply is monitored and used to indicate major system failure. Changes in source performance go undetected in most cases and certainly are not monitored throughout a batch run. The methods of the invention allow for the performance of the ion source to be monitored any time that the solvent cluster ions are being detected. The examples below show the utility of the methods of the invention for detecting changes in source parameters. These changes might be used as an indication of a problem during an analysis, used to troubleshoot problems with the API source, and/or used to optimize the performance of the API source.

Figure 18:
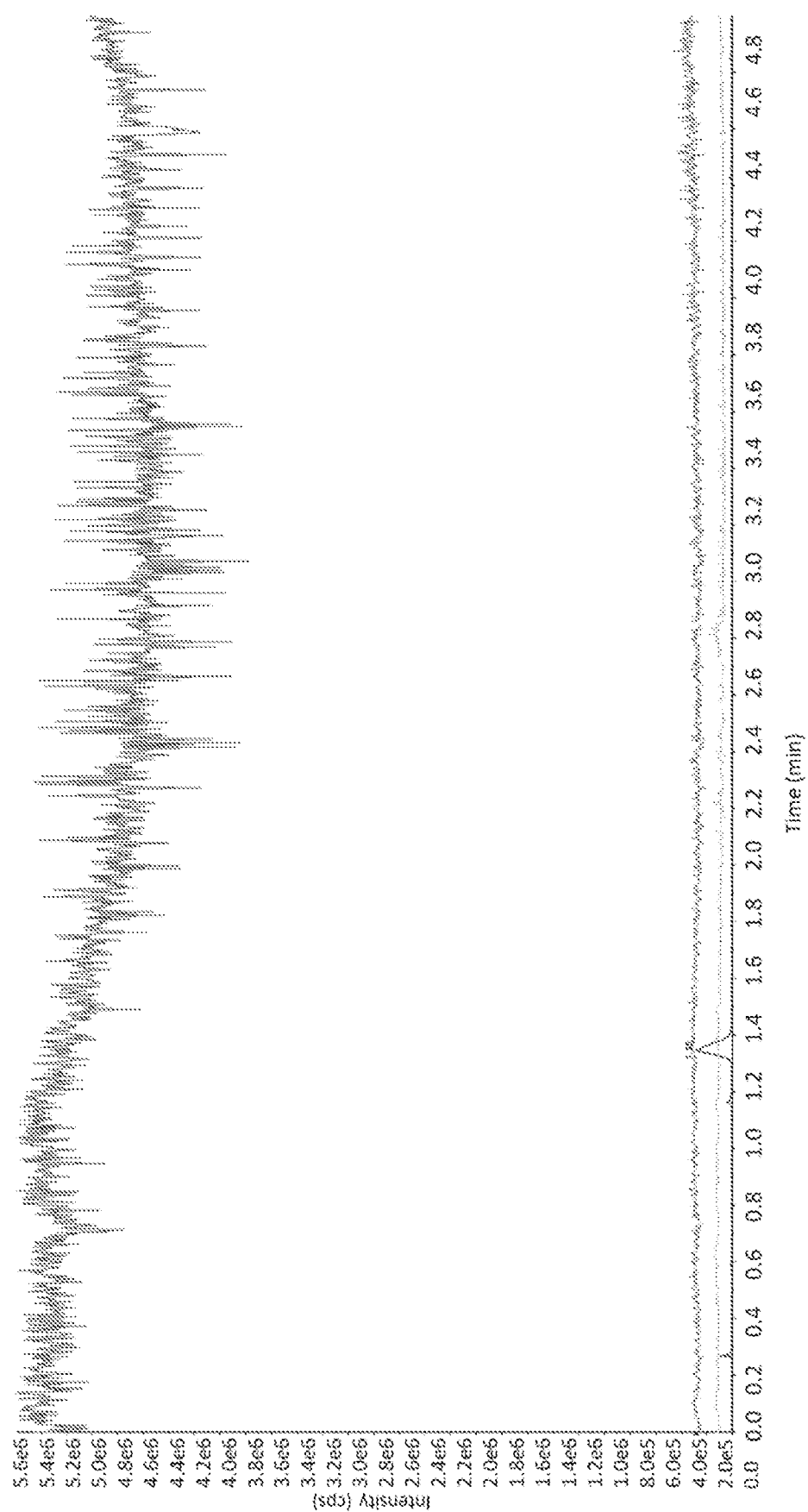
FIG. 18 illustrates chromatograms obtained for the injection of 10 ng/ml of labetalol on a 1 mm ID, 5 cm long Phenomenex Luna C8 column.

FIG. 18 shows results obtained for the injection of 10 ng/ml of labetalol on a 1 mm ID, 5 cm long Phenomenex Luna C8 column with elution by a simple linear 5 minute gradient running at 50 µl/min from 5% A (water with 0.1% formic acid) to 95% B (acetonitrile with 0.1% formic acid). The LC system was a Eksigent LC200 from Sciex. The mass spectrometer used in SRM mode was a Sciex 5500Qtrap. The green, gray, and light blue traces (from top to bottom) are solvent cluster ions identified as suitable for cluster ion monitoring with this mobile phase and ionization polarity. The cluster ion monitoring showed the expected patterns, indicating that the API process was performing as desired.

Figure 19:
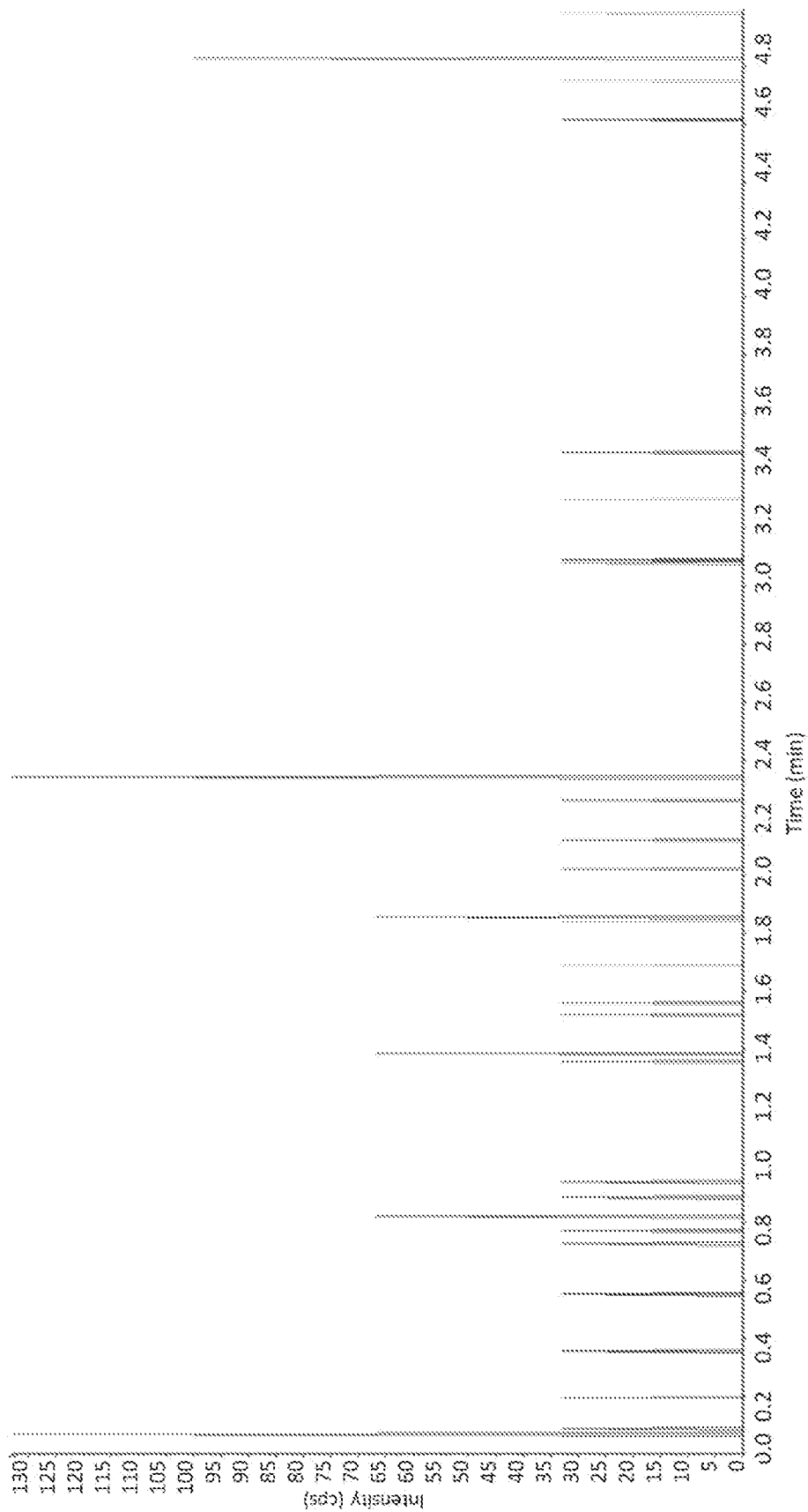
FIG. 19 illustrates a chromatogram obtained for an injection of a solution identical to the solution and instrumental system as FIG. 18, where the LC flow to the source was disconnected.

FIG. 19 shows results obtained for an injection of a solution identical to the solution and instrumental system as FIG. 18. The lack of a blue peak for labetalol might be due to any number of problems, including injection from the wrong location, an incorrect solution injected, injector failure, column plugging, loss of source voltage and other potential problems. The cluster ion monitoring showed no response at any point throughout the run. This indicates that no ions were being formed by the API source. In this case, the LC flow to the source was disconnected. The figures demonstrate the utility of the methods of the invention to detect LC-MS system failure.

Figure 20:
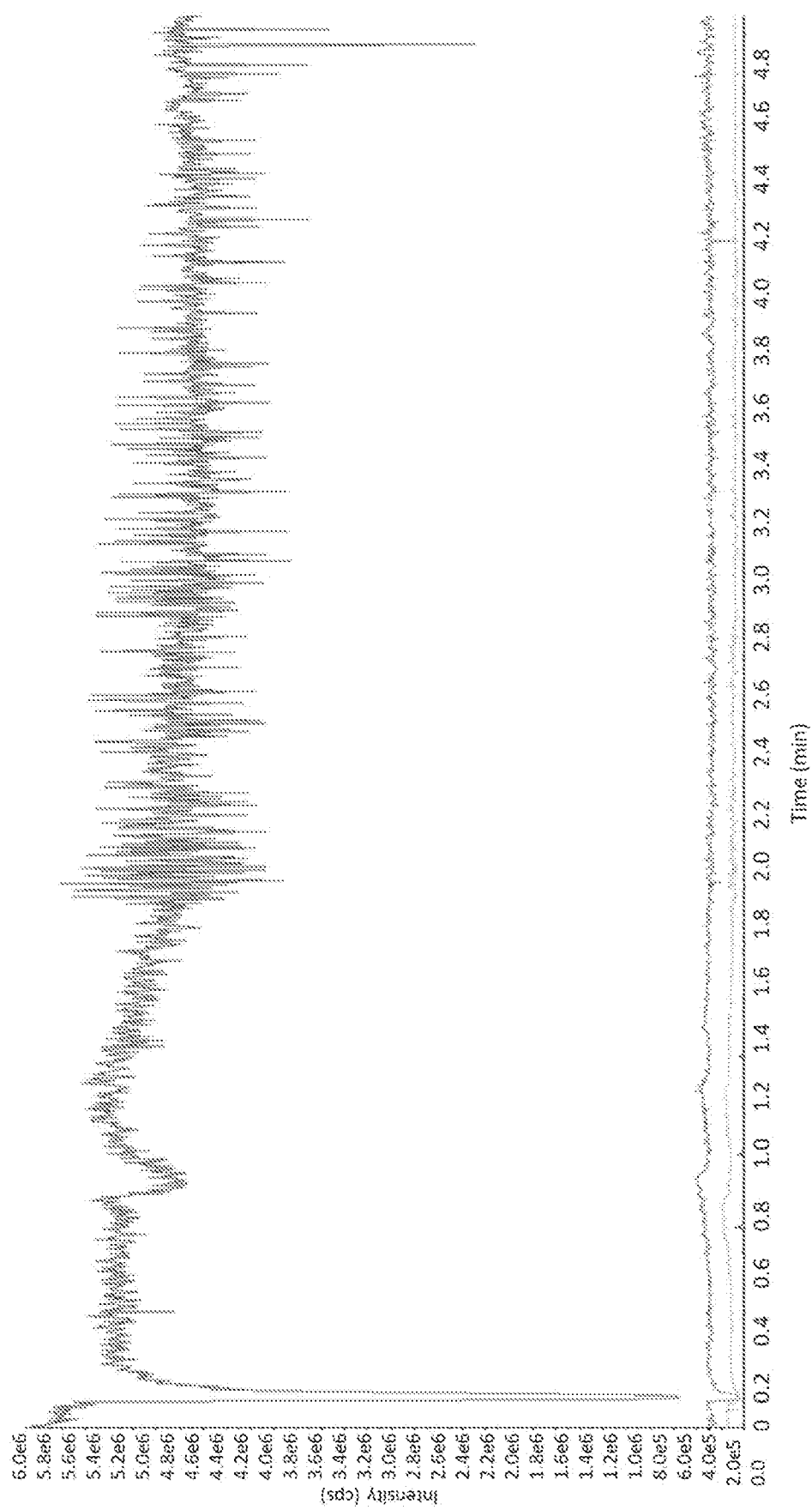
FIG. 20 shows results obtained for the same system described in FIG. 18, where the injector was set to inject to waste rather than to the column.

FIG. 20 shows results obtained for the same system described in FIG. 18. In this case, the cluster ion monitoring has the expected appearance, while the analyte labetalol was not detected in the data. Since the API source was functioning as indicated by the cluster ion monitoring, the lack of analyte may be due to an injection solution problem or an injector malfunction. In this case, the injector was set to inject to waste rather than to the column. The example demonstrates the utility of the methods of the invention for troubleshooting problems not directly caused by the API process, but that involve systems reliant upon API such as the LC-MS/MS system used in this example.

Example 5: API Source Tuning and Optimization

The ionization sources used for API often rely upon various physical inputs that must be optimized for each analyses. The degree of optimization required depends on the particular analysis. Best practice recommendations from analytical instrument manufacturers are to infuse the analyte of interest and optimize the source settings to produce the optimum signal for the analyte of interest. The source optimization is a combination of parameters that mainly affect the liquid spray and those that affect the declustering of the analyte ion.

The methods of the invention are ideally suited to optimization of the spray parameters, as they provide a continuous readout on the performance of the API system. When source conditions are set to produce high abundance and steady output of solvent cluster ions, those are also conditions that efficiently ionize other sample components. Optimization of cluster ion monitoring is by definition optimization of the ion source's ability to form ions. The data that follows demonstrates the utility of the methods of the invention for the optimization of API source conditions.

Figure 21:
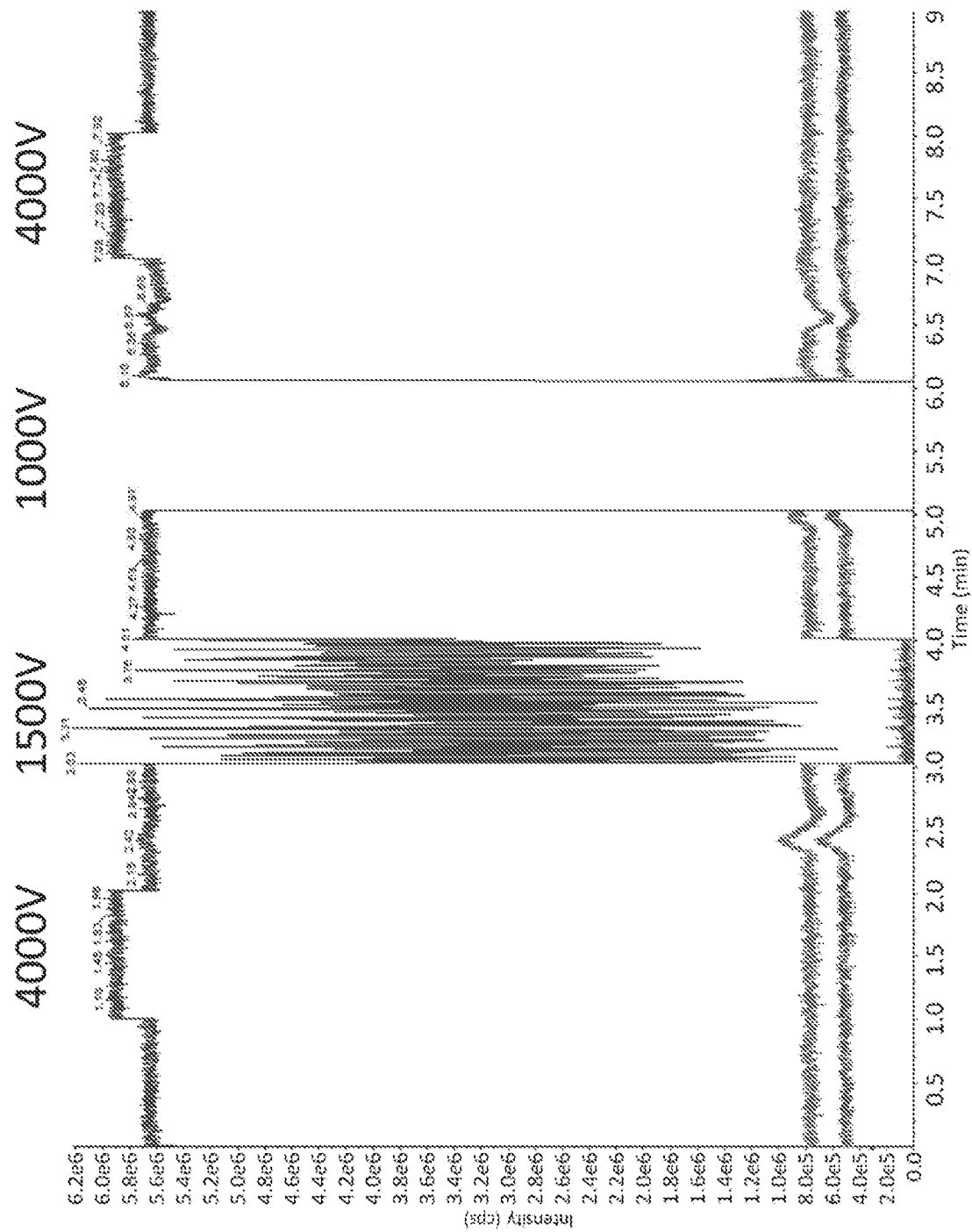
FIG. 21 illustrates chromatograms relating to the effect on solvent cluster ions chosen for the positive ion water/acetonitrile mobile phase system as a function of ionization voltage.

FIG. 21 shows the effect on solvent cluster ions chosen for the positive ion water/acetonitrile mobile phase system as a function of ionization voltage. The changes in intensity of the solvent cluster ions follow the expected pattern for the corresponding change in ionization voltage. The data demonstrate the utility of the methods of the invention for detecting changes in ionization voltage as well as the utility for optimization of the ionization voltage. The data was collected using continuous 50 µl/min flow of 5% acetonitrile in water with 0.1% formic acid into a Sciex 5500 Qtrap mass spectrometer operating in positive ion electrospray.

Figure 22:
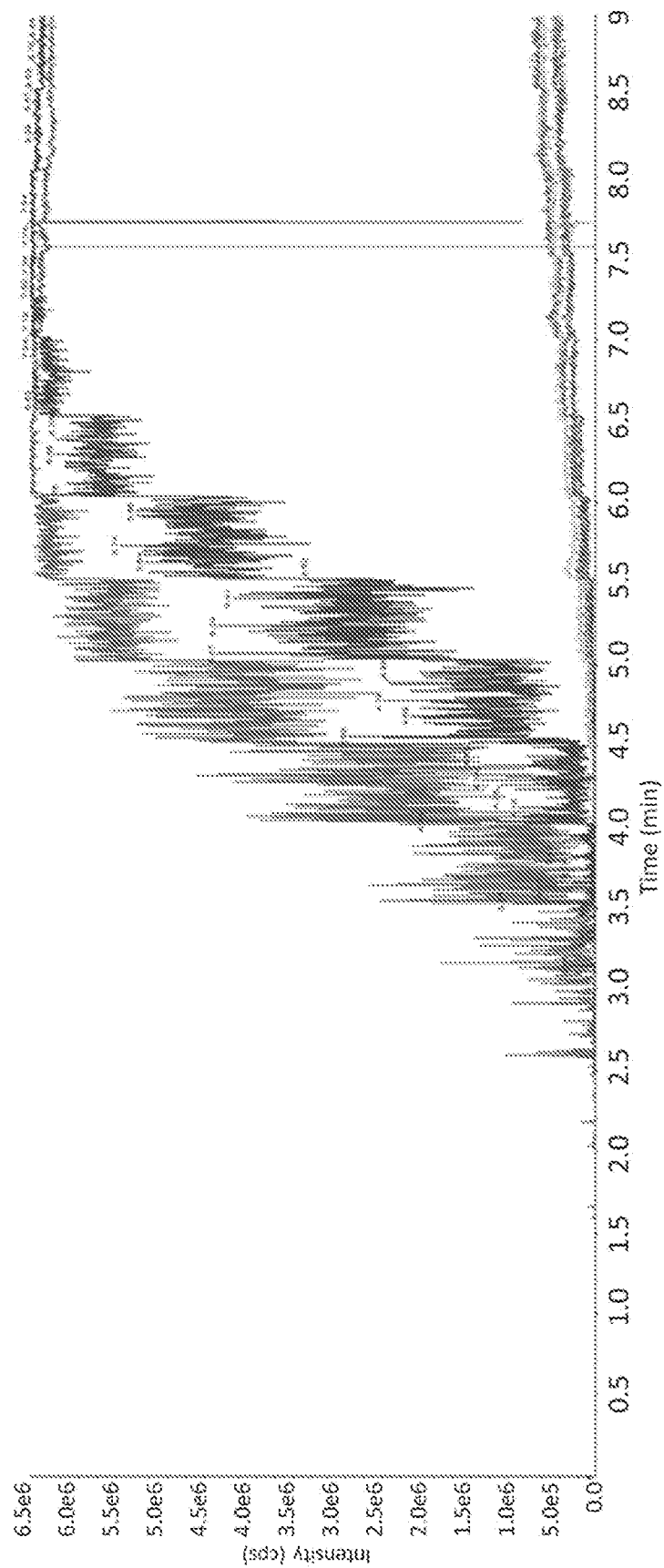
FIG. 22 illustrates chromatograms relating to the response for the solvent cluster ions chosen for cluster ion monitoring for the acetonitrile (0.1% formic acid):water (0.1% formic acid) mobile phase in positive ion electrospray ionization.
Figure 23:
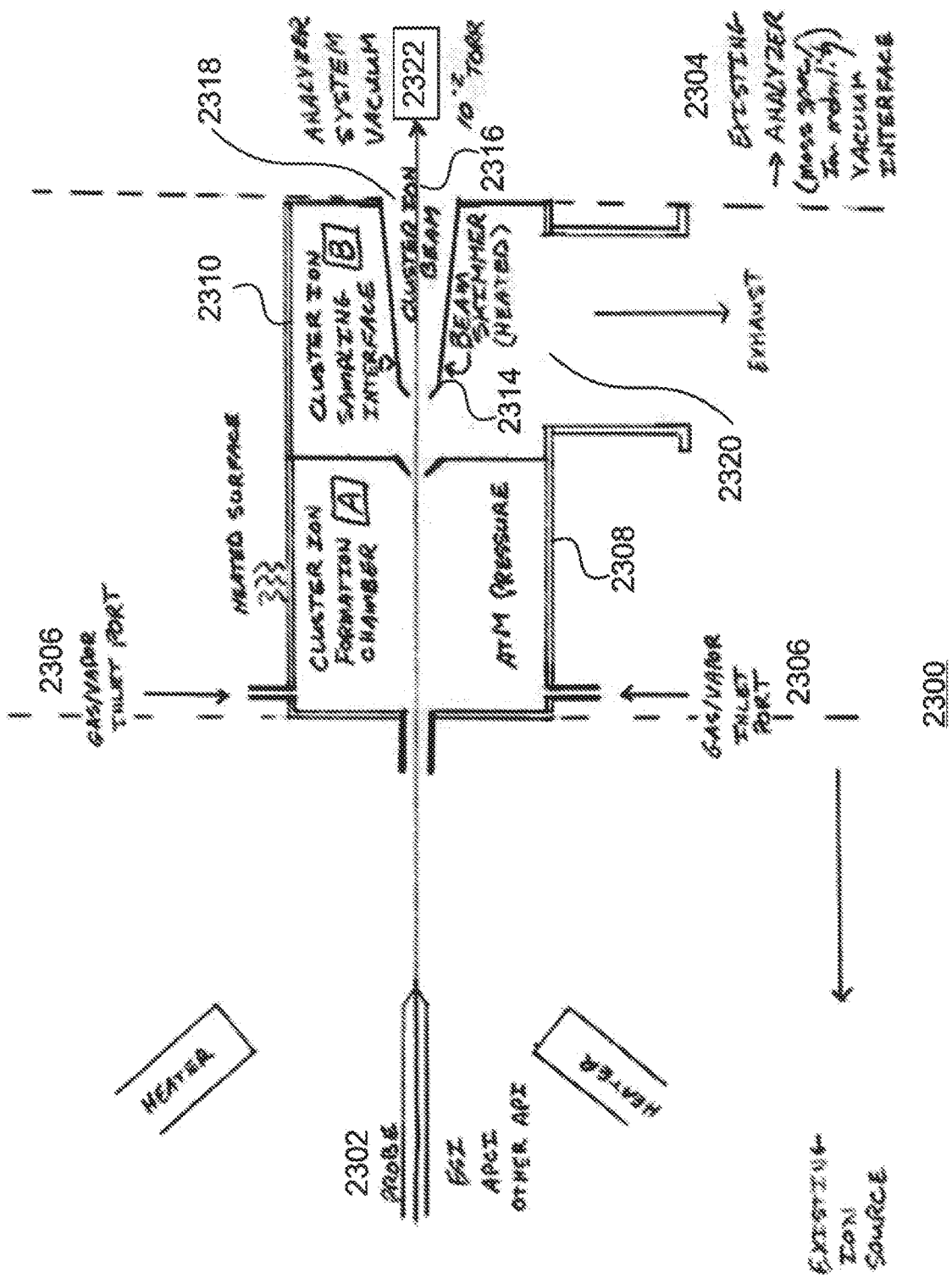
FIG. 23 illustrates a system 2300 for isolating and measuring cluster ion beams from sample ions generated by an ion source according to embodiments of the invention.

FIG. 22 shows the response for the solvent cluster ions chosen for cluster ion monitoring for the acetonitrile (0.1% formic acid):water (0.1% formic acid) mobile phase in positive ion electrospray ionization as the electrospray voltage was ramped in 250 volt steps from 0 volts to 4750 volts. The graph shows the overlay of the voltage ramp conducted at 350° C. and 450° C. For the largest responding ion, the pink trace (top trace at t=8.0 min)) was 450° C. and the blue trace (next to top trace at t=8.0 min) was 350° C. A number of features demonstrate the utility of the methods of the invention for optimization of source temperature and ionization voltage. The stepwise increase in response as a function of voltage was readily observed. The saturation of the detection system was evident in the pink and blue traces, while the lower responding ions red, green, light blue and gray (bottom four traces) continued to increase with increasing ionization voltage. The steady difference in response as a function of source temperature was also evident in the cluster ion monitoring, with the 450° C. temperature giving a consistently higher response than the 350° C. temperature. The data was collected using continuous 50 µl/min flow of 5% acetonitrile in water with 0.1% formic acid into a Sciex 5500 Qtrap mass spectrometer operating in positive ion electrospray.

Example 6: Method for Continuous Monitoring of Electrospray Ion Formation

As demonstrated herein, incompletely desolvated cluster ions formed during ionization provide a convenient way to continuously monitor the consistency of the ionization process. Changes in ionization conditions that alter ion yield (such as temperature, voltage, spray solvent composition, mass flow, ion source gasses and current) can be detected as changes in the abundance of solvated cluster ions. Changes in the ability of the ionization process to form ions, caused by components of injected samples (commonly known as ionization suppression or matrix effect), can be detected as a change in the abundance of cluster ions formed. Cluster ions can be used to continuously monitor the ionization process both within a chromatogram and between discrete samples across a batch.

API is routinely used for quantification of a variety sample types and analytes. As described elsewhere herein, quantification using electrospray and related ion sources is plagued by variability in analyte response due to factors other than the amount or the concentration of analyte. The interference in the rate and extent of ion formation has been called ion suppression, matrix effect, ionization suppression and ionization enhancement. The terms are often used interchangeably but result from the same fundamental processes that lead to the formation of ions by electrospray mechanisms. Ionization such as desorption electrospray ionization, extractive electrospray spray, and ion spray all operate on electrospray ionization (ESI) mechanisms and as such are susceptible to ion suppression.

In certain embodiments, an ideal monitoring tool is capable of detecting changes in the system that alter the rate or extent of ion formation. It requires neither additional time, additional equipment nor added chemistry. To that end, the present invention identifies solvent cluster ions as indicators of the health of the atmospheric pressure ionization system. Cluster ions are favored at atmospheric pressure in a vapor saturated environment. Charged particles in vapor at or above atmospheric pressure spontaneously form solvated charge or cluster ions.

Instrument designers and manufacturers have developed highly efficient means of reducing the transmission of cluster ions of all types. To see the analyte of interest at a predictable and useful m/z, declustering was implemented in the form of heated capillaries and countercurrent gas. In addition to just stripping solvent from analyte ions, efforts to reduce cluster also reduced the baseline noise in an ESI spectrum, providing increased sensitivity while maintaining selectivity.

However, not all of the solvent cluster ions are eliminated from entering the mass analyzer. Solvent clusters can provide a continuous readout on the health of the ionization system, because a factor that changes the response for the cluster ions also produces a change in all ions. In certain embodiments, cluster ions are formed in high abundance when the source is working properly. When cluster ions are no longer being formed at the same rate, a changed that affects the formation rate of all ions, including analyte ions, is detected. Careful adjustment of the instrument settings permits solvent cluster ions to be observed and used as indicators of the performance of the API-MS system.

The studies presented here show that cluster ions are produced by API sources in high abundance and that monitoring changes in abundance of the solvent cluster ions is a useful tool for continuous monitoring of the overall API process.

Experimental

Ion Source Adjustment Experiments

A Sciex 5500Qtrap mass spectrometer with an Eksigent microLC 200 system connected to the TurboV Ionspray source was used. Data were collected in the Manual Tune mode of the Sciex Analyst 1.6.2 software. The data were collected at a flow rate of 50 µl/min composed of 50% water (A) and 50% acetonitrile (B) each containing 0.1% formic acid. The built in Harvard infusion pump supplied a constant 7 µl/min flow of 10 µg/mL acetaminophen through the tee-junction on the TurboV ion source. The combined flow from the Eksigent pumps and the infusion pump entered the ion source as a single, mixed stream.

The instrument was operated in positive ion mode with curtain gas setting of 40, source temperature of 350° C., gas 1 at setting 30, gas 2 at setting 50, and an entrance potential of 10 volts (V). Acetaminophen was monitored by SRM with a mass transition from m/z 152 to m/z 110 at a collision energy (CE) of 30 V and declustering potential (DP) of 60 V. The cluster ion at m/z 83 was monitored using a pseudo-SRM transition from m/z 83 to m/z 83 at a CE of 5 V and DP of 20 V. Data was acquired for approximately 30 seconds at each ion spray voltage setting tested. Similar data sets were acquired for a range of source gas and temperature settings.

Identification of Cluster Ions

The experiments performed to identify potential cluster ions for monitoring ionization performance were conducted on a Sciex 6500Qtrap with an Eksigent microLC 200 system connected to the IonDrive ionspray source. Data were collected in the Manual Tune mode of the Sciex Analyst 1.6.2 software. The data shown were collected at a flow rate of 50 µl/min composed of 95% water (A) and 5% acetonitrile (B) each containing 0.1% formic acid. Typical source settings were curtain gas setting of 40, source temperature of 450° C., gas 1 and gas 2 set at 30, and an entrance potential of 10 V. Single quadrupole full scan spectra and neutral loss spectra were obtained by summing ten scans at each of the evaluated declustering potentials at a scan rate of 200 Da/sec. Product ions of potential cluster species were acquired with a collision energy of 5 V and a collision cell exit potential of 15 V unless otherwise noted.

Model Ion Suppression Experiments

Polyethylene glycol 1000 (PEG 1000) and bovine serum albumin (BSA) were purchased from Sigma-Aldrich (St. Louis, Mo., USA). Phosphate buffered saline (PBS), HPLC grade acetonitrile, methyl-t-butyl ether (MtBE) and formic acid were purchased from Thermo Fisher Scientific (USA). Control plasma treated with $K_2$EDTA was purchased from Lampire Biological Laboratories (Ottsville, Pa., USA). The data were collected on a Sciex 5500 Qtrap mass spectrometer interfaced to a Perkin Elmer series 200 autosampler and series 200 micro pumps. The HPLC column was a Supelco (Bellefont, Pa., USA) Discovery C8, 2.1 mm×50 mm, run at 500 µl/min. The mobile phase was water (A) and acetonitrile (B) containing 0.1% formic acid. A linear gradient from 5% to 95% mobile phase B (acetonitrile containing 0.1% formic acid) over five minutes was used for all chromatographic separations. Ten µg/mL solutions of the drugs acetaminophen and labetalol were infused post-column at 5 µl/min. For each determination, 10 µl of each model interference was injected.

A protein precipitation was prepared from 300 µl of control $K_2$EDTA treated human plasma with an addition of 600 µl of acetonitrile containing 0.1% formic acid. The sample was vortex-mixed and centrifuged at 4000 rpm for ten minutes. The supernatant was removed to a clean plastic tube and evaporated to dryness under air at 50° C. Extracts were reconstituted in 100 µl of 20% acetonitrile/water for injection.

A liquid-liquid extract (LLE) was prepared from 200 µl of control $K_2$EDTA-treated human plasma to which 200 µl of 50 mM pH 7.2 PBS and 1 mL of MtBE were added. The sample was vortex-mixed for 10 minutes, centrifuged at 4000 rpm for 10 minutes to separate the organic and aqueous layers, then placed in a dry ice-methanol bath to freeze the aqueous layer. The organic layer was poured off into a clean plastic tube and the MtBE evaporated to dryness under air at 50° C. Extracts were reconstituted in 100 µl of 50% methanol/water for injection.

The mass spectrometer was operated in positive ion mode with curtain gas set to 40, source temperature of 450° C., gas 1 set at 40, gas 2 set at 50, and an entrance potential of 10 V. Acetaminophen was monitored by SRM with a mass transition from m/z 152 to m/z 110 at a CE of 30 V and a DP of 60 V. Labetalol was detected with an SRM transition from m/z 329 to m/z 162 at a CE of 35 V and a DP of 80 V. The cluster ion at m/z 83 was monitored using a pseudo SRM transition from m/z 83 to m/z 83 at a CE of 5 V and DP of 20 V.

Renin Assay Conditions

Plasma renin activity samples are prepared by incubation of rat plasma at 37° C. for two hours, followed by a two hour cold centrifugation at 3000 rpm through Ultracel-10 Multiscreen filter plates from Millipore (Cork, IRL) to recover the angiotensin I formed. Stable isotope-labeled (SIL) angiotensin I was purchased from New England Peptide (Gardner, Mass., USA) and used as the internal standard. HPLC separation was performed on an ACE 3 C18-300, 50×1.0 mm column purchased from Mac-Mod Analytical (Chadds Ford, Pa., USA), with a two-step gradient from 5% B to 40% B in 1.2 minutes, then to 95% B over 0.5 minutes, held at 95% B for 0.3 minutes, and returned to starting conditions over 0.3 minutes where it re-equilibrated for one minute.

Figure 27A:
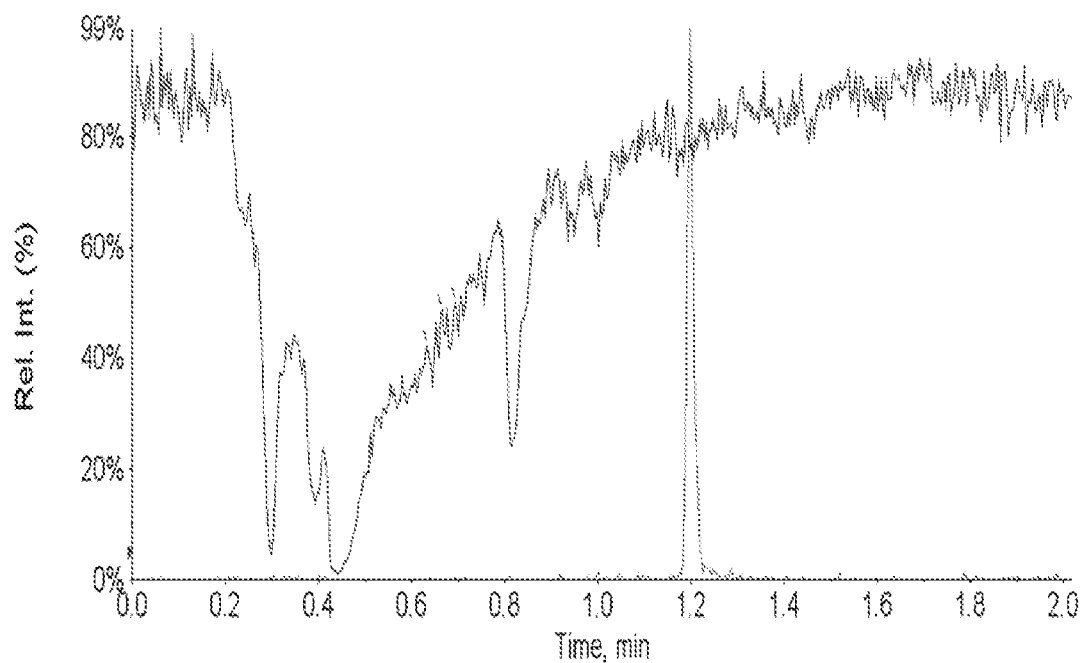
FIGS. 27A-27B illustrate overlaid chromatograms for the cluster ion at m/z 83 (black) and SIL-angiotensin I (red; peaks around 1.2 min).
Figure 27B:
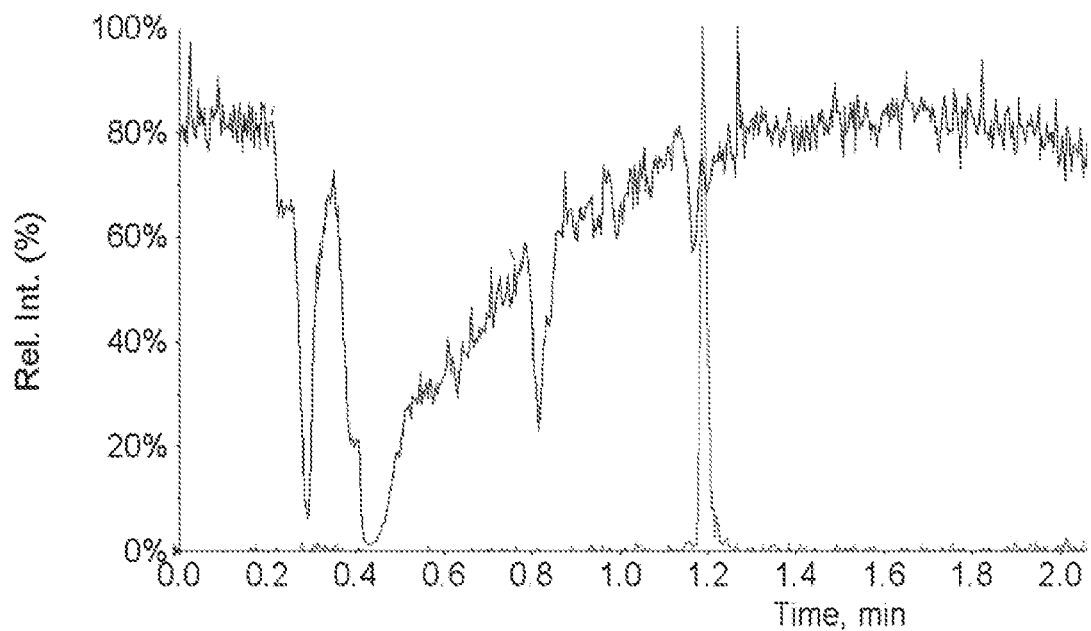
Figure 28A:
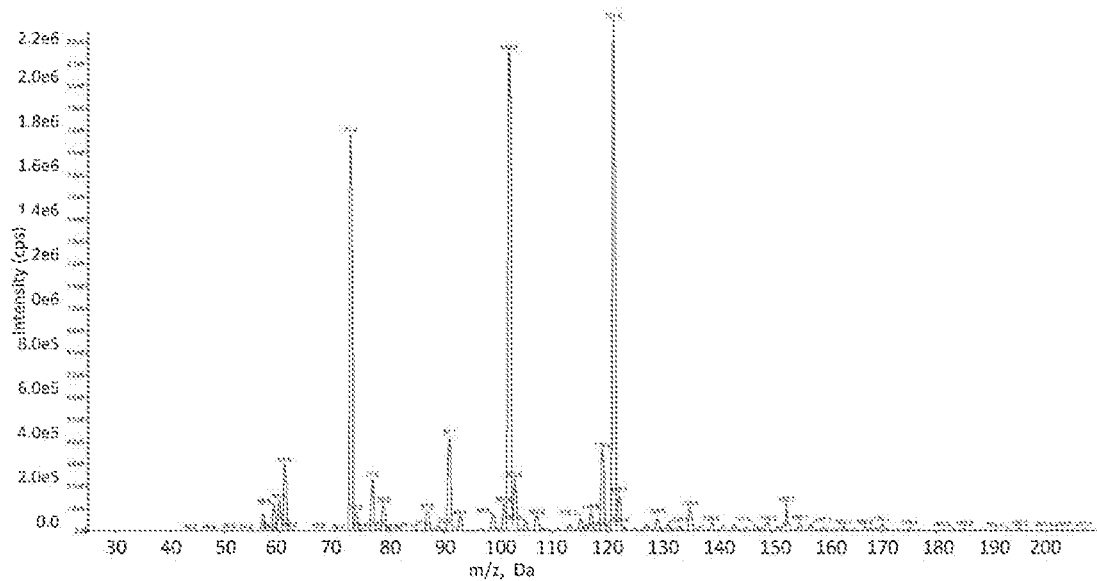
FIG. 28A illustrates a spectrum illustrating full scan data of those ions experiencing a water neutral loss (loss of 18 m/z) when spray composition is 95% water and 5% acetonitrile with 0.1% formic acid (from 25 Da to 250 Da). Following the neutral losses corresponding to solvent molecules can identify ions that are only partially desolvated.
Figure 28B:
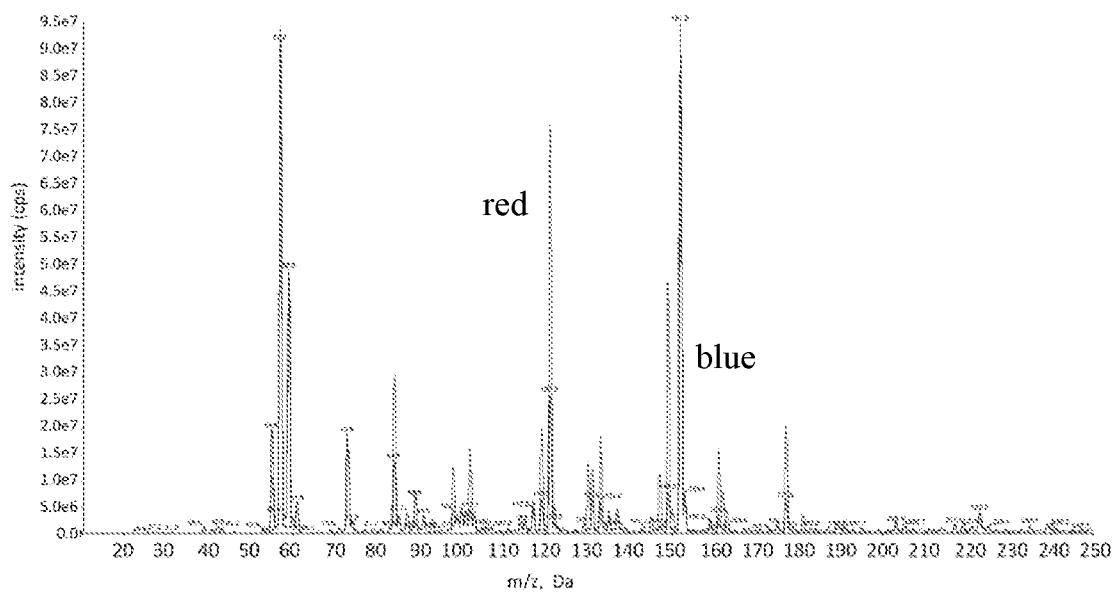
FIG. 28B illustrates a spectrum illustrating full scan data of ions when spray composition in 95% water and 5% acetonitrile with 0.1% formic acid with an instrument declustering potential (DP) of 20V (red trace) and 80V (blue trace). Ions with significantly higher abundance at lower DP than higher DP are likely to be ions that contain charge nucleus but group with neutral solvent molecules to form solvated cluster ions.
Figure 29:
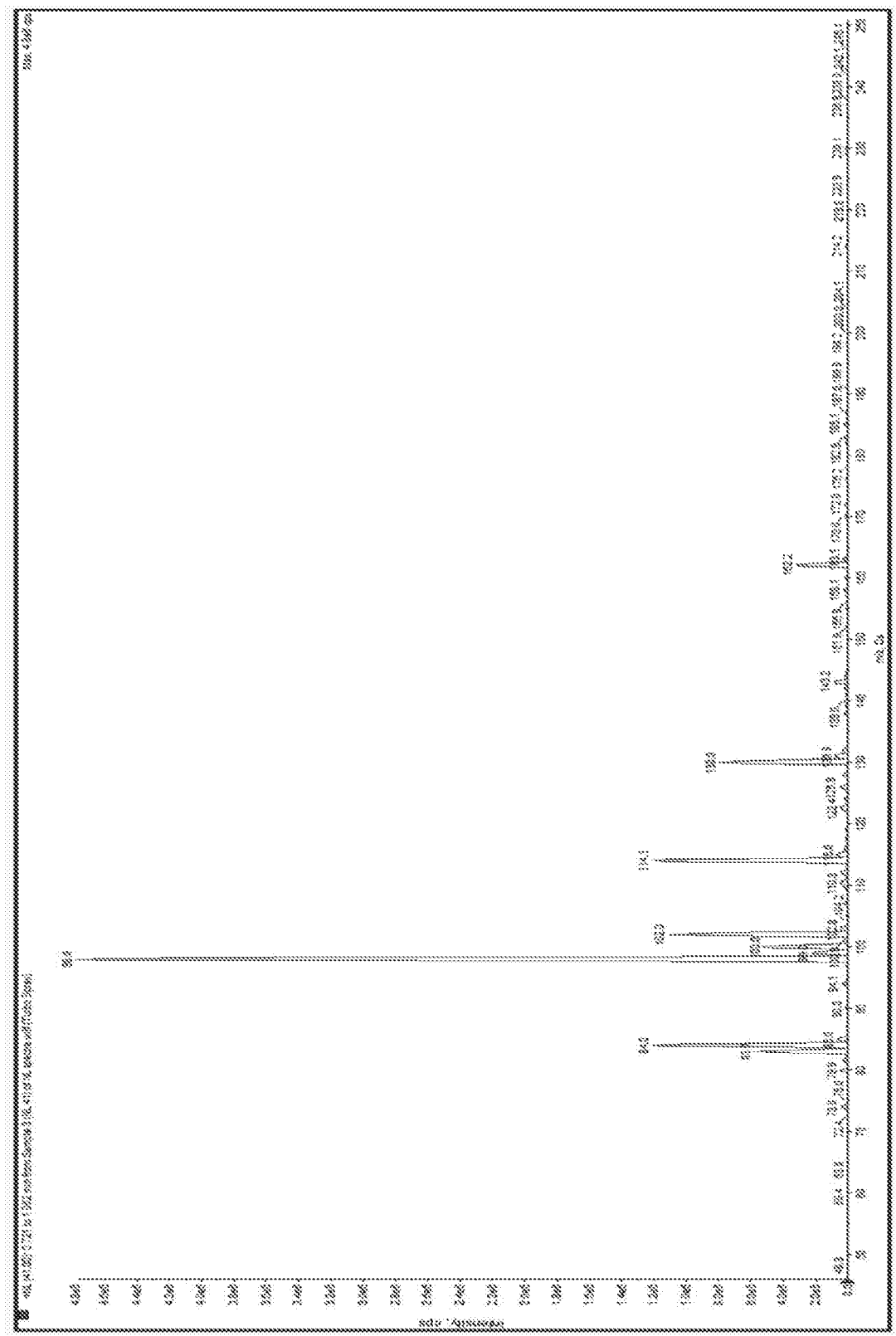
FIG. 29 illustrates a spectrum illustrating a full scan spectrum from a neutral loss of 41 scan on the 6500 Qtrap at a declustering potential of 20 volts with 50 μl/min flow of 95% water with 0.1% formic acid; 5% acetonitrile with 0.1% formic acid. The ions at m/z 83, 84, 98, 100, 102, 114, 130, and 162 all lose a neutral equivalent to 41 Da, the neutral mass of acetonitrile.
Figure 30:
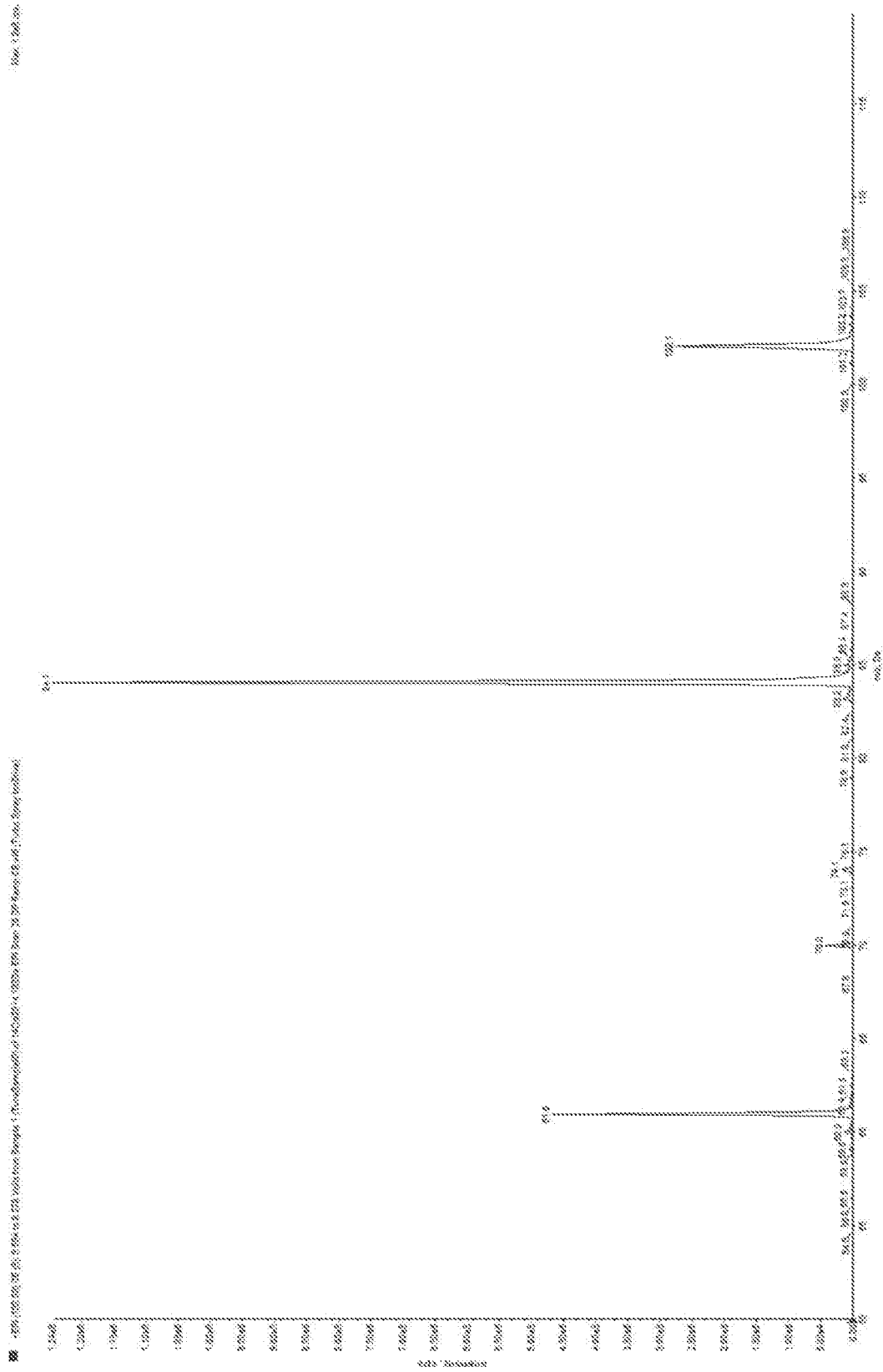
FIG. 30 illustrates an enhanced product ion scan of previously identified cluster ion (102.1 m/z) showing a neutral loss of water (18 m/z). Fragmentation scans of cluster ions identified by changes in abundance at high and low declustering potentials can demonstrate the existence of a neutral loss, confirming that the charge nucleus of the cluster ion indeed carries solvent with it through the mass spectrometer.
Figure 32:
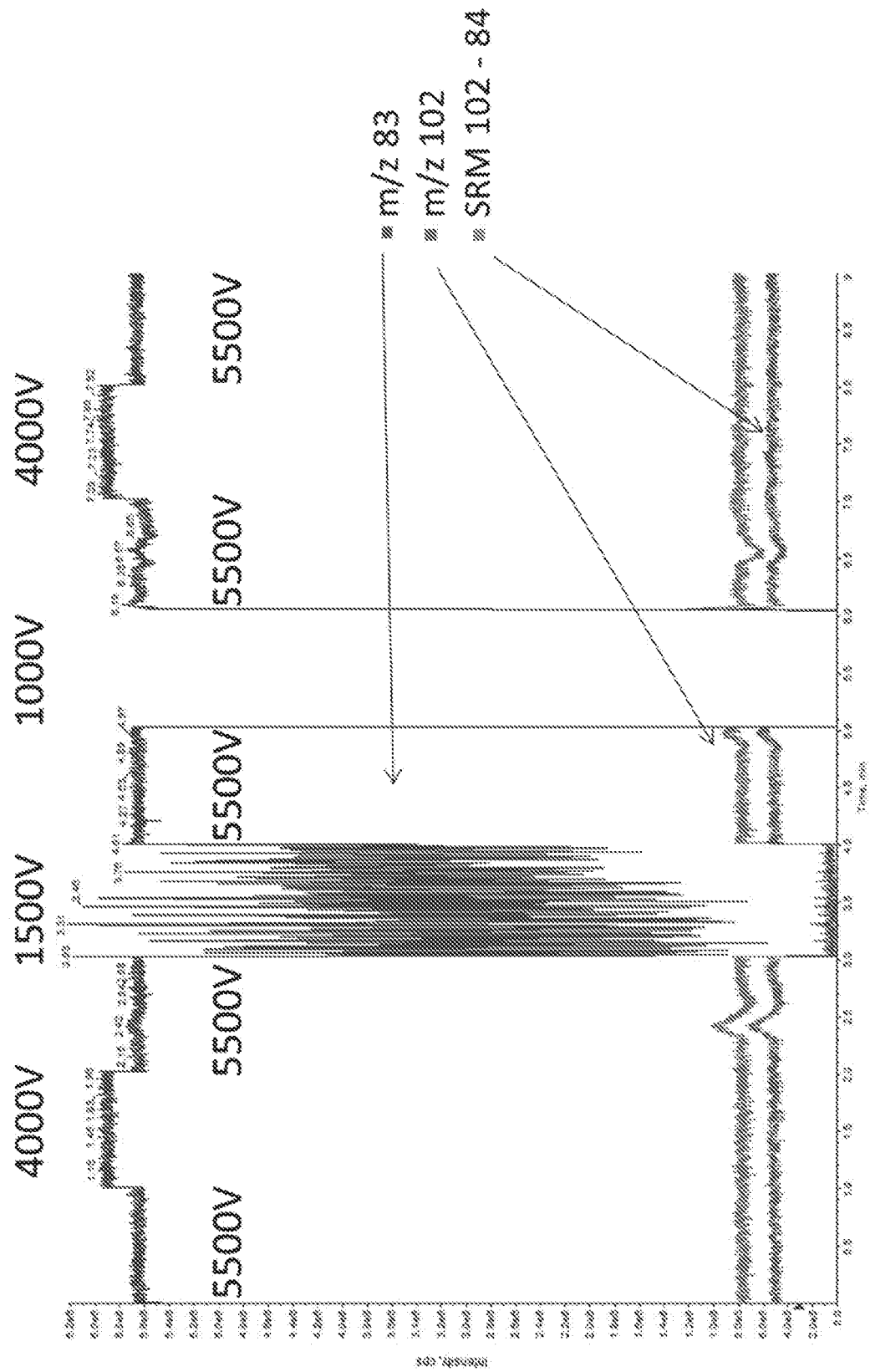
FIG. 32 illustrates abundance of selected cluster ions in spray consisting of 50% acetonitrile, 50% water, and 0.1% formic acid at different electrospray voltages (ISVs). Note that at low voltages the spray becomes unstable (1500V) or complete fails to form ions (1000V).
Figure 33:
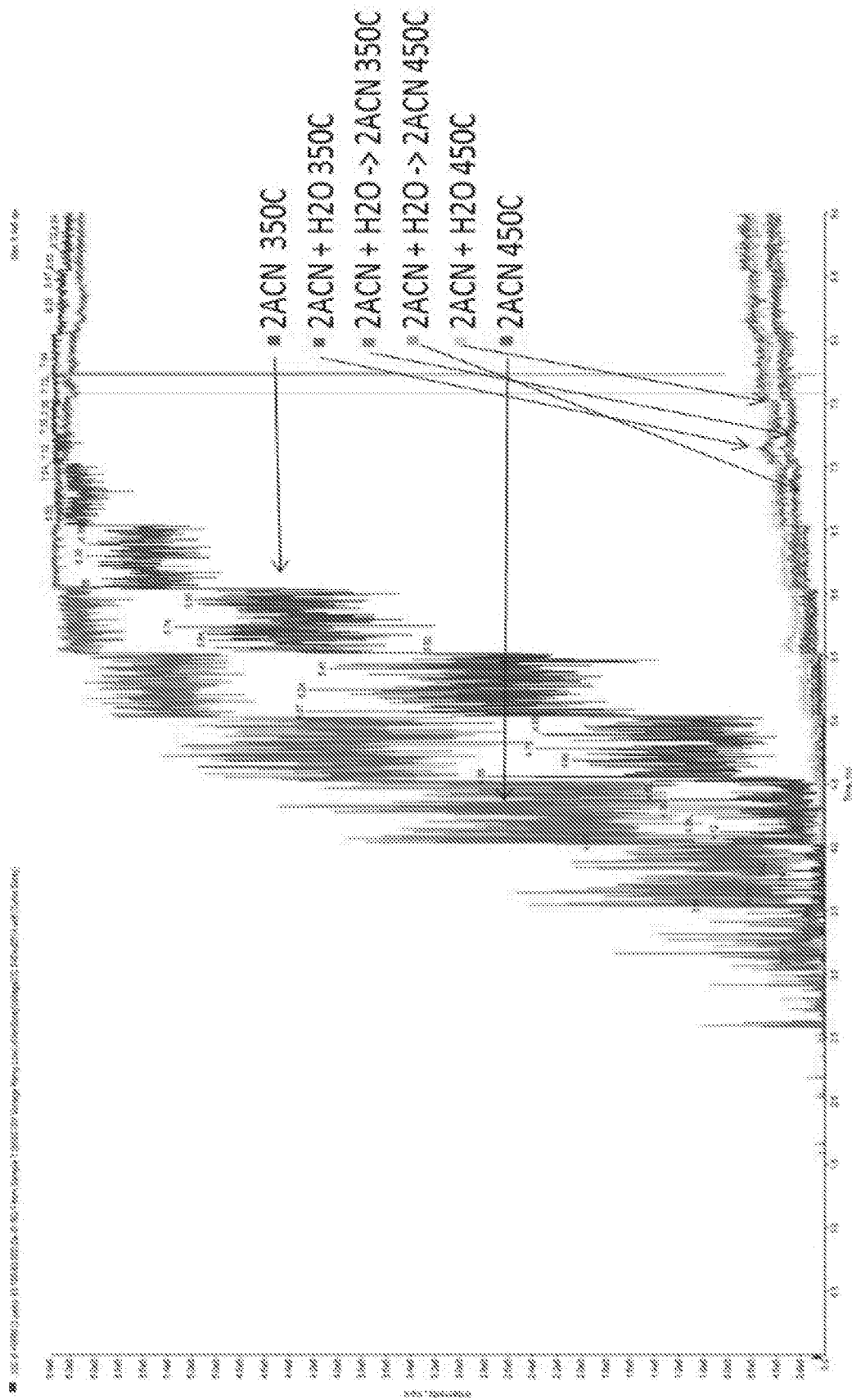
FIG. 33 illustrates abundance of selected cluster ions in a spray consisting of 50% acetonitrile, 50% water, and 0.1% formic acid, while the electrospray voltage is ramped from 0V to 4750V. The pink trace and the blue trace follow the same cluster ion but have source temperatures of 450° C. and 350° C. respectively, demonstrating the effects of temperature in the forming of ions (a colder spray is "wetter" inhibiting the ionization of molecules by electrospray mechanisms).
Figure 34:
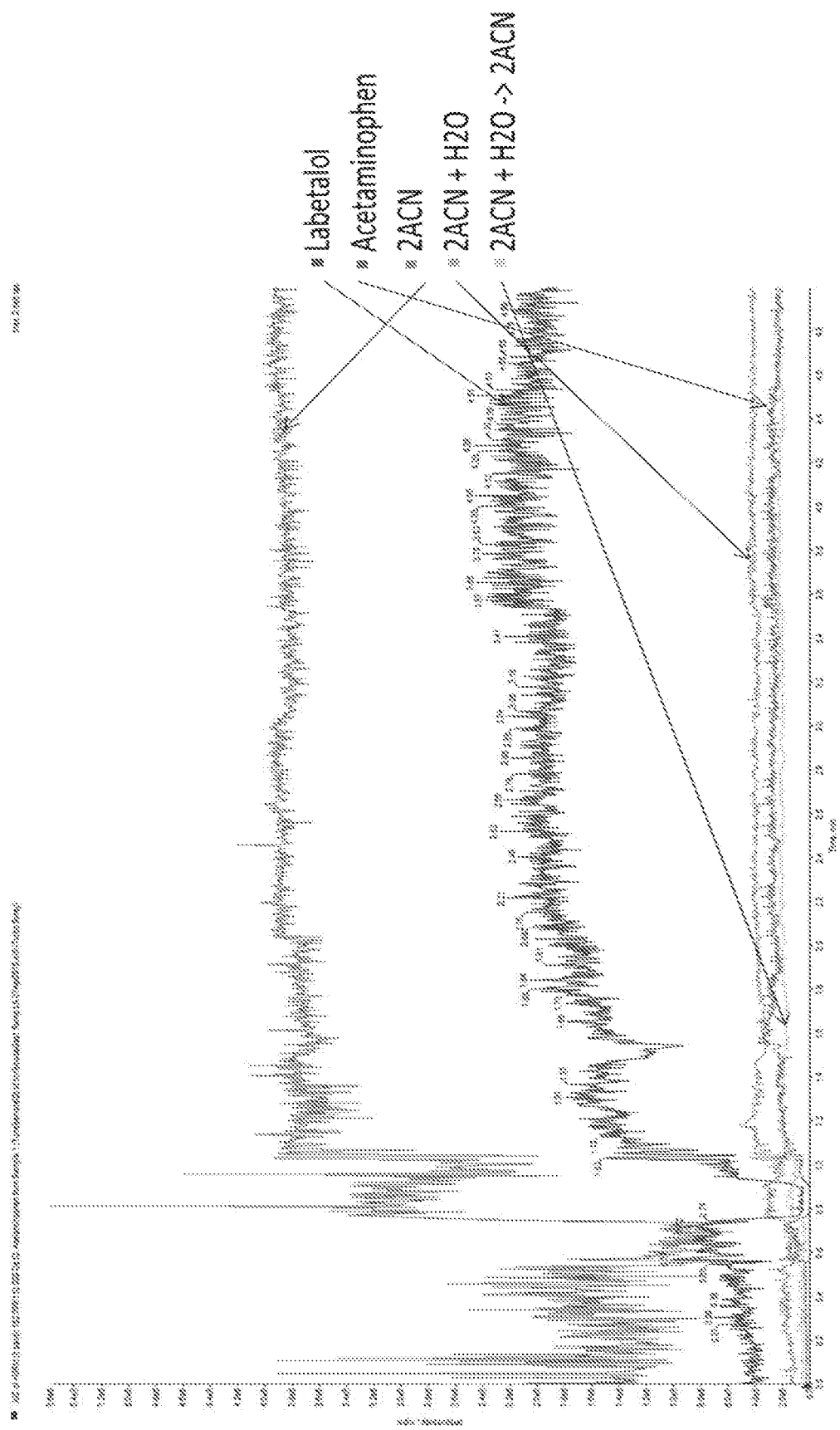
FIG. 34 illustrates abundance of selected cluster ions in a spray consisting of 50% acetonitrile, 50% water, and 0.1% formic acid along with dopant ions of acetaminophen and labetalol while the nebulizing gas is ramped from 5 arbitrary units to 45 arbitrary units. The spray is more stable with less spray-ionization-induced noise when nebulizing gas is present to shear solvent as it leaves the electrode into the source than when the same gas flow is relatively absent.
Figure 35:
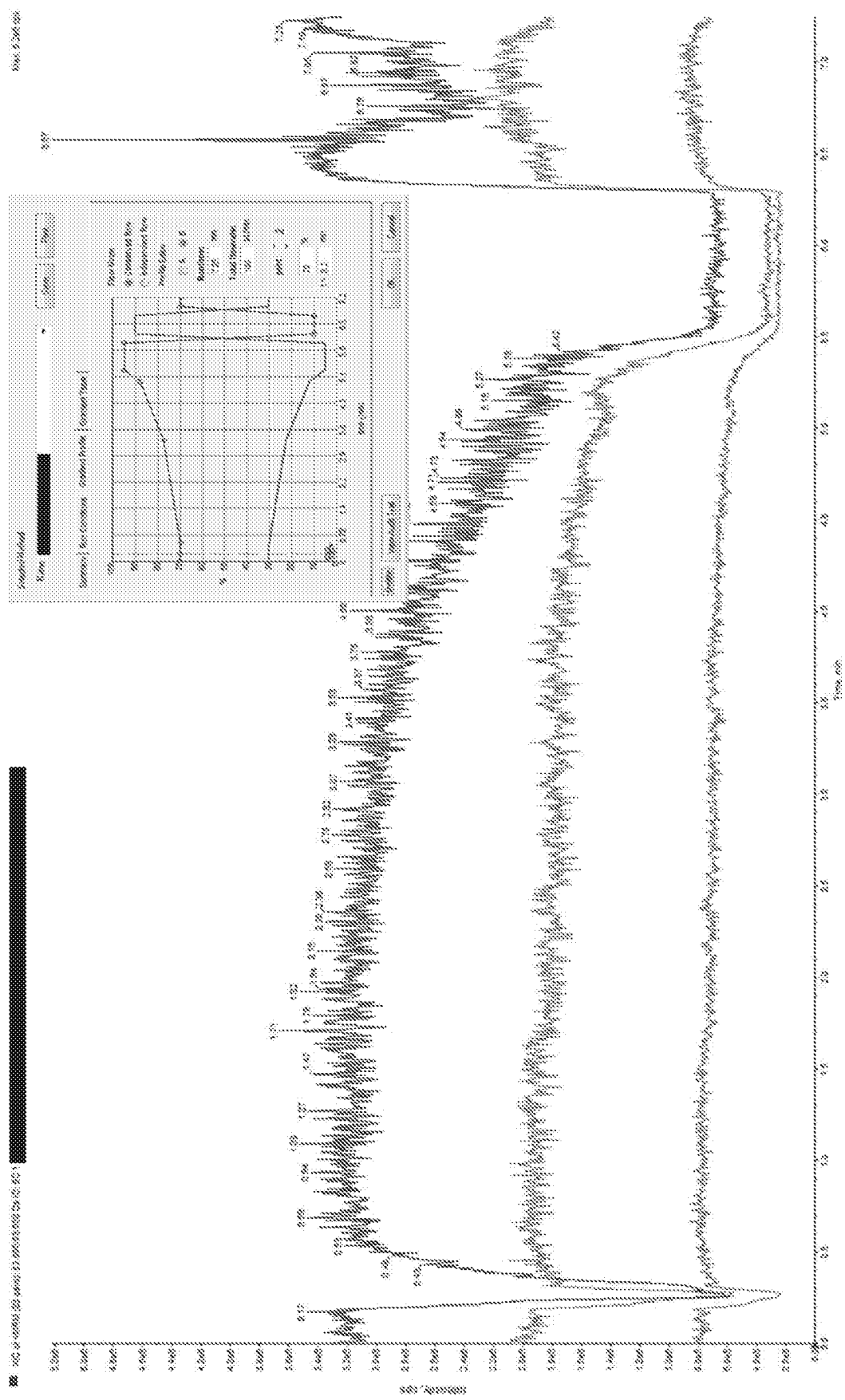
FIG. 35 illustrates changes in cluster ion abundance when running a acetonitrile/water gradient. As acetonitrile content of the spray increases to 95%, the abundance of these followed clusters decreases.
Figure 36:
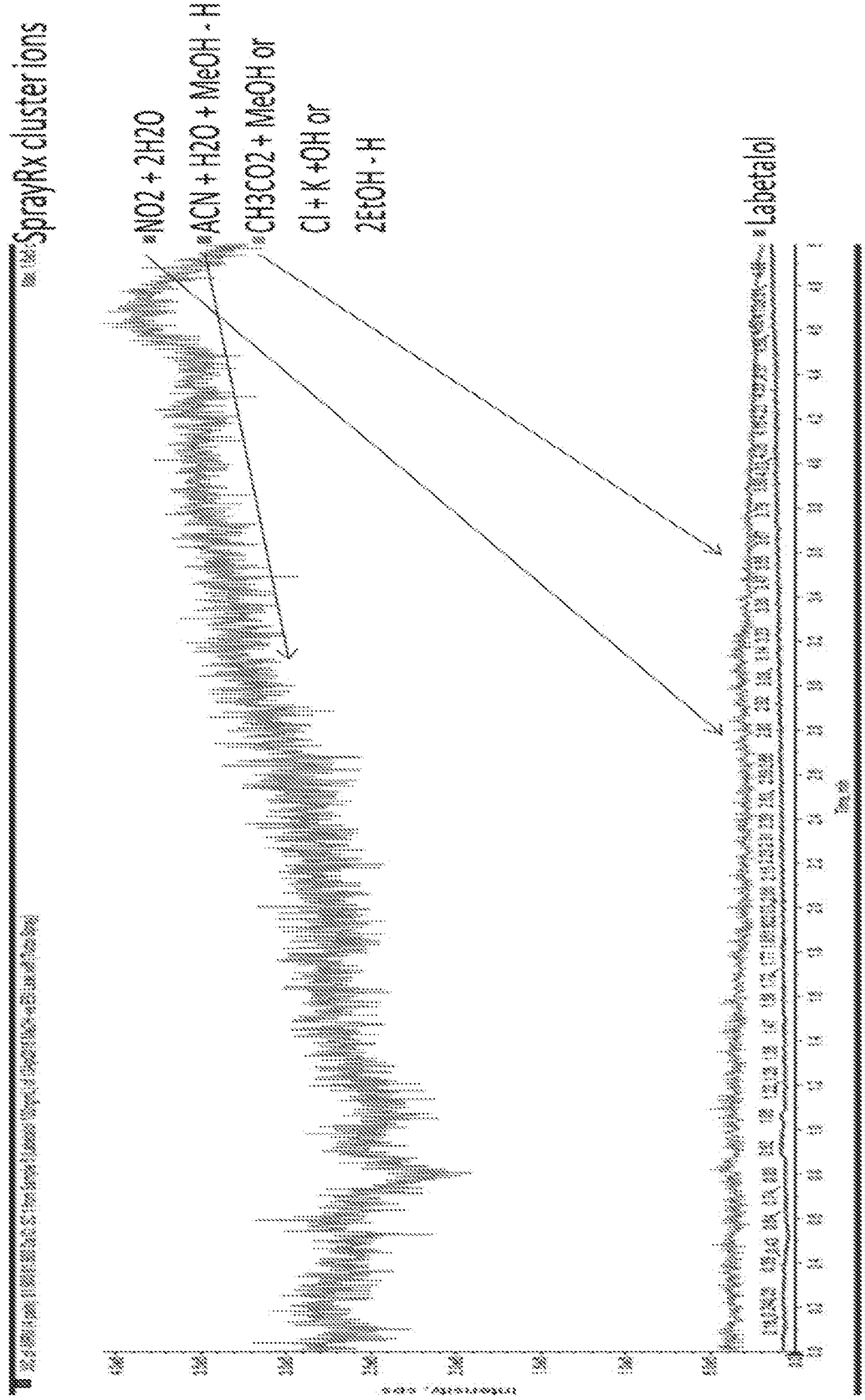
FIG. 36 illustrates cluster ions over a five minute linear methanol-water gradient while the mass spectrometer is the negative ion mode. Note that, though cluster ions identities differ between mobile phases and MS polarities, solvated clusters still exist in all sprays.
Figure 37:
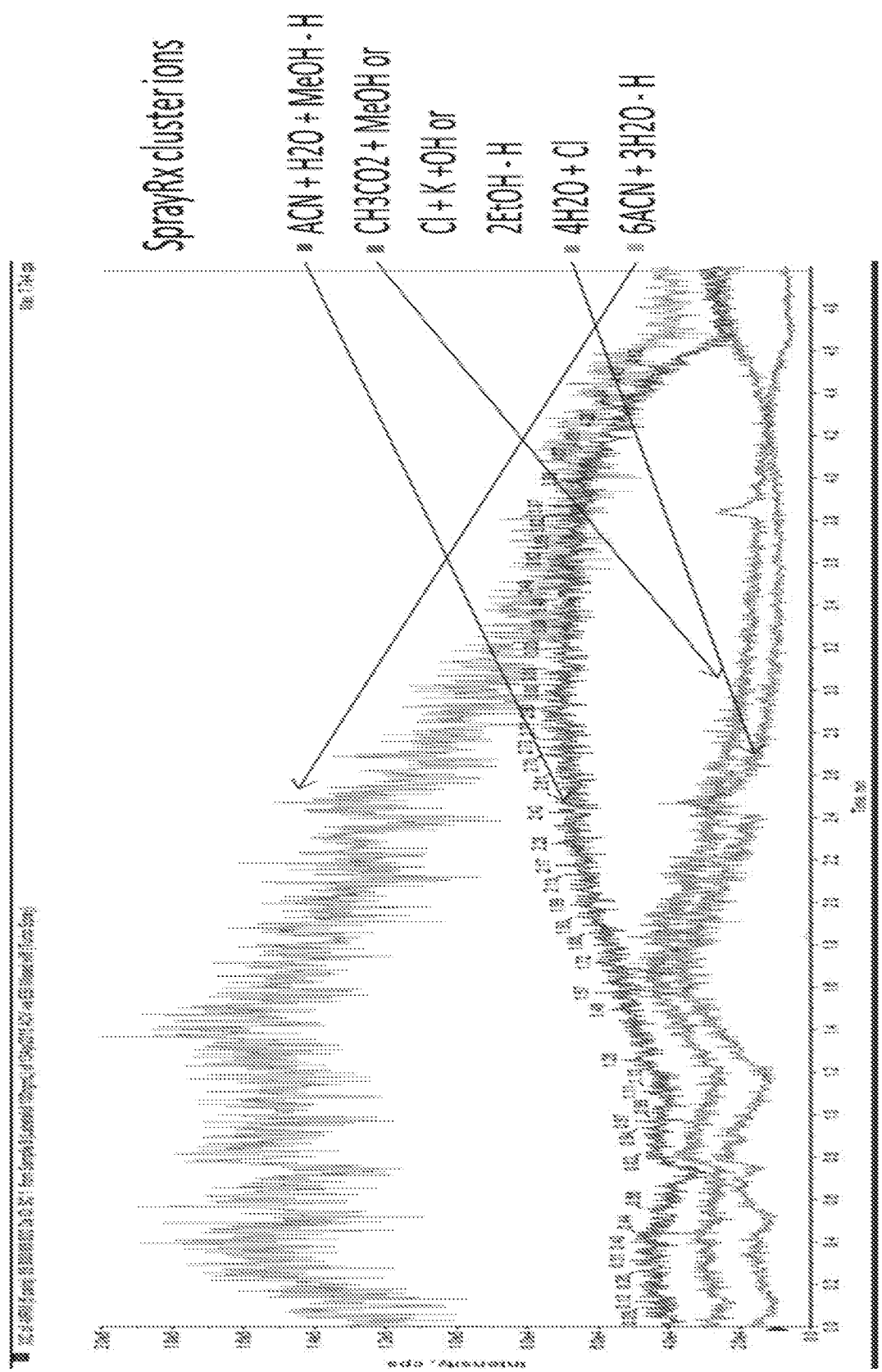
FIG. 37 illustrates cluster ions over a five minute linear acetonitrile-water gradient while the mass spectrometer is the negative ion mode. Note that, though cluster ions identities differ between mobile phases and MS polarities, solvated clusters still exist in all sprays.
Figure 38A:
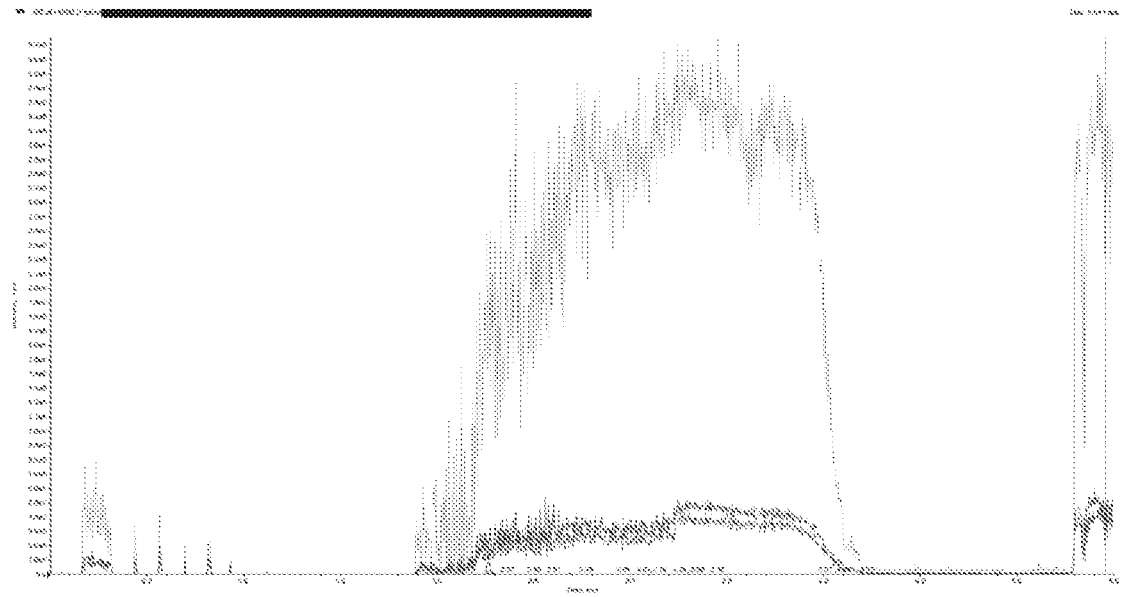
FIGS. 38A-38B illustrate two chromatograms of analyte in neat solution over a five minute acetonitrile-water gradient.
Figure 38B:
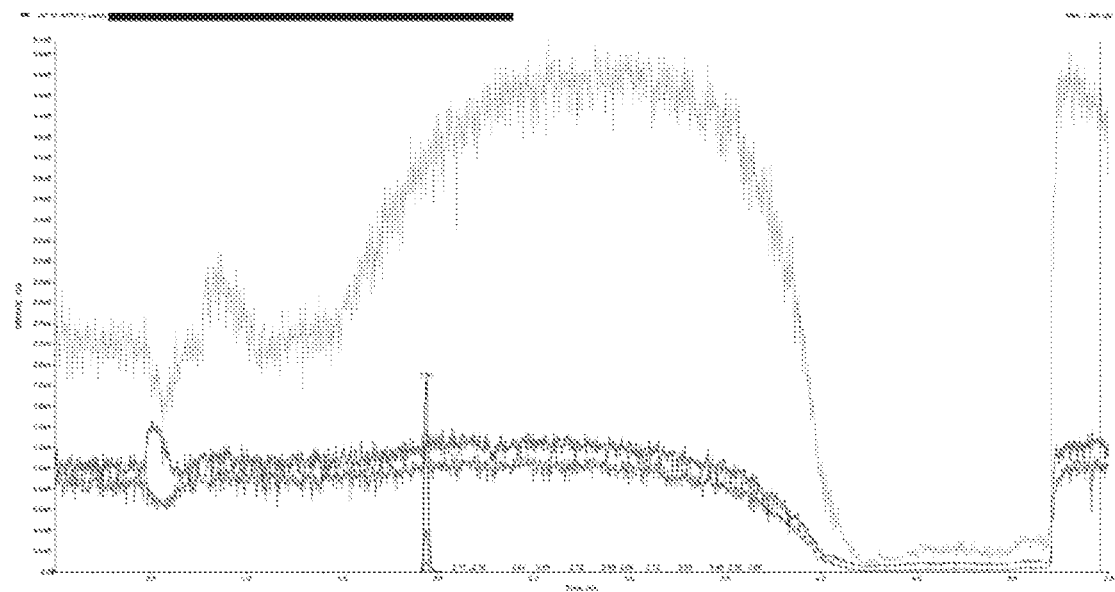
Figure 39A:
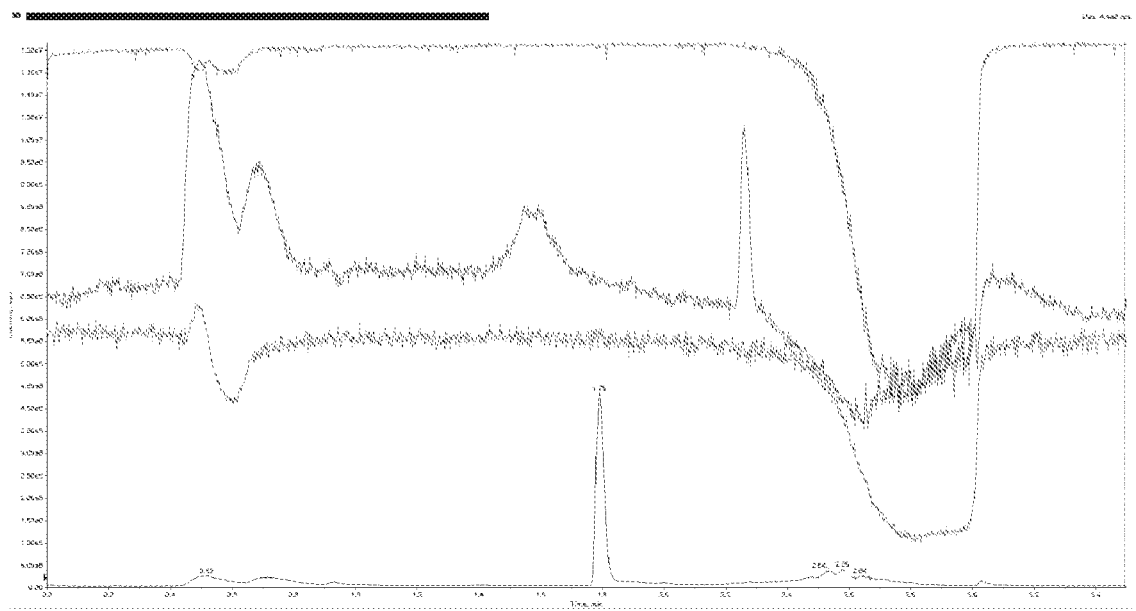
FIGS. 39A-39B illustrate an injection of labetalol over a five minute acetonitrile-water gradient with an unfocused lens (FIG. 39A) and properly functioning lens (FIG. 39B). Low mass resolution from an open lens increases transmission of ions to the detector but decreases mass specificity. The effects of this open lens are easily visualized in the cluster ion abundance traces.
Figure 39B:
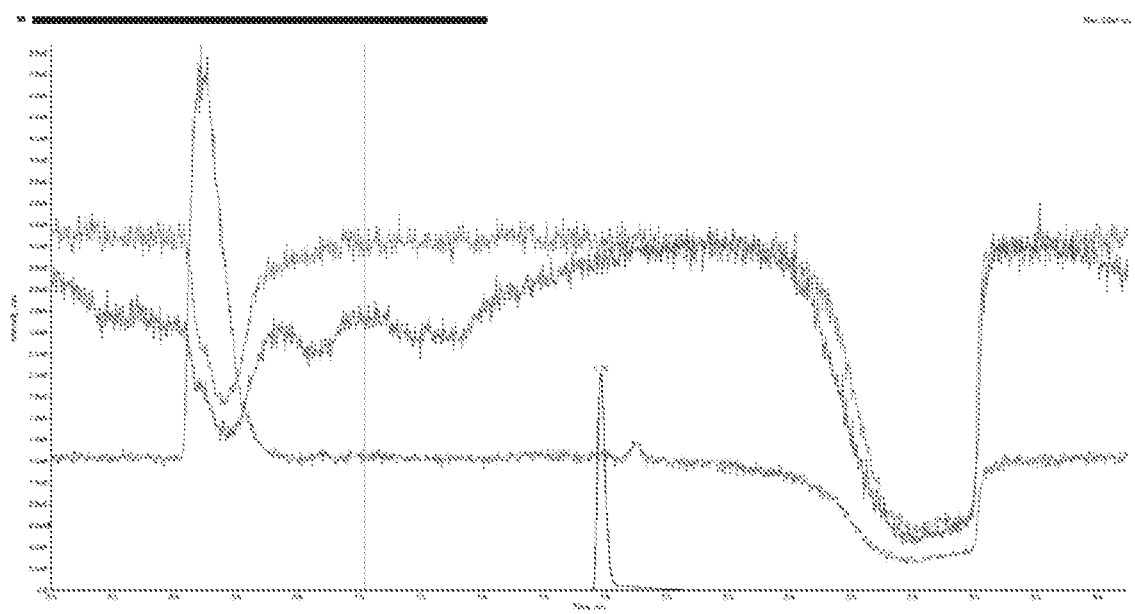
Figure 40A:
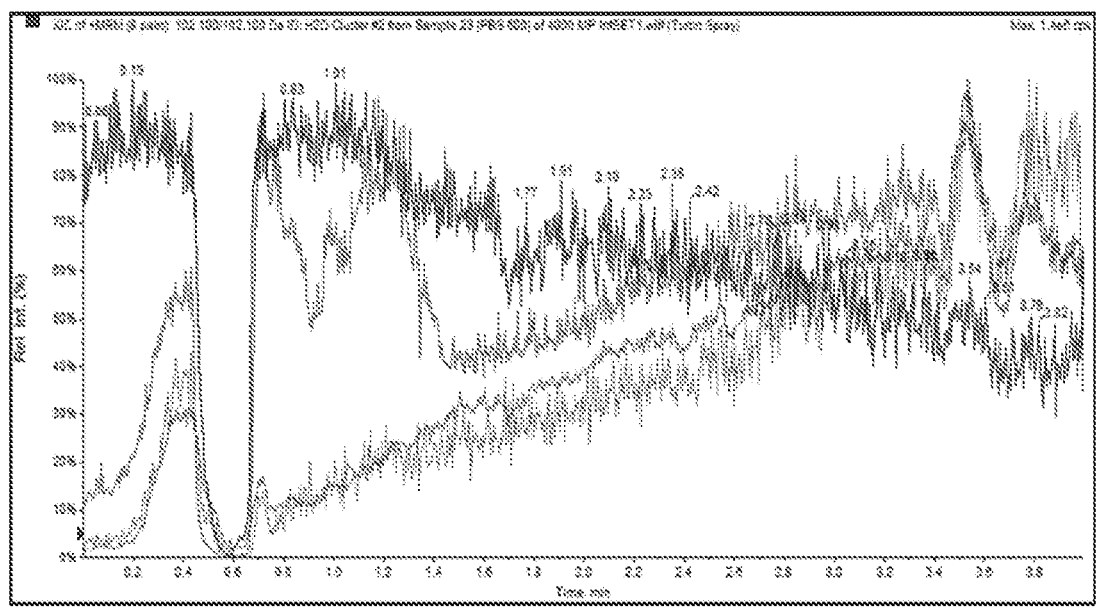
FIGS. 40A-40B illustrate suppression profiles, using injections of phosphate buffer solution (PBS) and 100 μg/mL bovine serum albumin (BSA) in PBS on an acetonitrile-water gradient.
Figure 40B:
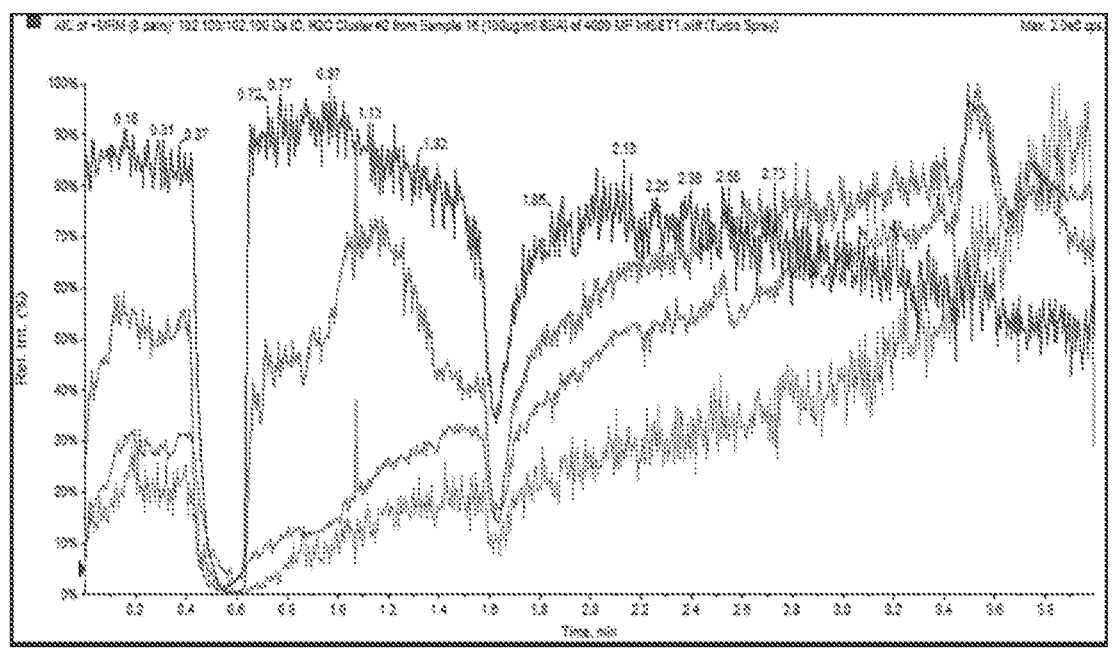
Figure 41A:
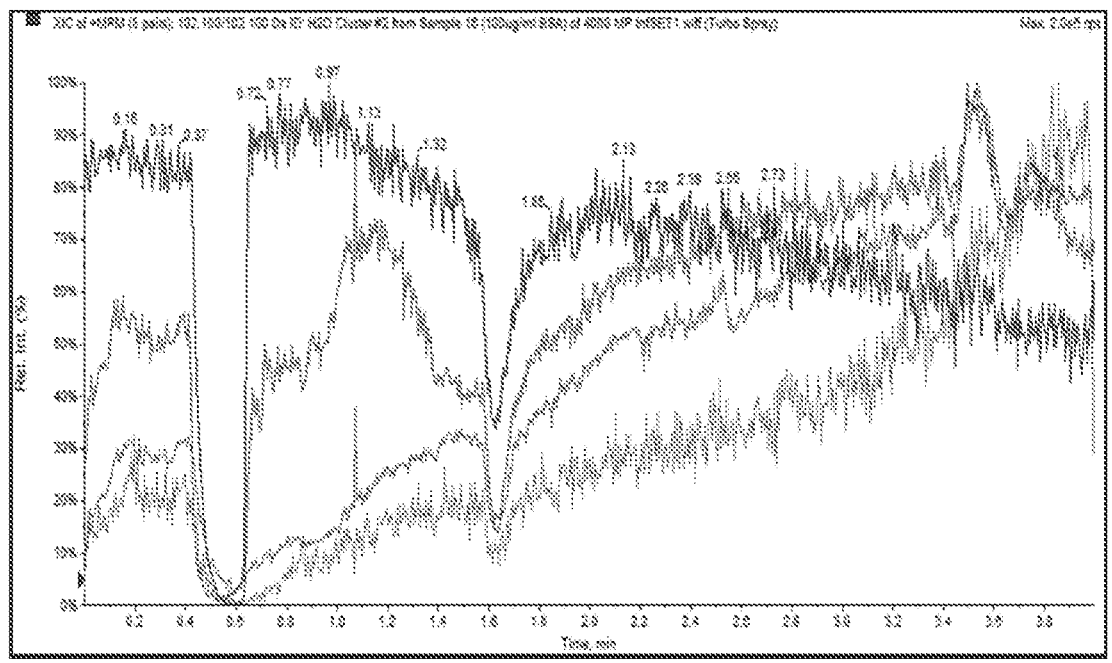
FIGS. 41A-41B illustrate suppression profiles, using injections of 100 μg/mL bovine serum albumin (BSA) in PBS and 5 mg/mL poly-ethylene glycol 1000 (PEG 1000) on an acetonitrile-water gradient.
Figure 41B:
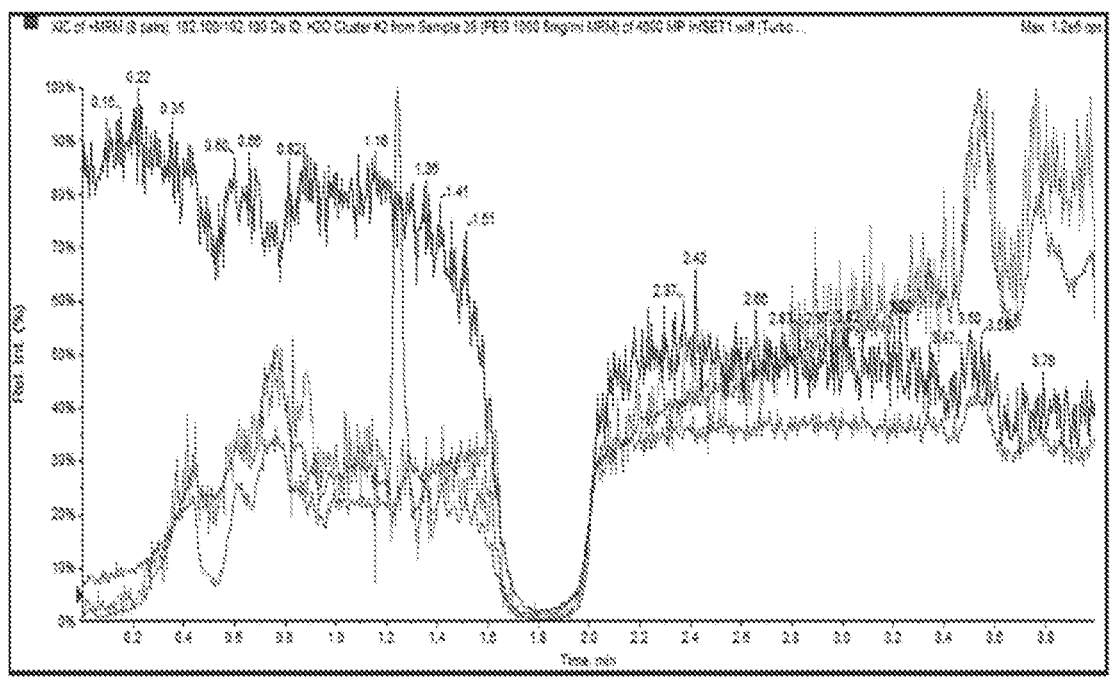
Figure 42A:
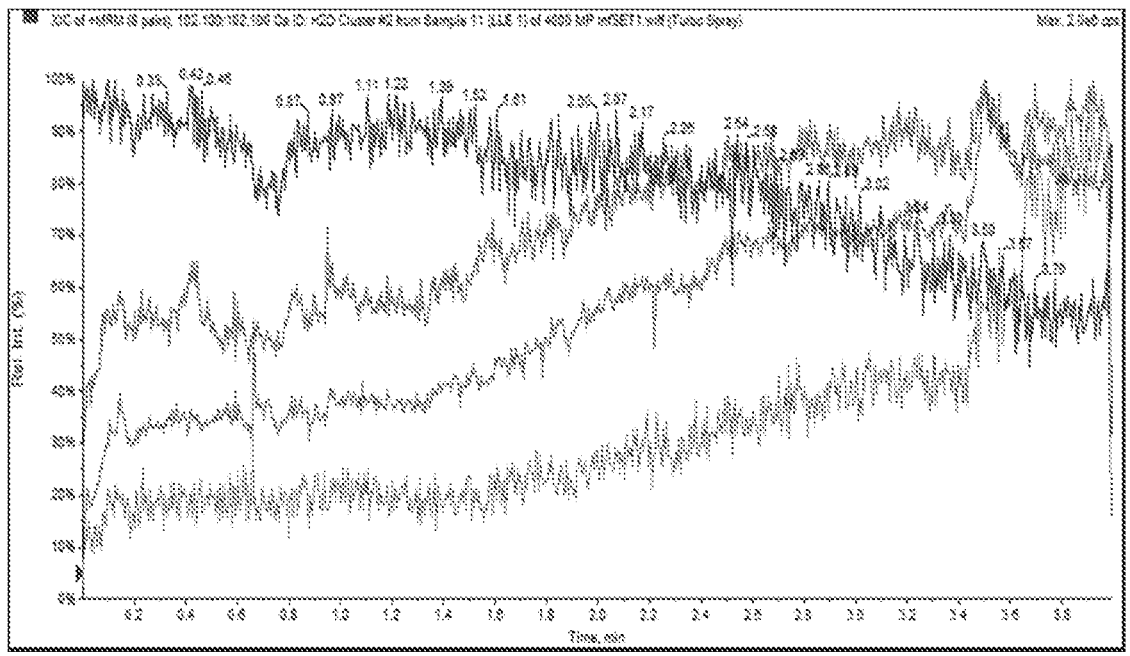
FIGS. 42A-42B illustrate suppression profiles, using two identical pooled plasma samples prepared by two different methodologies.
Figure 42B:
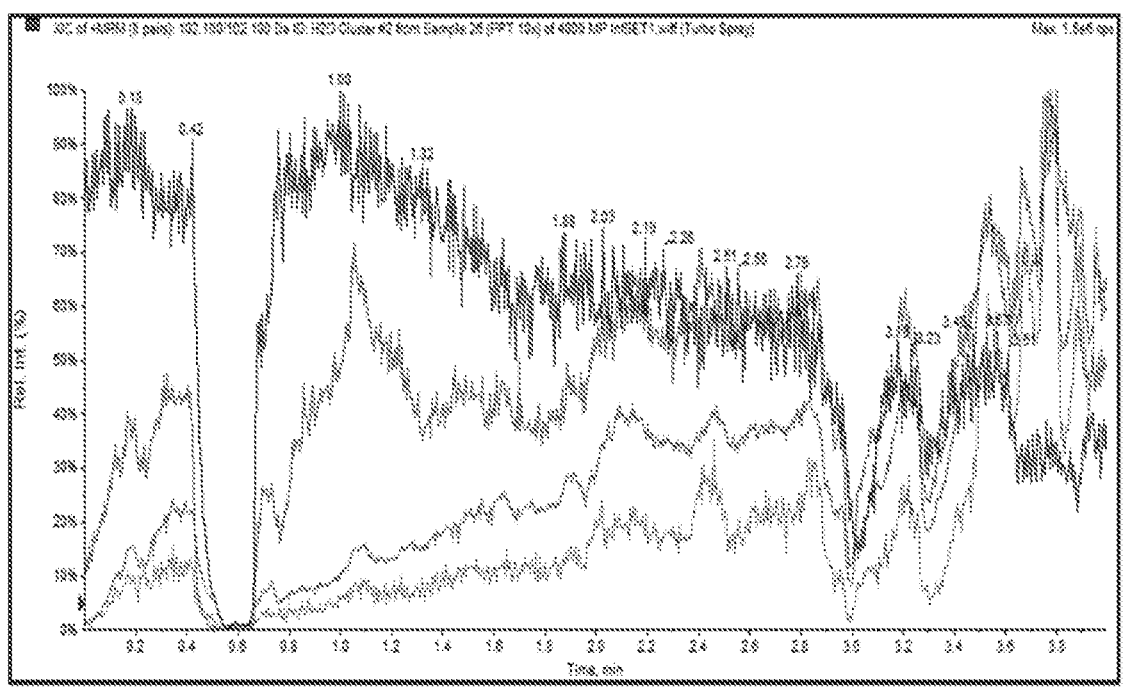
Figure 43:
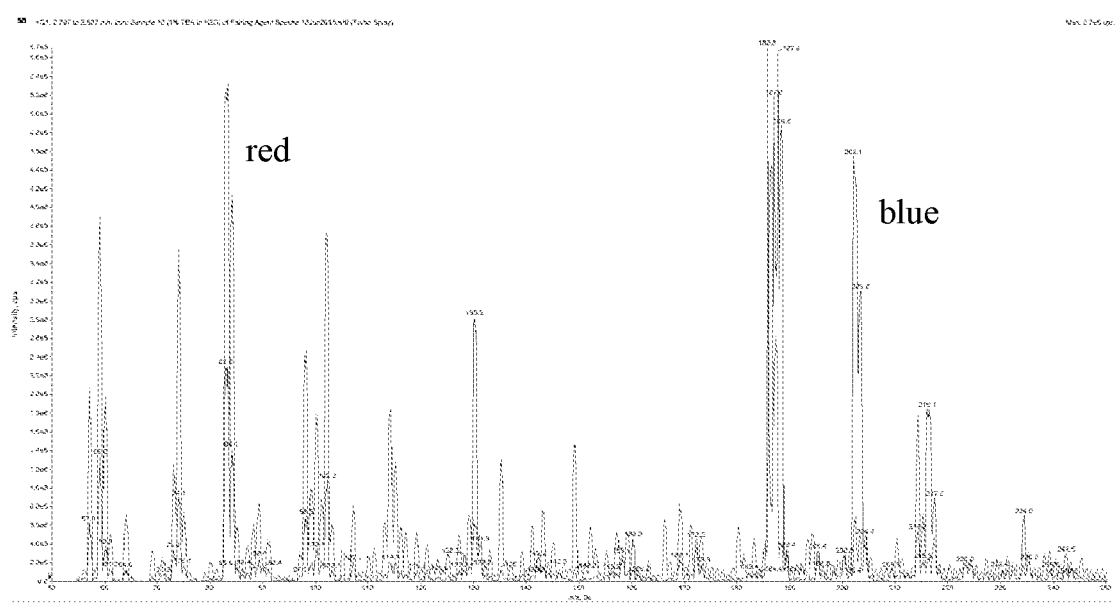
FIG. 43 illustrates mass spectra of mobile phase solvent with and without ion-pairing agent present. Q1 scan of a spray consisting of 70% acetonitrile, 30% water, and 0.1% formic acid with and without tributylamine (TBA). The red trace is the scan without TBA and the blue is with TBA. Presence of ion-pairing agent does not reduce total ion count but does significantly affect the distribution of cluster ions and analyte ions as it is extremely proton-competitive.
Figure 44A:
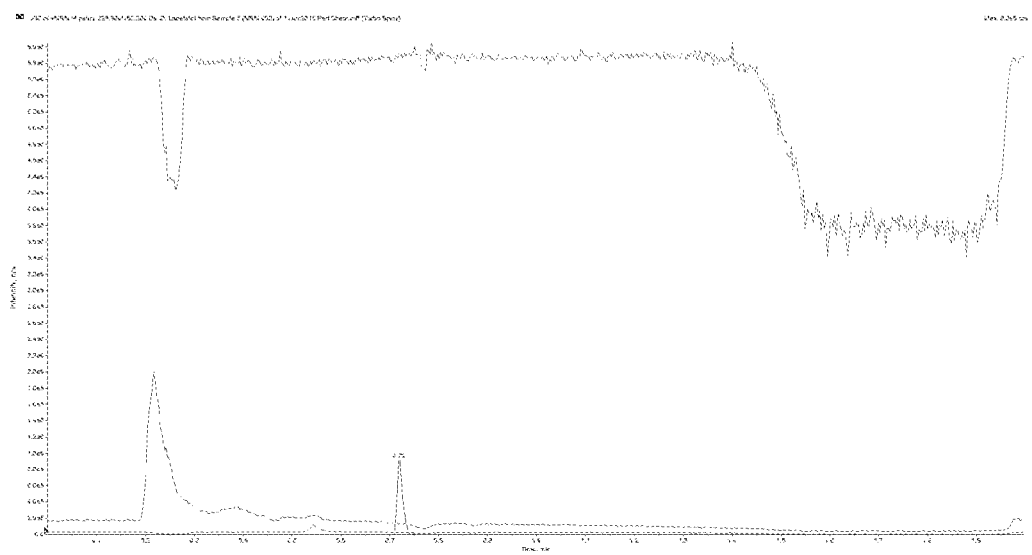
FIGS. 44A-44B illustrate effects of ion-pairing agents. Injection of labetalol on an acetonitrile-water gradient on a C8 column (FIG. 44A) and a C8 column saturated with tributylamine (TBA) ion-pairing agent (FIG. 44B). The TBA not only reduces cluster abundance intensity two orders of magnitude but also completely prevents ionization of the injected labetalol. Cluster ions allow us to not only easily see the presence of this contaminant but also to visualize the cleanliness of the column.
Figure 44B:
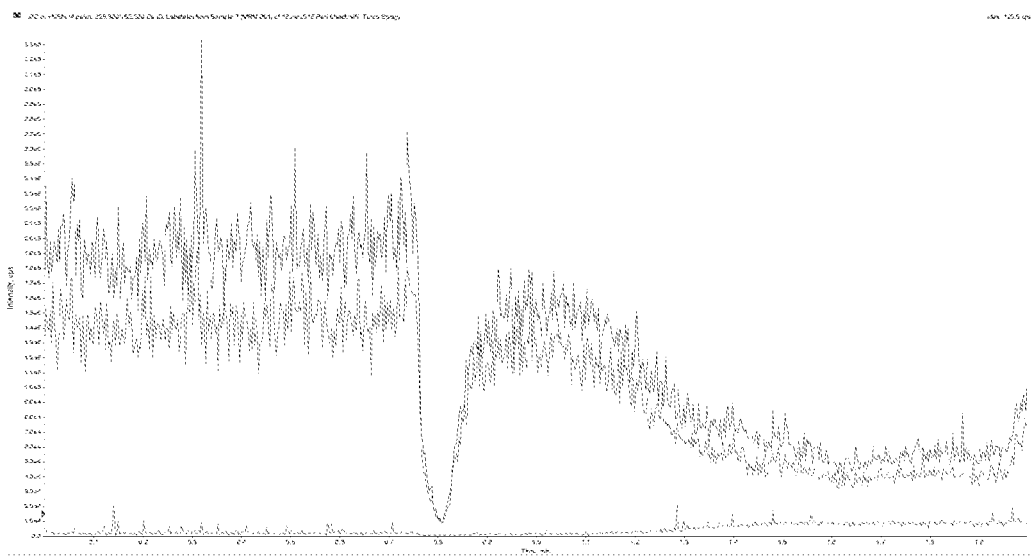
Figure 45A:
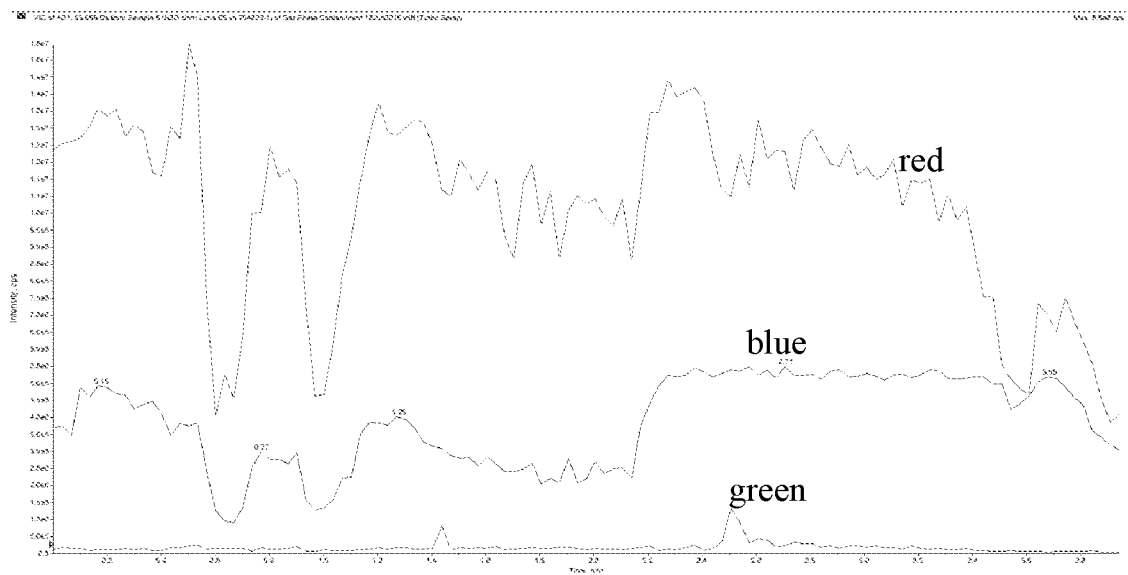
FIGS. 45A-45B illustrate effects of gas-phase base contaminant, using two extracted ion chromatograms (XIC) of protein precipitation full scan data.
Figure 45B:
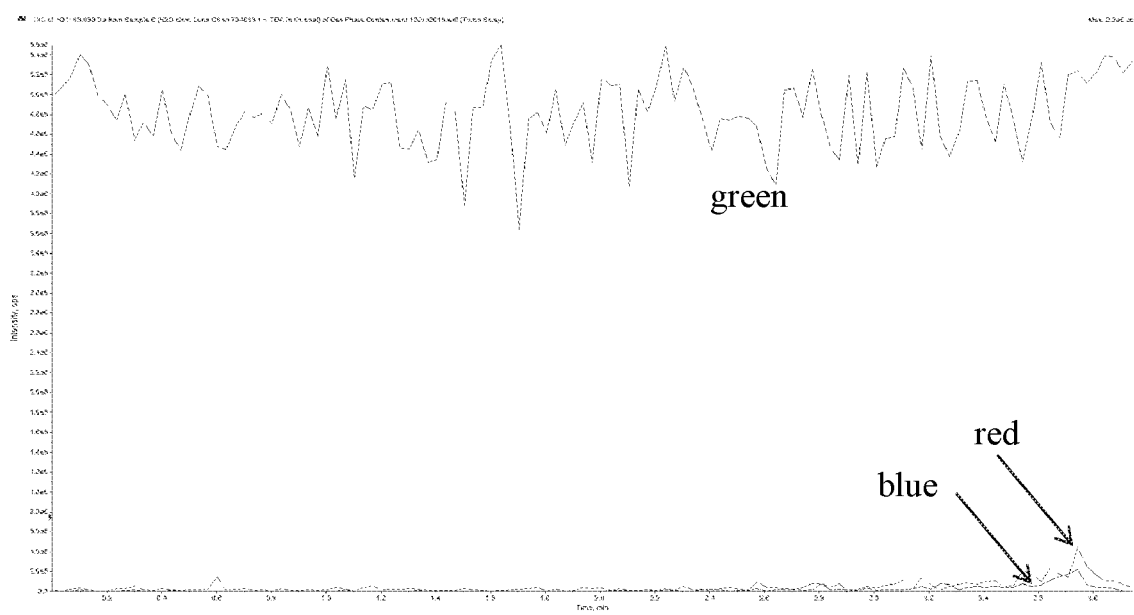
Figure 46:
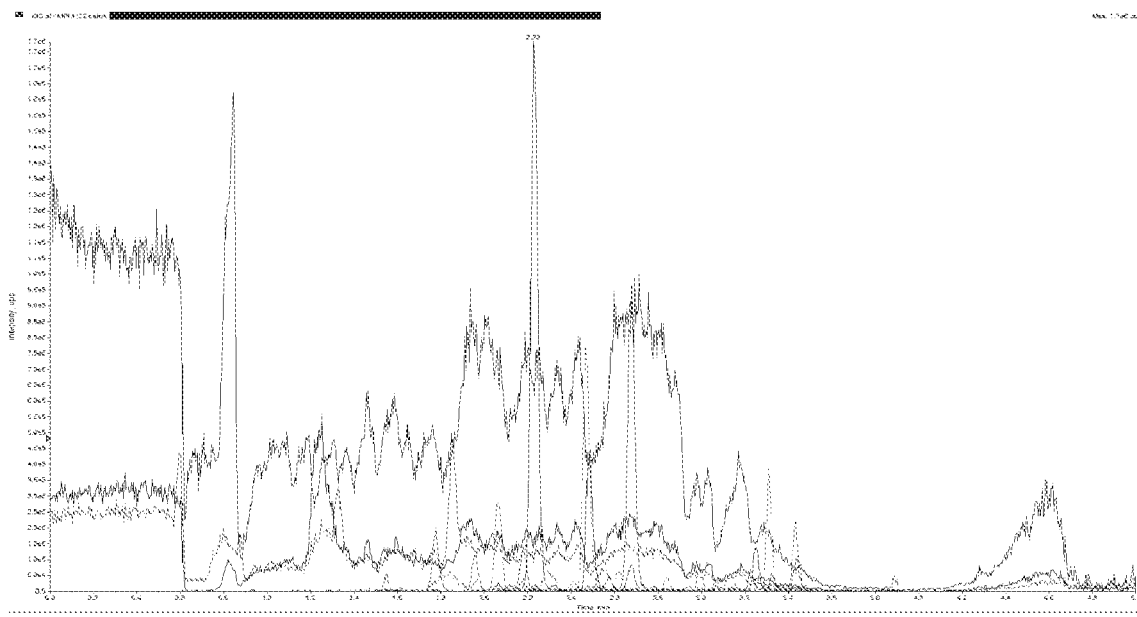
FIG. 46 illustrates a chromatogram of a multiplexed peptide panel in human plasma digest. Regardless of number of analytes followed, monitoring cluster ions allows one to visualize ionization throughout a run with neither an added tracer in the mobile phase nor a infusion pumped joined to the solvent stream as previously used to visualize matrix effect. Additionally, this monitoring allows one to modify chromatographic conditions if an analyte is eluting in a region of poor ionization.
Figure 47:
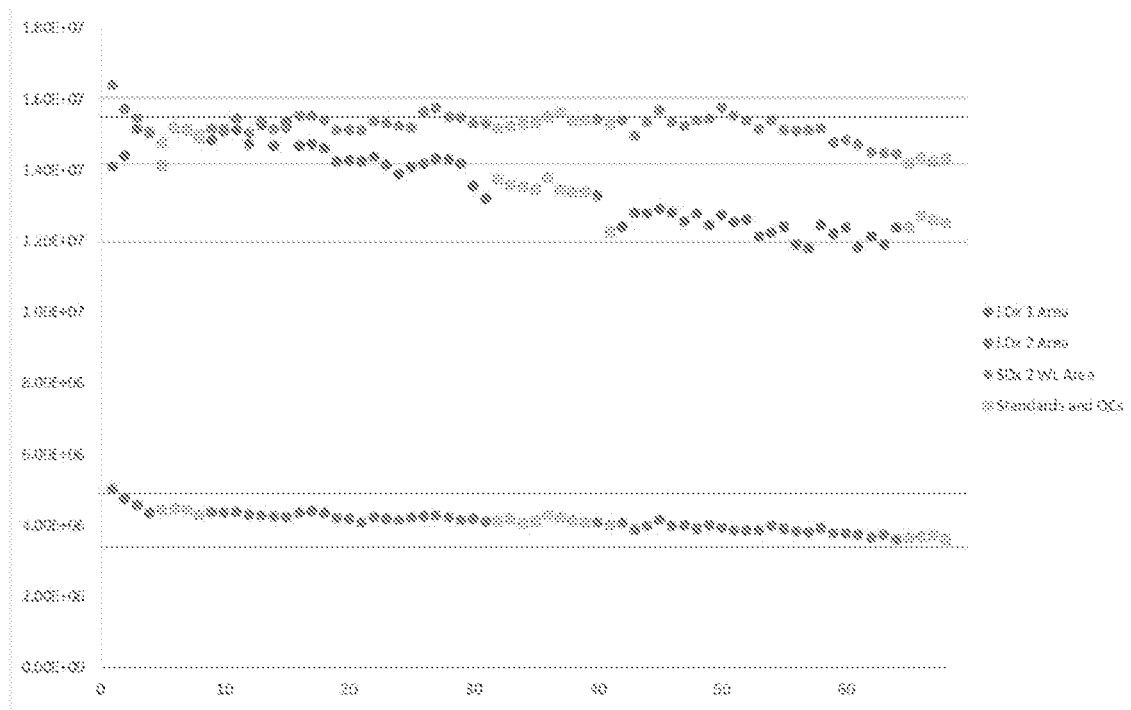
FIG. 47 comprises a graph illustrating ionization performance during analyte elution over a study of 45 patient samples: total cluster ion counts during elution of analyte (10 second elution). Horizontal bars are the 95% confidence intervals constructed using the standards and QC samples and further applied to studied patient samples. By tracking these total counts over the course of an entire study or set of studies, one can leverage statistics to identify ionization outliers, indicating that the results represent true values and are unaffected by ionization suppression due to sample matrices, contaminants, or system malfunctions. Graphing total cluster ion counts also allows one to see trends in ionization performance. Periodic degradation in performance can be analyzed and a regular maintenance schedules established. This is important for analytical laboratories regularly processing large numbers of samples. 95% Confidence Intervals for patient samples (horizontal bars at left) determined by Standards and QC samples.
Figure 48A:
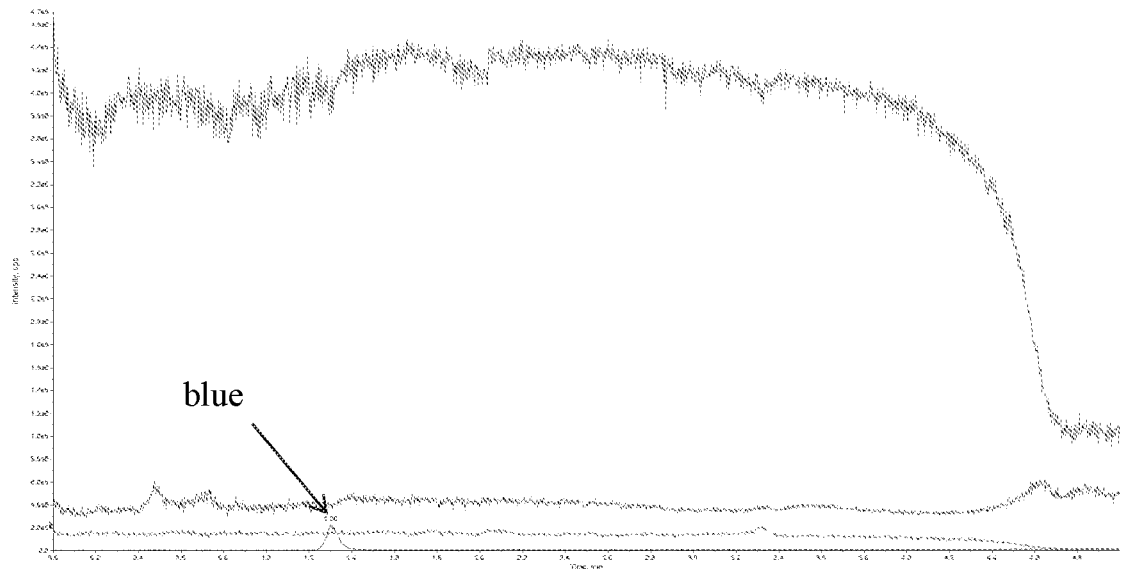
FIGS. 48A-48B illustrate ionization suppression due to excess of acetaminophen.
Figure 48B:
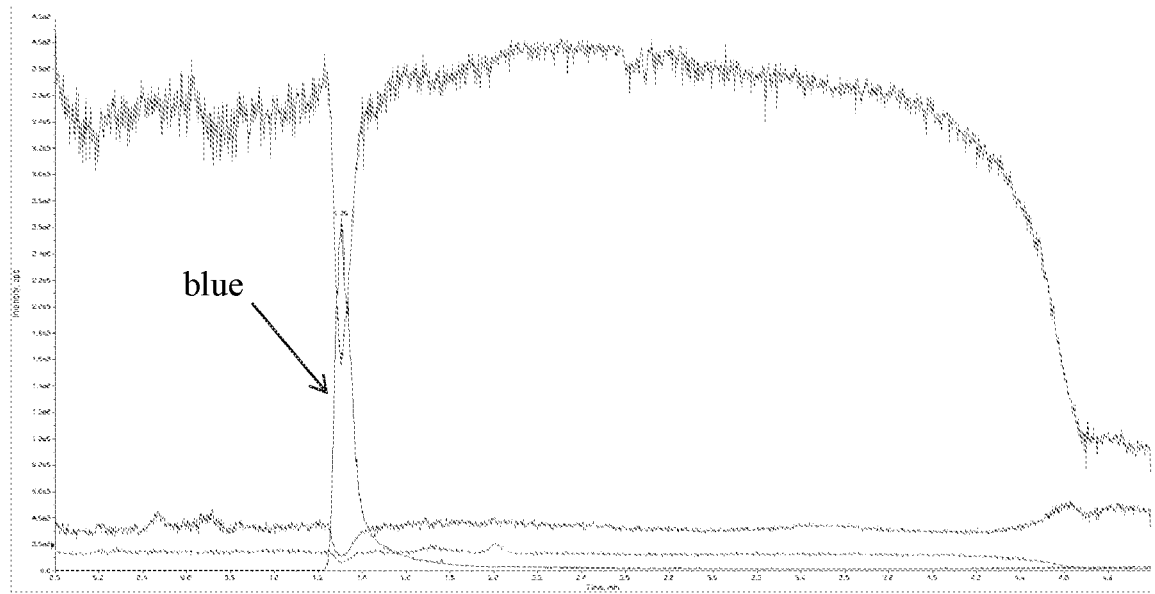
Figure 49A:
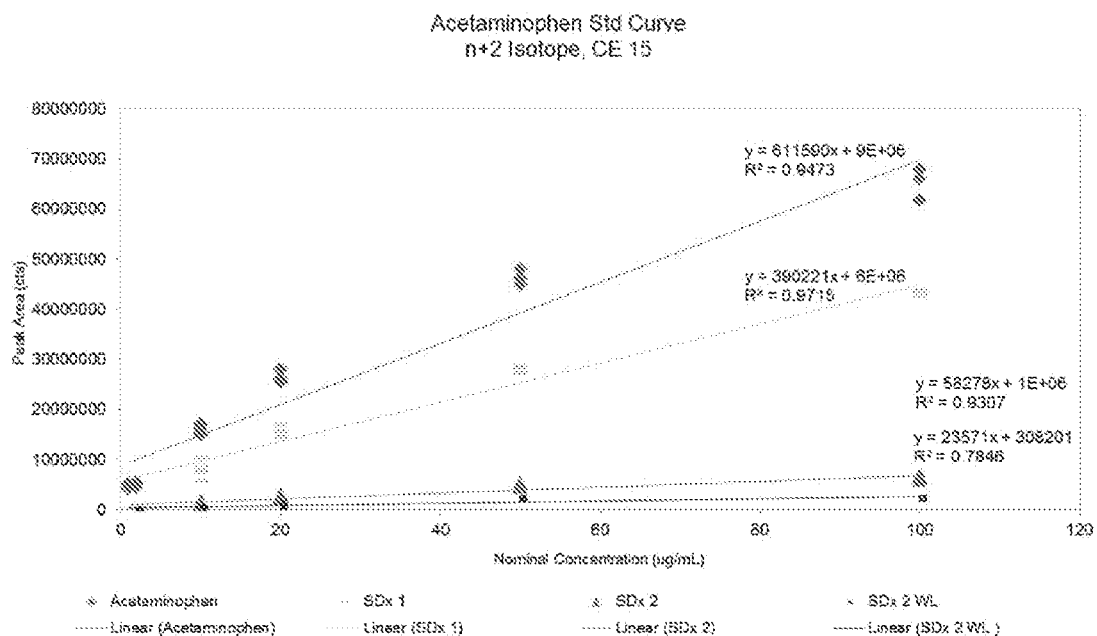
FIGS. 49A-49B illustrate standard curve of acetaminophen isotope peak area versus cluster ion suppression (quantified using the "valley" area). Acetaminophen calibration curves performed in triplicate ranging from 1 μg/mL to 100 μg/mL built using acetaminophen M+2 isotope peak areas and three separate cluster ion suppression "valley" areas.
Figure 49B:
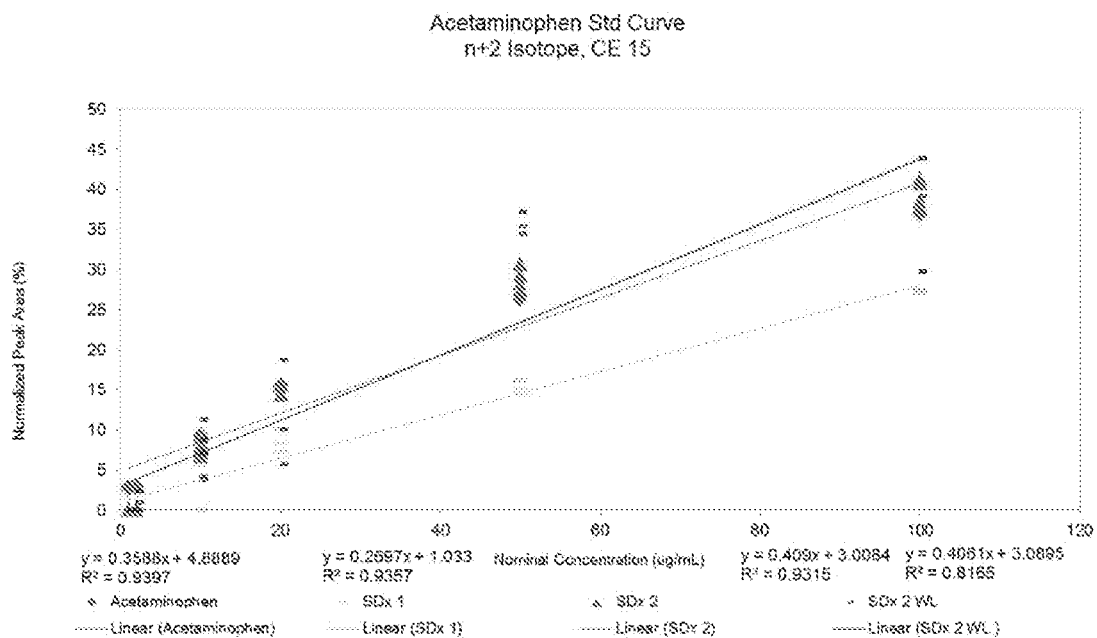

The ions shown in FIG. 27 are stable isotope labeled angiotensin I and the cluster ion at m/z 83 which is nominally assigned as the proton-bound dimer of acetonitrile. For the stable isotope labeled angiotensin I, the mass transition was m/z 653.8 to m/z 794.4 at a CE of 32.2 V with a DP of 78.4 V. A pseudo-SRM was used for the m/z 83 cluster ion with mass transition of m/z 83 to m/z 83 at a CE of 5 V and a DP of 20 V.

DESCRIPTION

Incompletely Desolvated Cluster Ions Formed During the Ionization Process Provide a Convenient Way to Monitor the Consistency of the Ionization Process.

In certain embodiments, a low resolution, full-scan mass spectrum collected from mobile phase flow into an API source shows signals at nearly every m/z. To establish which signals are most likely to be cluster ions useful for monitoring the ionization process, three experiments were performed. In the first experiment, a full-scan mass spectrum from m/z 10-500 was acquired under conditions that permit survival of solvent cluster ions, and that spectrum was compared to the full-scan spectrum acquired under conditions meant to break up the solvent clusters. The DP on the Sciex API5500 Qtrap mass spectrometer was set at 20 V, to allow cluster survival, and at 80 V, where the applied potential was sufficient to break up the solvent clusters but not typically enough to break covalent bonds present in most organic molecules. Ions with significantly reduced intensity at the higher DP in these experiments are candidates for solvent cluster species. The mobile phase used was 95% water and 5% acetonitrile containing 0.1% formic acid as typically used in reverse-phase separations and ESI. The ions in the positive ion spectrum observed to lose intensity by two-fold or more in the experiment were: m/z 83, 84, 100, 102, 119, 121, 130, 133, 147, 149, 161, 162, 177. Many of these ions were most likely solvent clusters containing a small organic base (such as triazole, dimethyl amine, ethyl amine, ethylene diamine, etc.) along with a number of attached solvent molecules of water and/or acetonitrile.

There are a large number of potential sources for these small, basic molecules in liquid chromatography-mass spectrometry systems. Not only are the LC solvents themselves major sources of impurities, but also the materials used to construct LC systems. Even 0-rings used as gas seals can contribute impurities. Other potential sources of small basic, impurities include the ambient air and any of the gases introduced to the ion source or higher pressure regions of the vacuum interface of the mass spectrometer.

The second experiment used to identify cluster ions was a product ion scan. A product ion scan of the cluster ion at m/z 102 at the lowest collision energy permitted by the software, 5 V, was acquired as an example. The spectrum showed the expected loss of water by the ion at m/z 84 along with fragments of what was likely the core triazole impurity at m/z 74, 70, and 61.

The third set of experiments leveraged the neutral loss scanning functionality of the triple quadrupole and Qtrap mass spectrometers. The neutral loss scan from m/z 25-500 for a water loss (18 Da) was performed on the 6500 Qtrap. The CE for the neutral loss scan was set to 5 V in an attempt to avoid the disruption of covalent bonds. It is not possible to completely differentiate between a cluster composed of ions and non-covalently attached solvent, and an aliphatic alcohol that requires very little energy to drive double-bond formation with a resulting loss of a neutral water molecule. However, the masses of the species observed as clusters do not match those of known, easily dehydrated aliphatic alcohols. Additionally, it is unlikely that an aliphatic alcohol was natively present in the system, at a sufficient concentration, to be observed at the intensities shown in the data. Easily identified ions exhibiting a water loss were those at m/z 73, 102, and 121. Other potential cluster ions were observed at m/z 61, 77, 91, and 119. The neutral loss scan of 41 Da corresponding to the neutral loss of acetonitrile was also performed. Ions observed were m/z 83, 84, 98, 100, 102, 114, 130, and 162. The group of ions that exhibited both a change in intensity with declustering potential (experiment 1) and showed a neutral loss of solvent (experiment 3) were the ions most likely to be solvent clusters. Product ion spectra (experiment 2) afford some information on the structure of the solvent cluster core.

Changes in Ionization Conditions that Change the Ion Yield Such as Temperature, Voltage, Spray Solvent Composition, Mass Flow, Ion Source Gases and Current Will be Detected as Changes in the Abundance of Solvent Cluster Ions.

Observations on cluster ion formation collected in the experiments described elsewhere herein can be applied to any solvent system, with any ionization source and polarity, to identify potential cluster ions for monitoring. Perhaps the most direct test of the idea that cluster ions can inform on the overall ionization process is to observe their behavior as settings on the ion source are changed.

Figure 24:
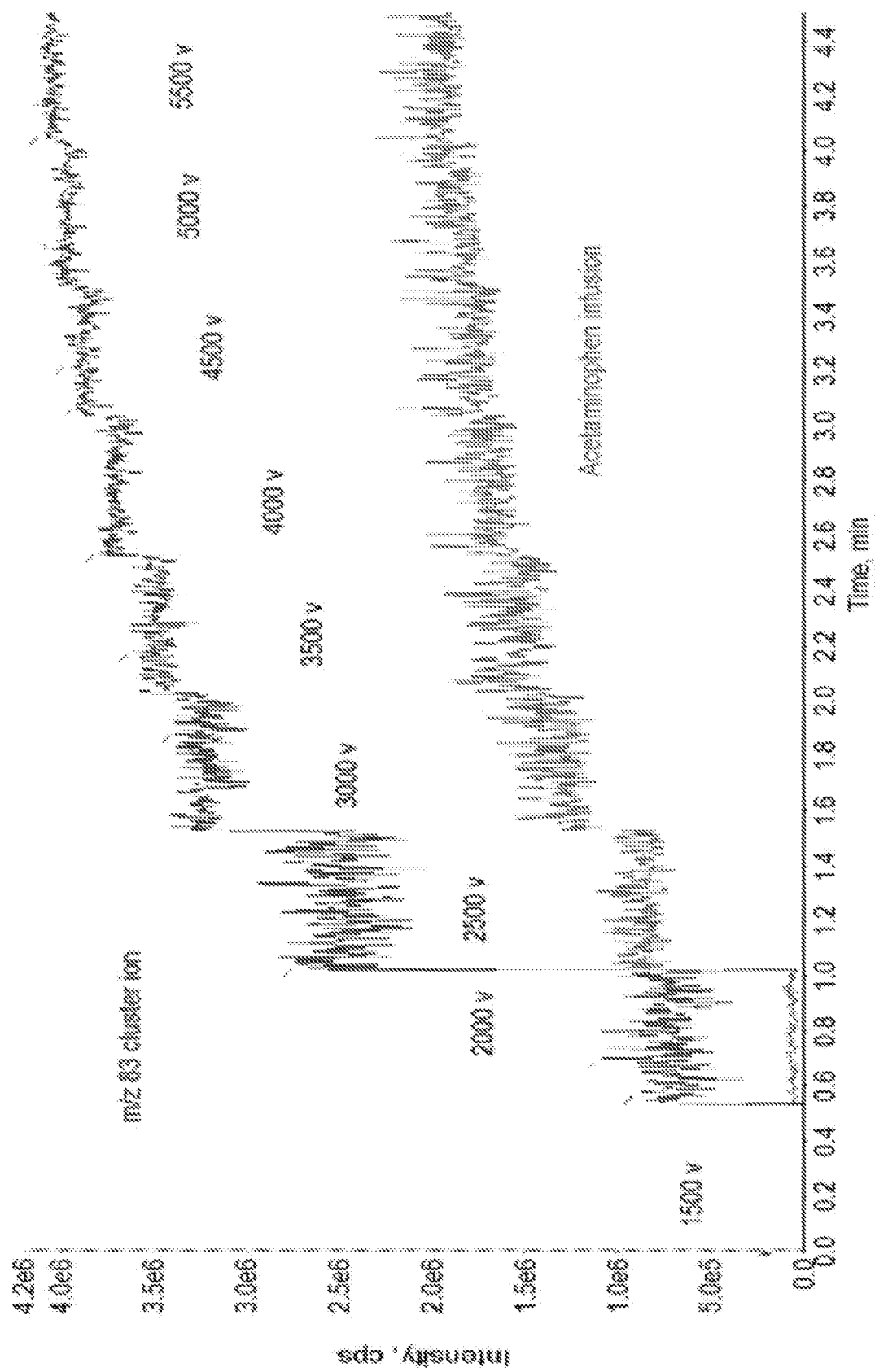
FIG. 24 illustrates an extracted ion chromatogram from a post-column infusion of acetaminophen into a 50 µl/min mobile phase stream composed of 50% acetonitrile/water containing 0.1% formic acid. The ion spray voltage (ISV) applied to the electrode was changed in the instrument control software (Analyst 1.6.2) from 1500 volts to 5500 volts in steps of 500 volts. Shown is the SRM (m/z 152 to m/z 110, CE=25 V) response change for a 1 µg/mL acetaminophen solution in methanol (red trace; bottom trace) infused at 7 µl/min through a tee-junction into the mobile phase stream entering the ion source and the response change for the m/z 83 cluster ion (blue trace; top trace) monitored using a pseudo-SRM (m/z 83 to m/z 83, CE=5 V. The similarity of changes in response between the drug and the solvent cluster ions provide evidence that cluster ions can monitor changes in ion formation as the source conditions are changed.
Figure 25A:
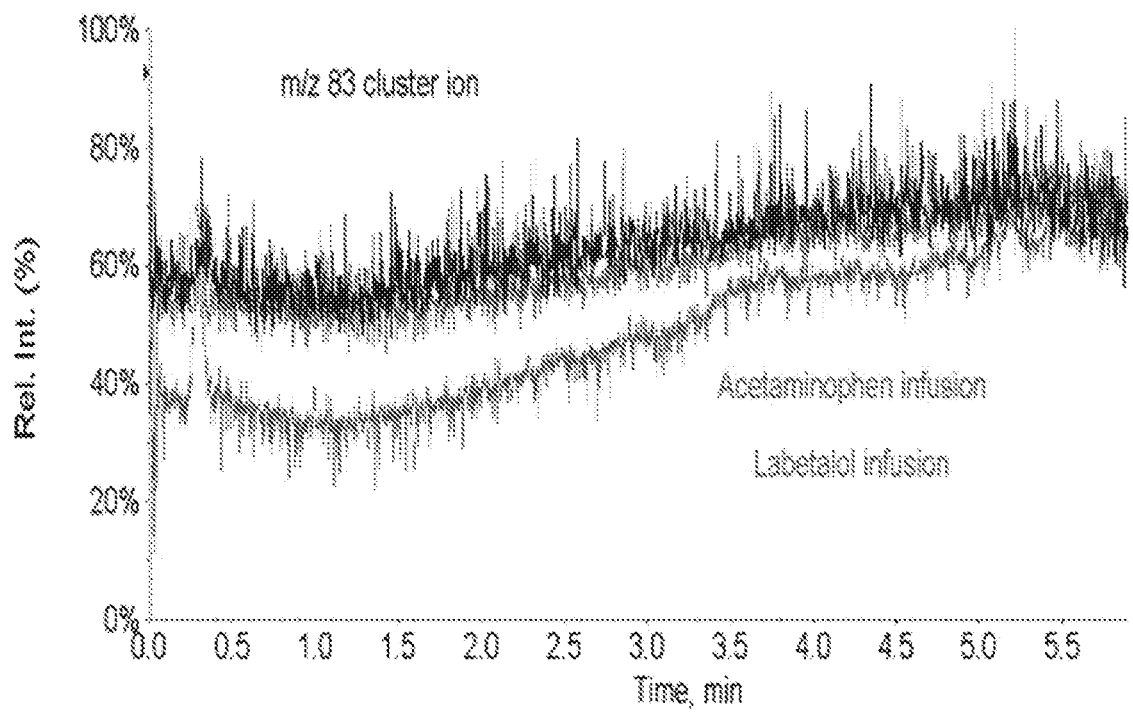
FIGS. 25A-25D illustrate a series of post-column infusion chromatograms for model ion suppression agents.
Figure 25B:
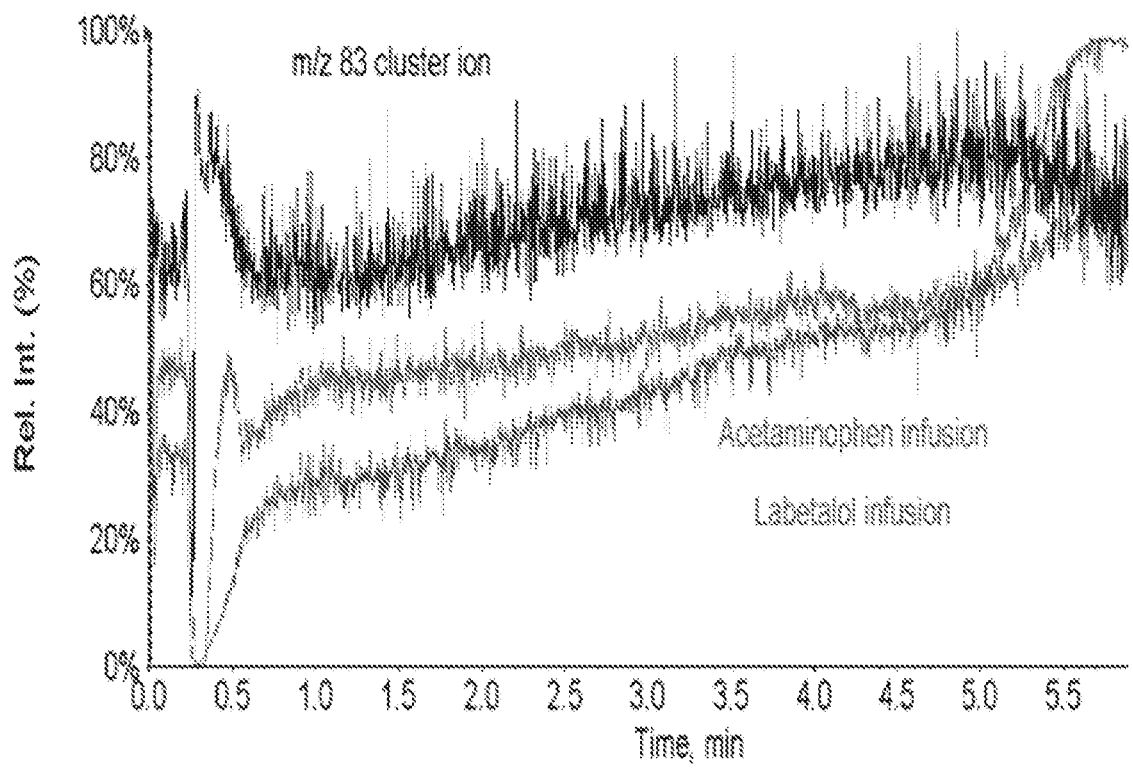
Figure 25C:
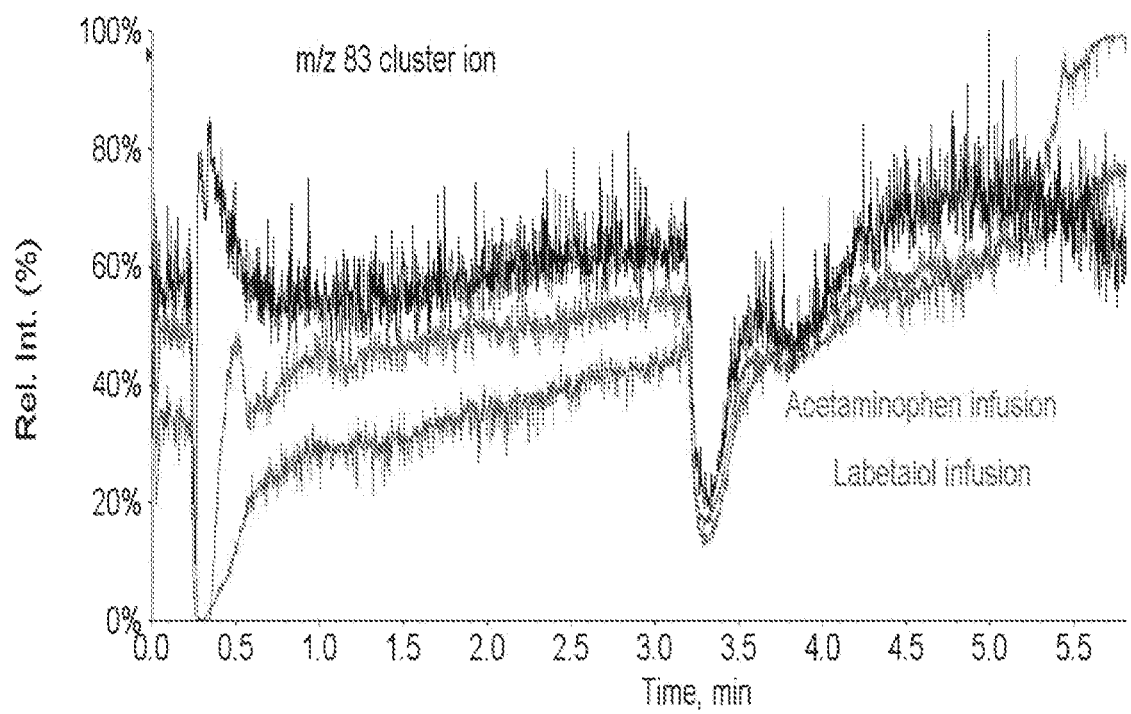
Figure 25D:
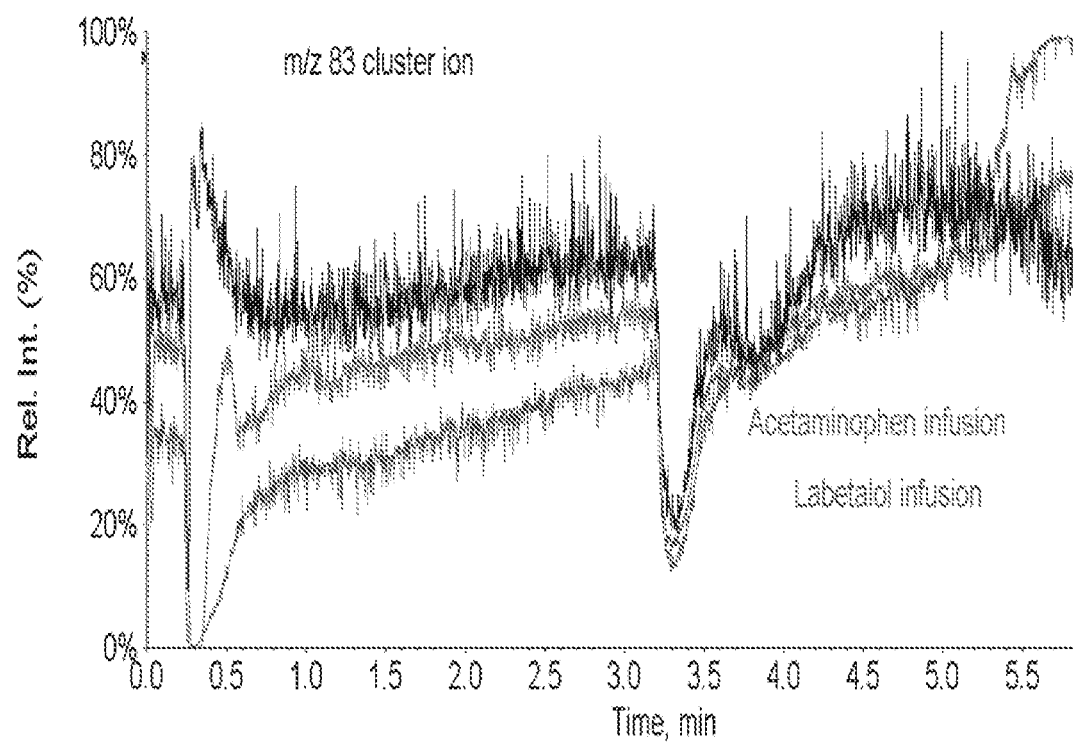

FIG. 24 shows the ability of the cluster ions to detect changes in the ionization conditions caused by adjusting ion source parameters. The figure shows the abundance of the cluster ion at m/z 83, nominally assigned as the proton-bound dimer of acetonitrile, over time. The liquid flow to the ion source was a constant flow of 50 µl/min composed of 50% acetonitrile with 0.1% formic acid and 50% water containing 0.1% formic acid. A 7 µl/min flow of acetaminophen solution at 1 µg/mL was introduced via a tee-junction to the liquid flow and entered the source as a single, fully-mixed stream. Ion spray voltage (ISV) applied to the electrode was varied in the instrument control software from 1550 V to 5500 V. The abundance of cluster ions changed according to applied spray electrode voltages. The figure demonstrates that cluster ions can report on physical changes like ion spray voltage. Other source parameters such as drying gas temperature and flow and nebulizer gas flow also showed expected trends in cluster ion abundance. As gas flows were increased from a low value to a medium value, cluster ion signal increased, reached a plateau, and eventually declined when reaching high gas flows. Increasing source temperature from 100° C. to 500° C. simply increased the abundance of the cluster ions.

From these simple experiments it was observed that following certain cluster ions can effectively monitor the ion formation process. The sensitivity in detecting the changes in ionization with cluster ions was very similar to that observed with analyte infusion. Also of note in FIG. 24, the cluster ion at m/z 83 increased in signal each time ISV was raised while the signal for acetaminophen eventually plateaued. This data suggests that cluster ions have similar, and perhaps even superior, sensitivity to physical changes than an acetaminophen post-column infusion.

Changes in the Ability of the Ionization Process to Form Ions, Caused by Interferences from Injected Samples (Commonly Known as Ionization Suppression or Matrix Effect), are Detected as a Change in the Abundance of Cluster Ions Formed Along with detecting physical changes in the ion source and even the mass spectrometer itself, cluster ion monitoring allows for detecting ionization suppression within individual sample chromatograms. Currently, there is no convenient way to measure ion suppression in each sample. However, cluster ions that are natively formed and require no additional pumping hardware, plumbing, or chemistry may meet this need.

FIG. 25 illustrates SRM chromatograms from post-column infusion of a 10 µg/mL solution of labetalol and acetaminophen, as well as the SRM chromatogram of the cluster ion at m/z 83 for a series of materials known to cause ionization suppression. The top panel a shows the suppression profile for a water injection where suppression is neither expected nor observed. The other three panels of FIG. 25 illustrate model systems for suppression: a high concentration of salt in the form of 50 µM PBS in panel b; a basic and surface-active agent, PEG 1000, at 5 µg/mL in panel c; and BSA prepared at 100 µg/mL in panel d. Each of these agents is known to cause suppression at high concentration. The post-column infusion chromatograms of the analytes were expected to show a loss of response due to ionization interference. In each case, a characteristic loss of analyte signal is observed at the elution time of the interfering material. The cluster ion at m/z 83 also shows the same suppression profile as the infused analytes. These data indicate that cluster ions can report on the major causes of severe ionization suppression.

Figure 26A:
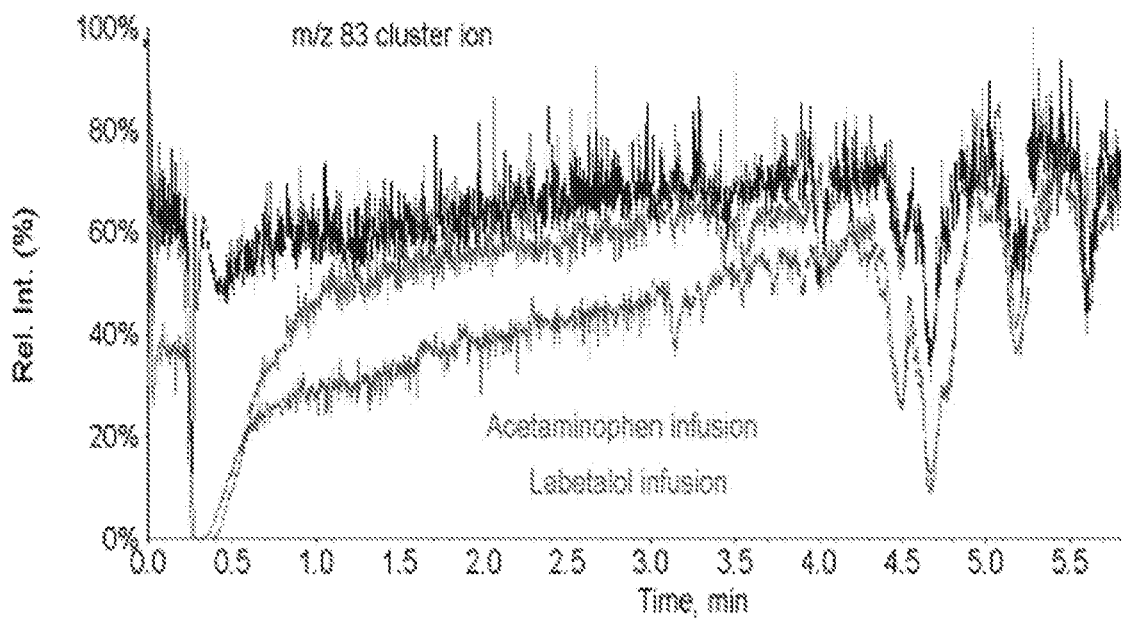
FIGS. 26A-26B illustrate SRM infusion chromatograms for two different plasma sample preparation procedures known to have very different ionization suppression profiles; acetonitrile protein precipitation (FIG. 26A) and MtBE LLE (FIG. 26B). In each of FIGS. 26A-26B, red traces (middle traces) are the SRM chromatogram for a post-column infusion of 10 µg/mL acetaminophen, green traces (bottom traces) are the SRM chromatogram for a post-column infusion of 10 μg/mL labetalol, and black traces (top traces) are the SRM chromatogram for the cluster ion at m/z 83.
Figure 26B:
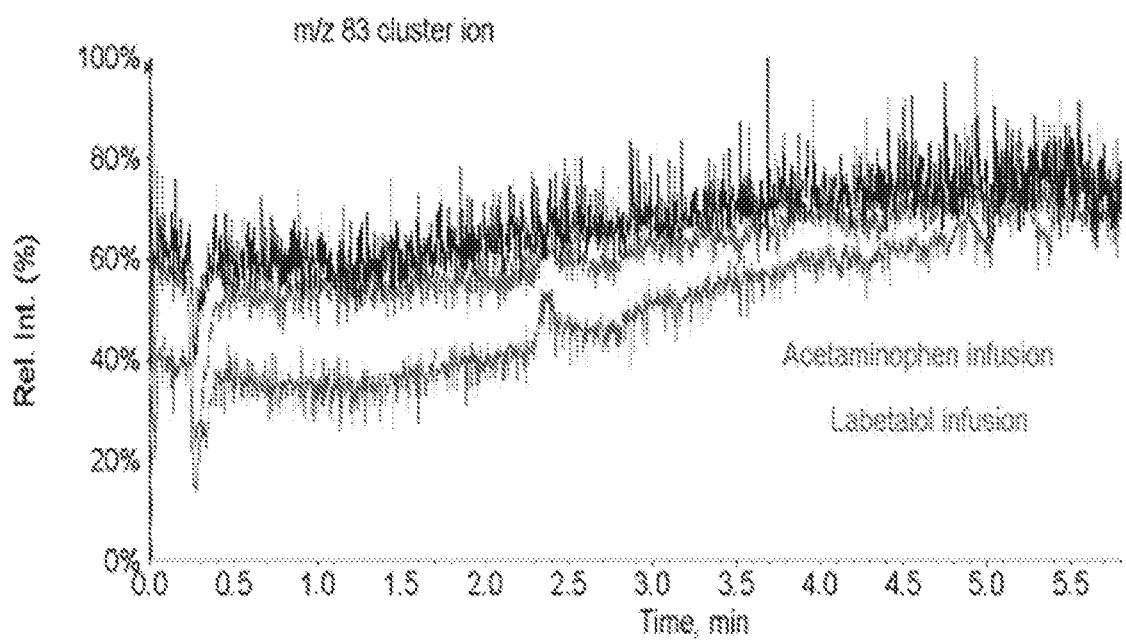

A more practical example of cluster ions reporting on ionization suppression in plasma extracts is presented in FIG. 26. The figure shows the classic post-column infusion profiles for two drugs, labetalol and acetaminophen, with injection of drug-free plasma extracts injected onto a Supelco Discovery C8, 21×50 mm column and eluted with an acetonitrile-water gradient over five minutes. The infusion chromatograms show the expected ion suppression profiles for an MtBE LLE (panel a) and an acetonitrile protein precipitation (panel b). The infusion chromatogram for the LLE sample showed no major regions of ionization suppression, while that of the protein precipitation showed regions of expected suppression from non-volatile materials early in the chromatogram and also from the lysoPCs eluting later in the chromatogram. In addition to the infused drugs, the trace for the cluster ion at m/z 83 was observed. This cluster ion traced out a similar suppression pattern to those of the infused drugs, suggesting that the changes in ionization indicated by the cluster ion are the same as those identified by infusing analyte. These results provide an example of a cluster ion reporting on significant ionization suppression events throughout a chromatographic run. The data indicate that the post-column infusion might be replaced, at least for major suppression events, by the use of cluster ions natively present in the system.

Since cluster ions are a product of ionization at atmospheric pressure, there is no need to add material to the mobile phase or install a pump for post-column infusion. Additionally, the cluster ions detected are continuously formed, thus enabling continuous monitoring of ionization changes throughout the entire chromatogram. It follows that the technique can monitor ionization suppression in each sample in a batch run, providing individual sample quality control in a manner not previously available.

Cluster Ions can be Used to Continuously Monitor the Ionization Process within Chromatograms, and Between Samples in a Batch.

The cluster ion signal can be used to report on sample-by-sample ionization performance. FIG. 27 illustrates the difference in the m/z 83 cluster ion abundance shown by the black trace in a QC sample from panel a and a study sample shown in panel b. The QC samples were made by spiking control dog plasma with a known amount of angiotensin I (trace not shown) and SIL-angiotensin I internal standard (displayed as the red trace). Near the LC peak for the SIL-angiotensin I there was a region of signal suppression detected by the cluster ion. The presence and magnitude of this negative suppression peak varied with both time point and with study subject. There was also a distinct difference between the standards and QCs made from control plasma and the subject samples. In this example, the internal standard co-eluted with the analyte and did correct for any changes in analyte response in the samples. However, by detecting the suppression peak in the subject samples not observed in the standards and QC, the data highlight the potential usefulness of the cluster ions in monitoring ionization suppression sample-by-sample throughout a run.

The data presented herein were all from positive ion using only ESI. One might expect cluster ions from negative ion electrospray to yield similar results. Since clusters are likely to be common to all API methods, monitoring cluster ions provides similar advantages to any API systems operating on electrospray mechanisms.

Comparing results from experiments using instrument conditions that favor the survival of cluster ions with those that favor destruction of solvent clusters provides a simple means of identifying solvent cluster ions in any ionization system used with mass spectrometry. Using the product ion and neutral loss scanning features of the triple quadrupole mass spectrometer provides an extra measure of confidence in the assignment of the chosen ions as solvent cluster ions. Since the formation of solvated charge is expected to be a spontaneous process in the vapor-saturated environment of an API source, the observation that solvent cluster ions are continually formed with high abundance under normal operating conditions is expected. Therefore, cluster ion signals can be measured in the mass spectrometer on a continuous basis any time the system is acquiring data.

Simple experiments that change the ability of the ion source to produce ions at a given rate, such as the voltage applied to the spray electrode, show that cluster ions indeed track ionization performance. Further, cluster ions appear to report on the major causes of ionization suppression as shown by the model systems and the plasma sample extracts. The demonstrated sensitivity of cluster ion abundance to ionization suppression paves the way for continuous monitoring of ionization performance throughout each chromatographic run, each individual sample, and over all data collected. In addition, cluster ion monitoring does not require that extra chemistry or hardware be added to the system. Cluster ion monitoring simply requires monitoring events that are already occurring in API-MS. The present results show the potential for this approach to inform on the ion formation process and act as an indication of changes in API performance. Adopting this approach can improve the confidence level and the quality of quantitative data generated by API-MS.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed:

1. A method of evaluating performance of an atmospheric pressure ionization (API) system, the method comprising:
   monitoring the ion current for a charged species related to a cluster ion formed in the API system;
   detecting a level of the cluster ion from the monitored ion current; and
   identifying whether matrix material is causing ionization suppression in the API system from the detected level of the cluster ion.

2. The method of claim 1, wherein the charged species comprises the cluster ion, a fragment thereof, or an aggregate comprising the cluster ion.

3. The method of claim 1, further comprising:
   varying, subsequent to the identifying, at least one parameter selected from the group consisting of ionization electrical potential of the API system, electric field strength of the API system, pressure in the API system, gas and vapor in the API system, and solvent presented to the API system.

4. The method of claim 1, wherein the monitoring comprises measuring the ion current using at least one selected from the group consisting of an ion mobility spectrometer, a mass spectrometer, and a charged aerosol detector.

5. The method of claim 4, wherein the ion mobility spectrometer comprises at least one selected from the group consisting of a differential ion mobility spectrometer, a high field asymmetric ion mobility spectrometer, and a conventional ion mobility spectrometer.

6. The method of claim 4, wherein the ion source for the mass spectrometer comprises at least one selected from the group consisting of an electrospray ionization mass spectrometer ion source, atmospheric pressure chemical ionization mass spectrometer ion source, and an atmospheric pressure photoionization ionization mass spectrometer ion source.

7. The method of claim 4, wherein the API system is the vaporizing unit of at least one selected from the group consisting of a liquid chromatography mass spectrometer-mass spectrometer (LC-MS/MS) system, a single stage MS LC-MS, and a capillary electrophoresis apparatus.

8. The method of claim 1, further wherein a reference ion current value for the charged species related to the cluster ion is determined under conditions wherein no matrix effect is observed.

9. The method of claim 8, wherein, if the measured ion current deviates more than about 5% from the reference ion current value, the operating parameters of the API system are changed such that the ion current for the charged species related to the cluster ion is within about 5% of the reference ion current value.

* * * * *